(12) United States Patent
Hsieh et al.

(10) Patent No.: US 8,241,991 B2
(45) Date of Patent: Aug. 14, 2012

(54) METHOD FOR FORMING INTERCONNECT STRUCTURE HAVING AIRGAP

(75) Inventors: Julian J. Hsieh, Zhubei (TW);
Nobuyoshi Kobayashi, Kawagoe (JP);
Akira Shimizu, Sagamihara (JP);
Kiyohiro Matsushita, Fuchu (JP);
Atsuki Fukazawa, Tama (JP)

(73) Assignee: ASM Japan K.K., Tama-shi, Tokyo (JP)

(*) Notice: Subject to any disclaimer, the term of this patent is extended or adjusted under 35 U.S.C. 154(b) by 82 days.

(21) Appl. No.: 12/718,731

(22) Filed: Mar. 5, 2010

(65) Prior Publication Data

US 2011/0217838 A1 Sep. 8, 2011

(51) Int. Cl.
*H01L 21/76* (2006.01)

(52) U.S. Cl. ............ 438/421; 257/E21.581; 438/618; 438/960

(58) Field of Classification Search ......... 438/319, 438/411, 421, 618, 619; 257/522, E21.573, 257/E21.581
See application file for complete search history.

(56) References Cited

U.S. PATENT DOCUMENTS

| | | | |
|---|---|---|---|
| 5,916,365 A | 6/1999 | Sherman | |
| 6,455,445 B2 | 9/2002 | Matsuki | |
| 6,472,266 B1* | 10/2002 | Yu et al. | 438/241 |
| 6,652,924 B2 | 11/2003 | Sherman | |
| 6,876,017 B2 | 4/2005 | Goodner | |
| 7,098,149 B2 | 8/2006 | Lukas | |
| 2008/0038485 A1 | 2/2008 | Fukazawa | |
| 2010/0001409 A1* | 1/2010 | Humbert et al. | 257/774 |
| 2010/0015813 A1* | 1/2010 | McGinnis et al. | 438/771 |

OTHER PUBLICATIONS

IEEE International, Interconnect Technology Conference, 2009 article entitled: "A Self-aligned Airgap Interconnect Scheme," by Hsien-Wei Chen, Shin-Puu Jeng, Hao-Yi Tsai, Yu-Wen Iiu, Hsiu-Ping Wei, Douglas CH Yu and YC Su, Taiwan Semiconductor Manufacturing Company, Ltd. (TSMC), Hsinchu, Taiwan, R.O.C., Volume, Issue, Jun. 1-3, 2009 (pp. 146-148).

* cited by examiner

*Primary Examiner* — Leonard Chang
(74) *Attorney, Agent, or Firm* — Snell & Wilmer L.L.P.

(57) ABSTRACT

A method for forming an interconnect structure with airgaps, includes: providing a structure having a trench formed on a substrate; depositing a spacer oxide layer on sidewalls of the trench as sidewall spacers by plasma enhanced atomic layer deposition; filling the trench having the sidewall spacers with copper; removing the sidewall spacers to form an airgap structure; and encapsulating the airgap structure, wherein airgaps are formed between the filled copper and the sidewalls of the trench.

13 Claims, 57 Drawing Sheets

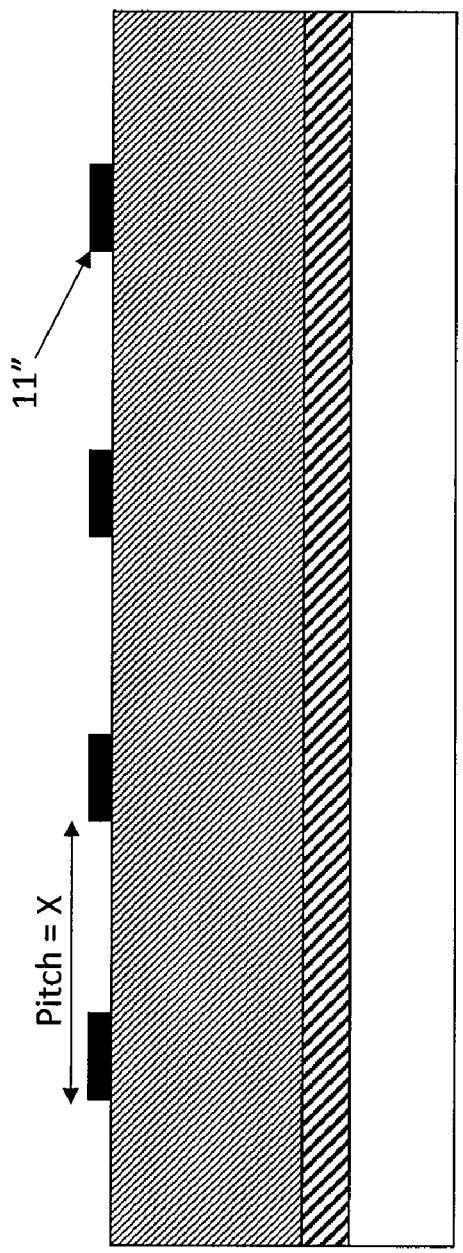
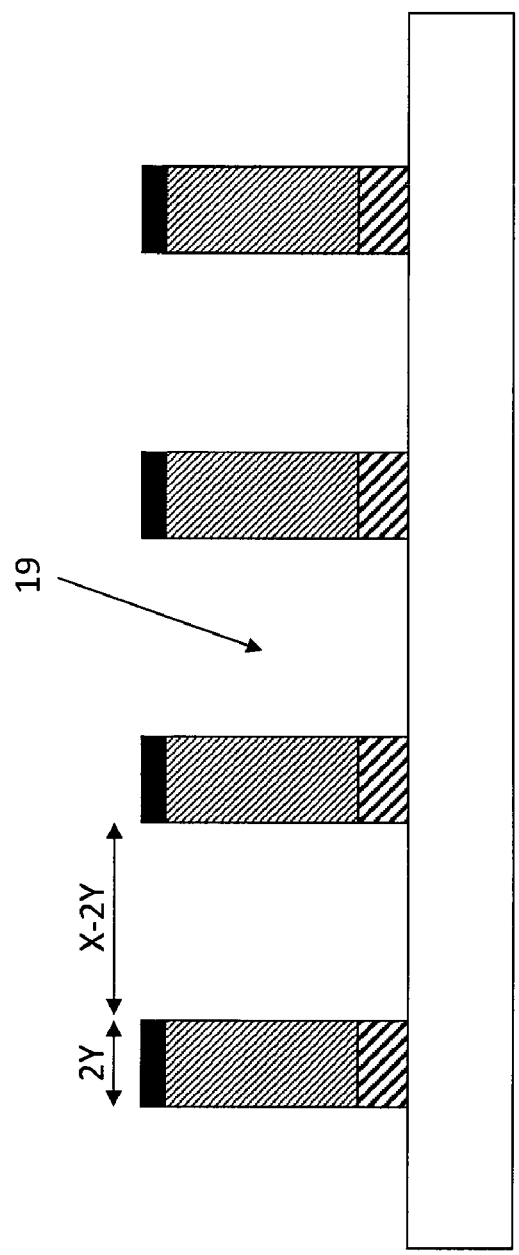
Fig. 1I
Fig. 1J

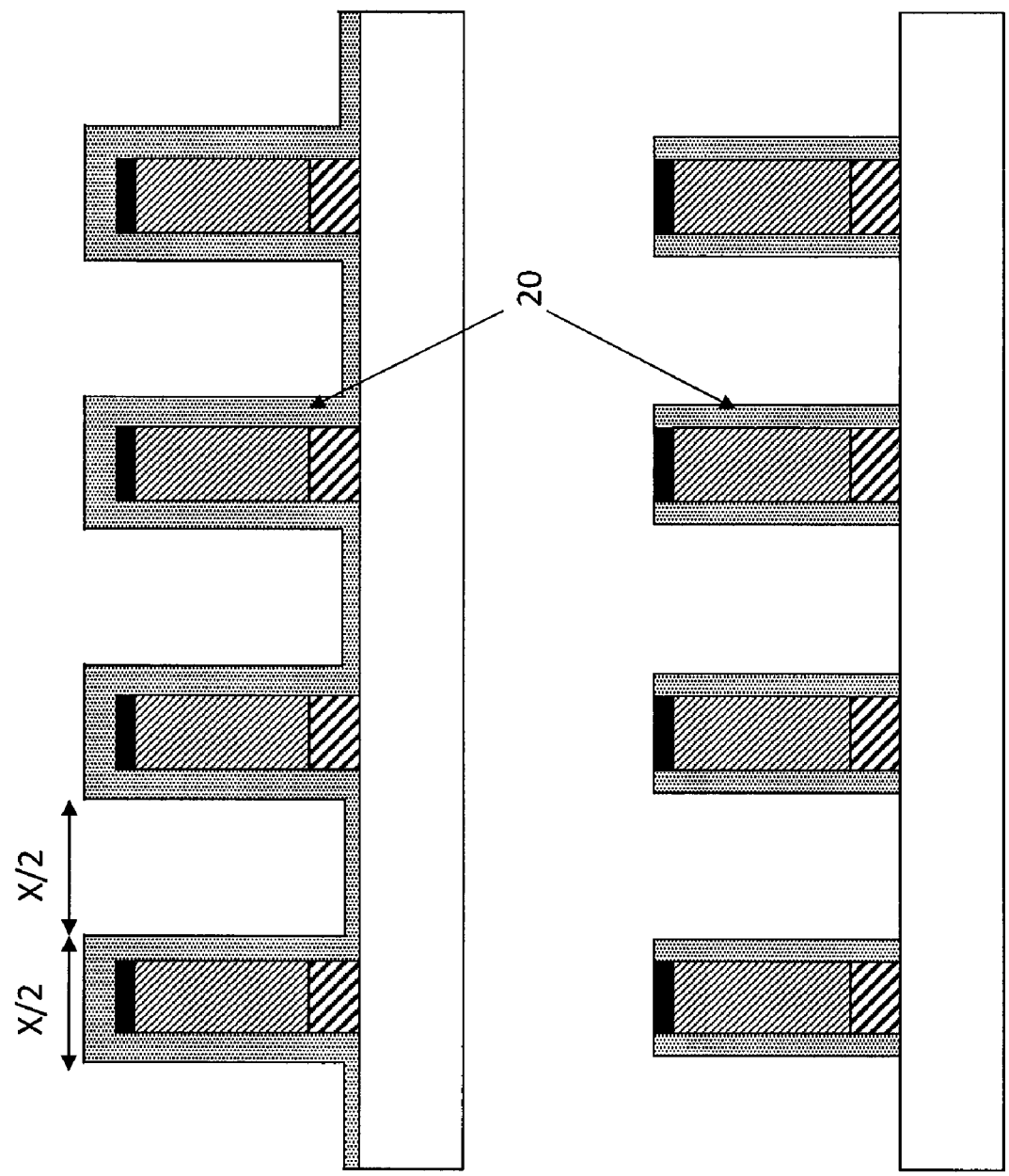

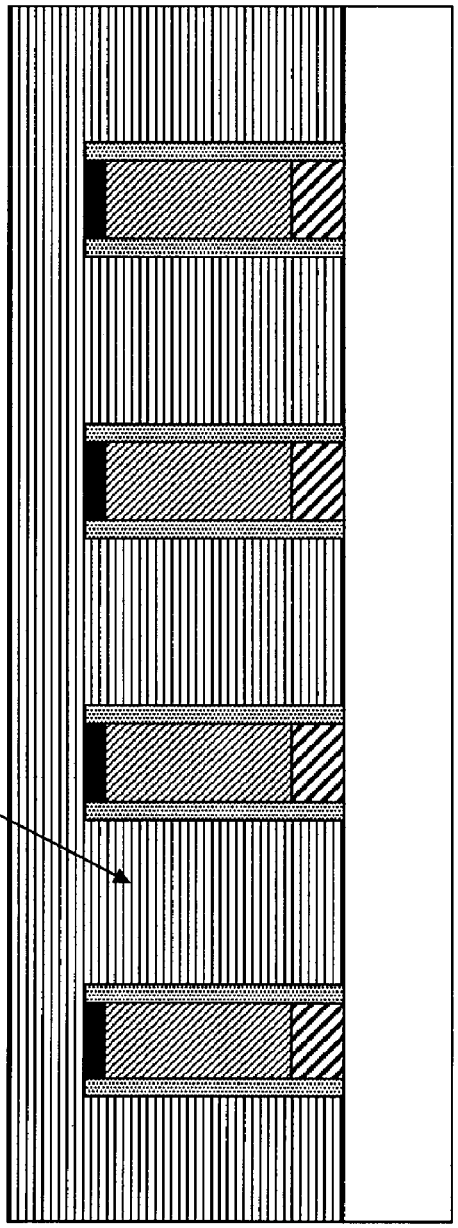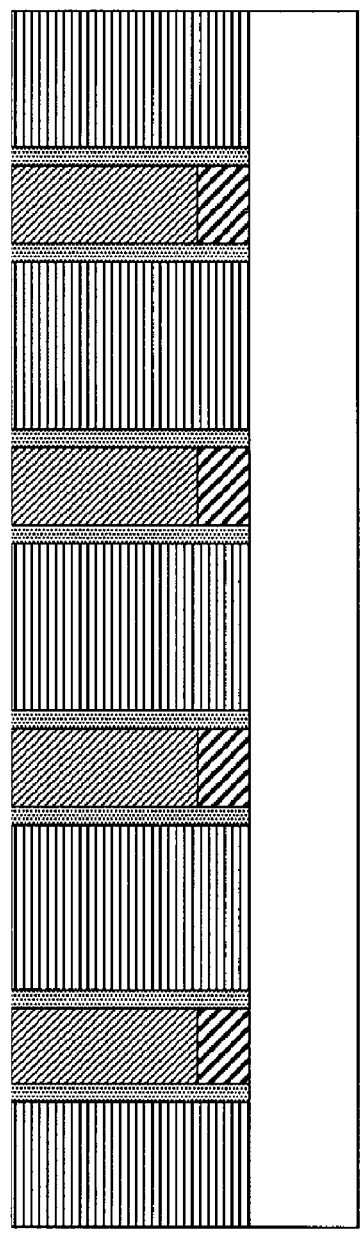
Fig. 1M
Fig. 1N

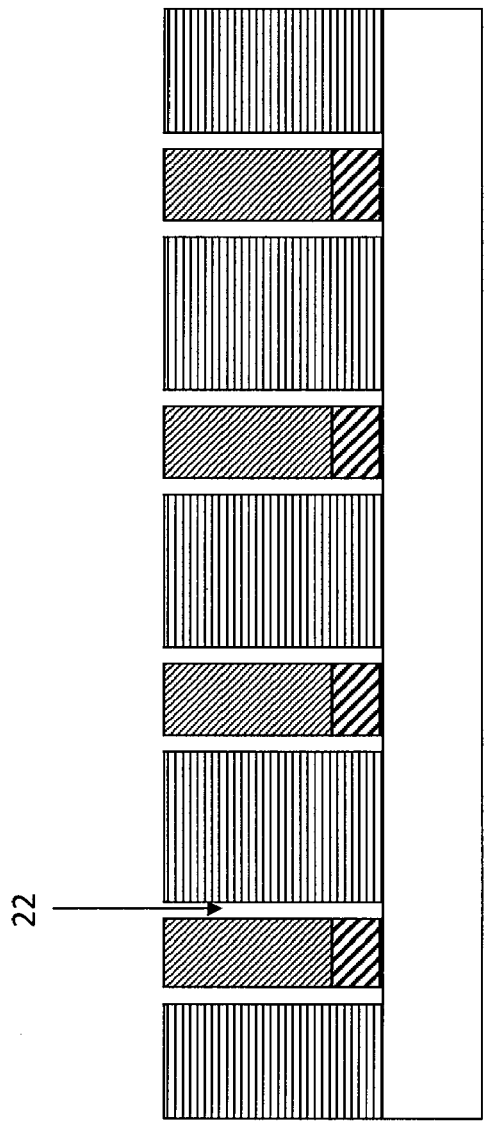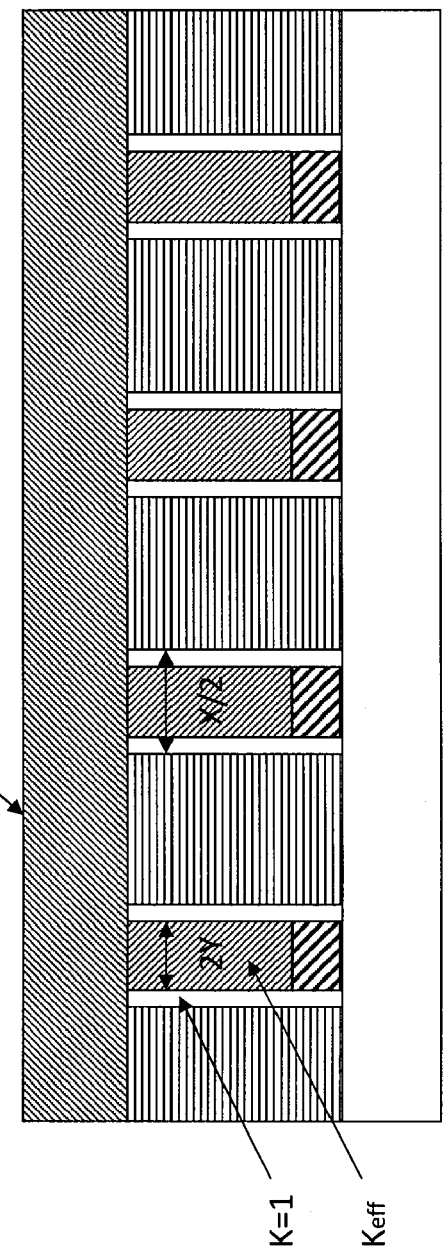

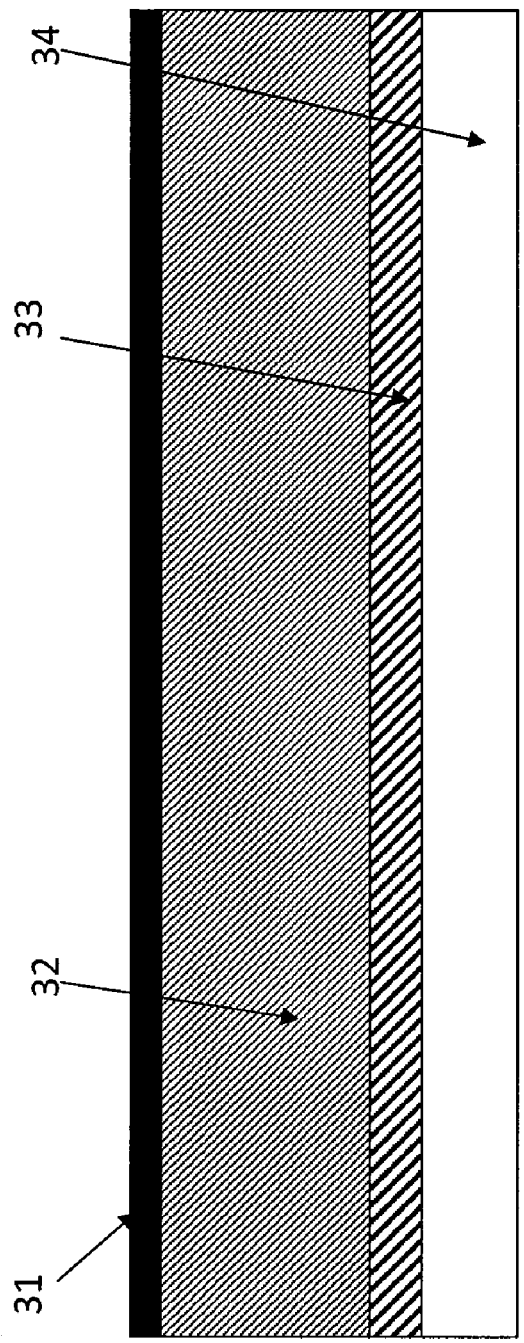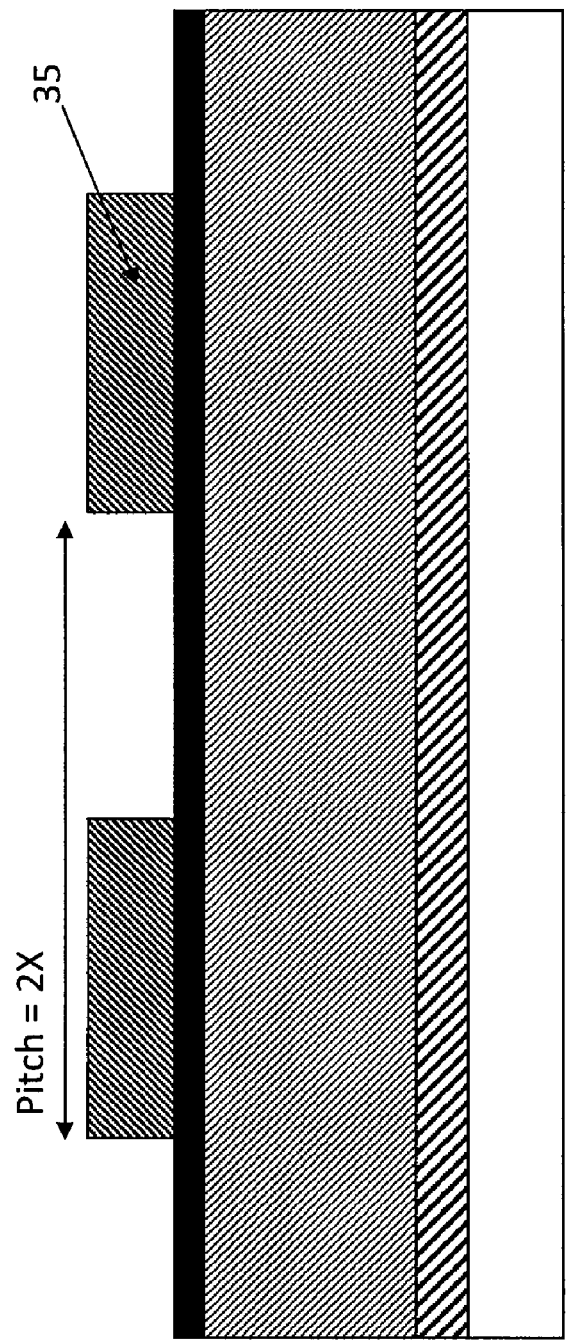
Fig. 3A
Fig. 3B

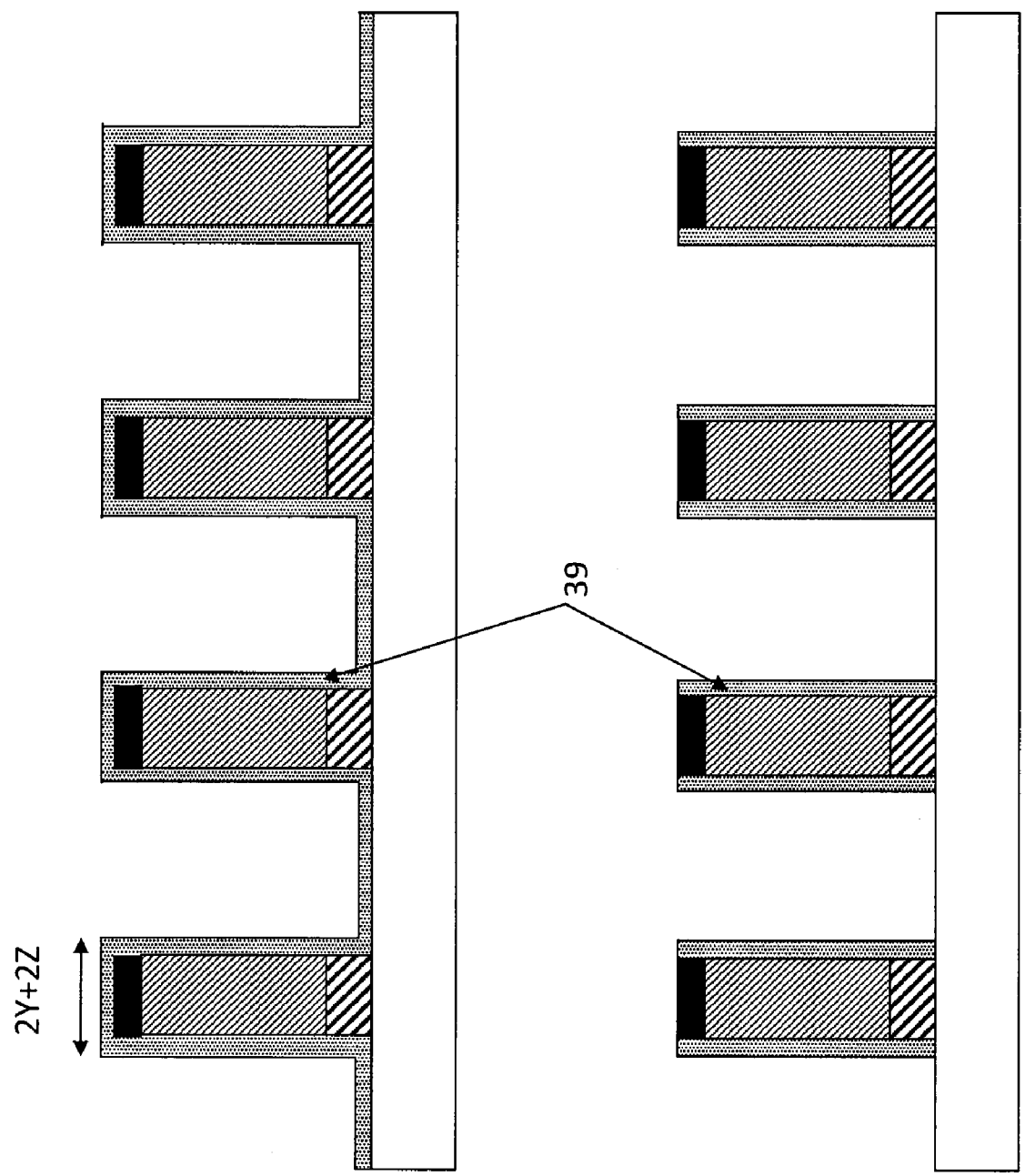

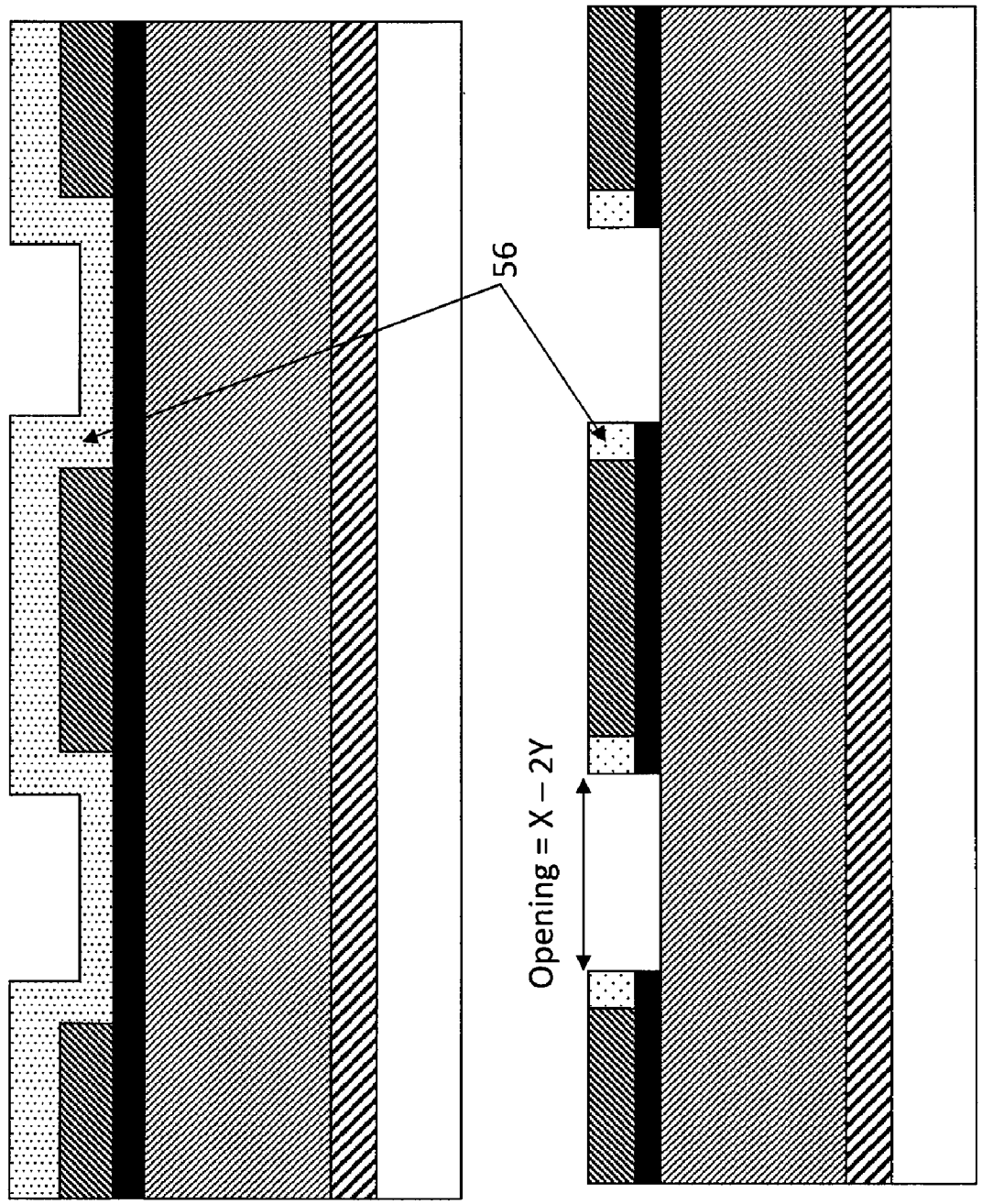

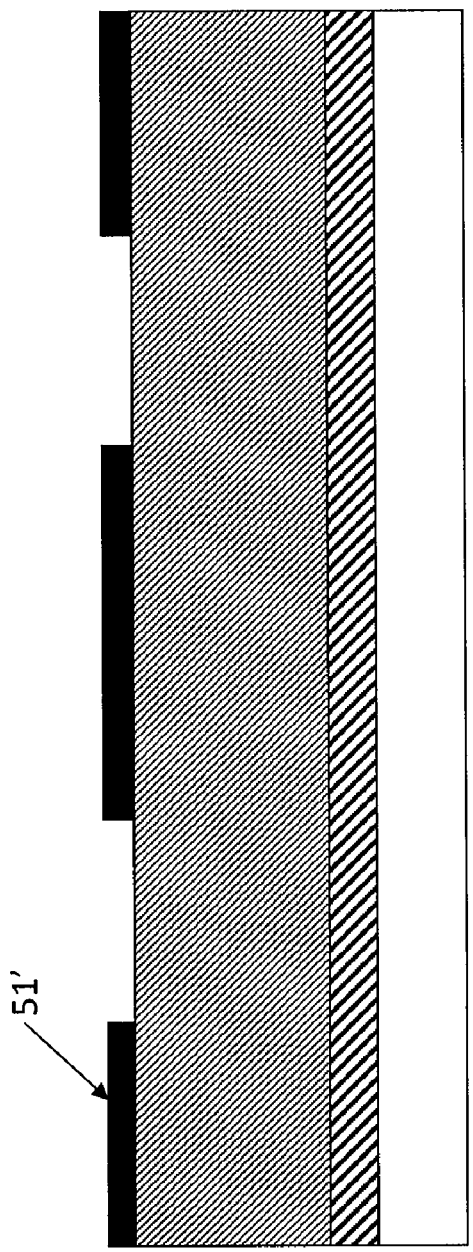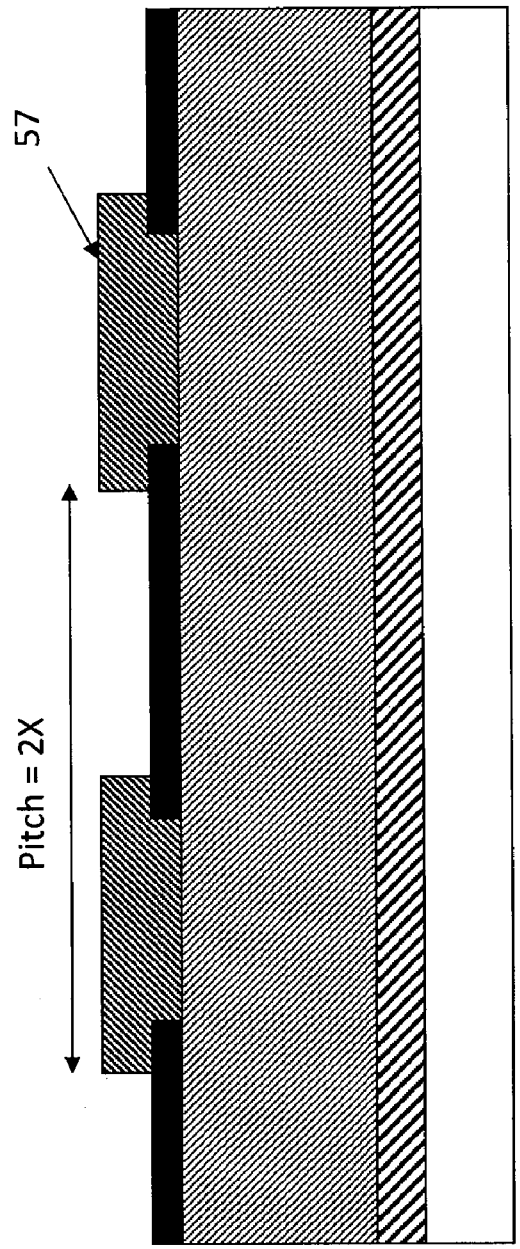
Fig. 5E
Fig. 5F

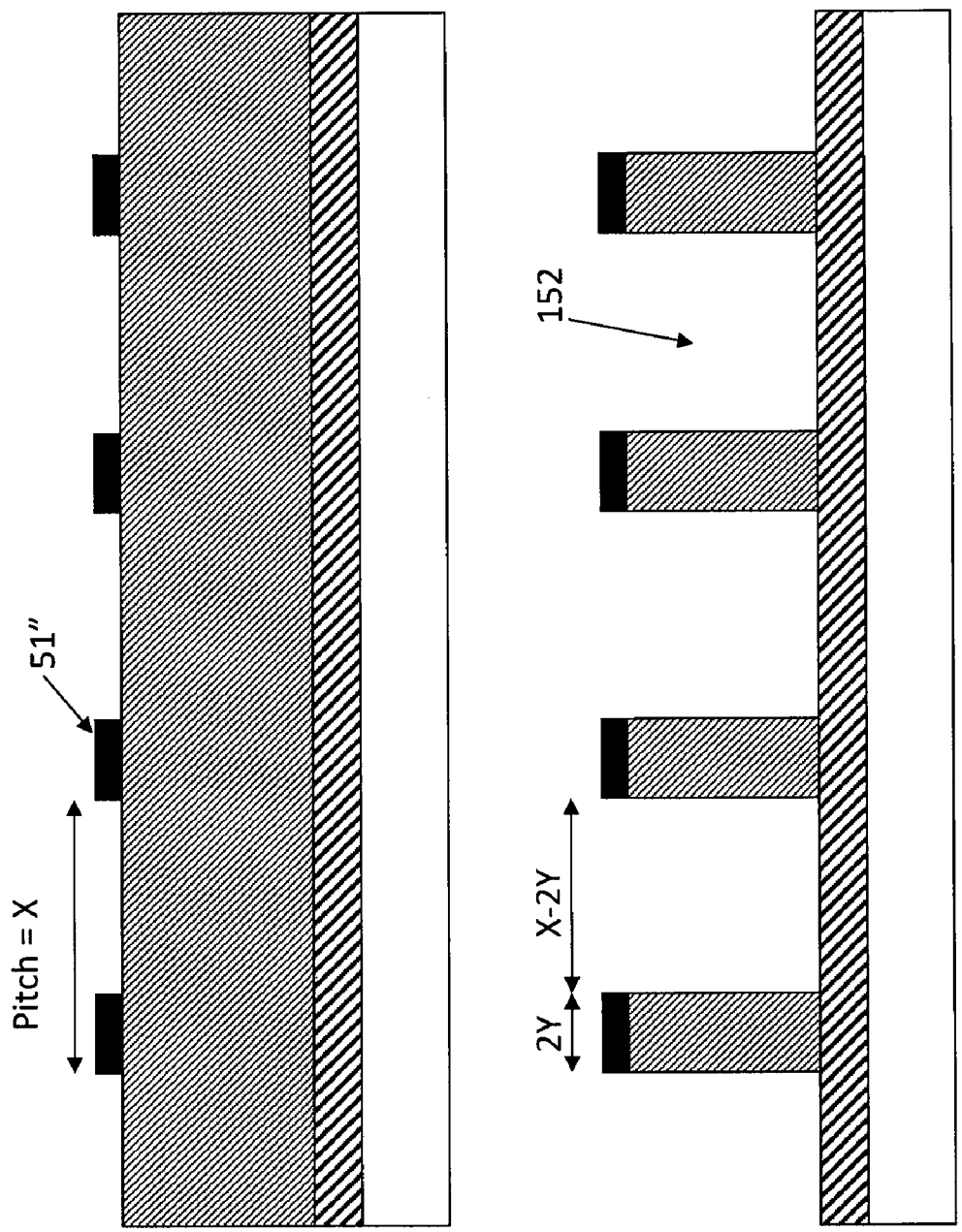

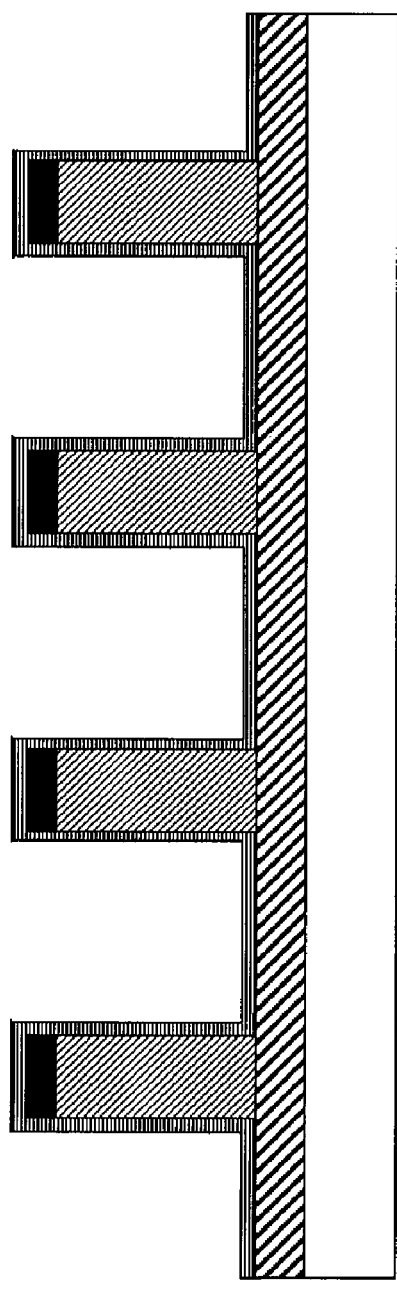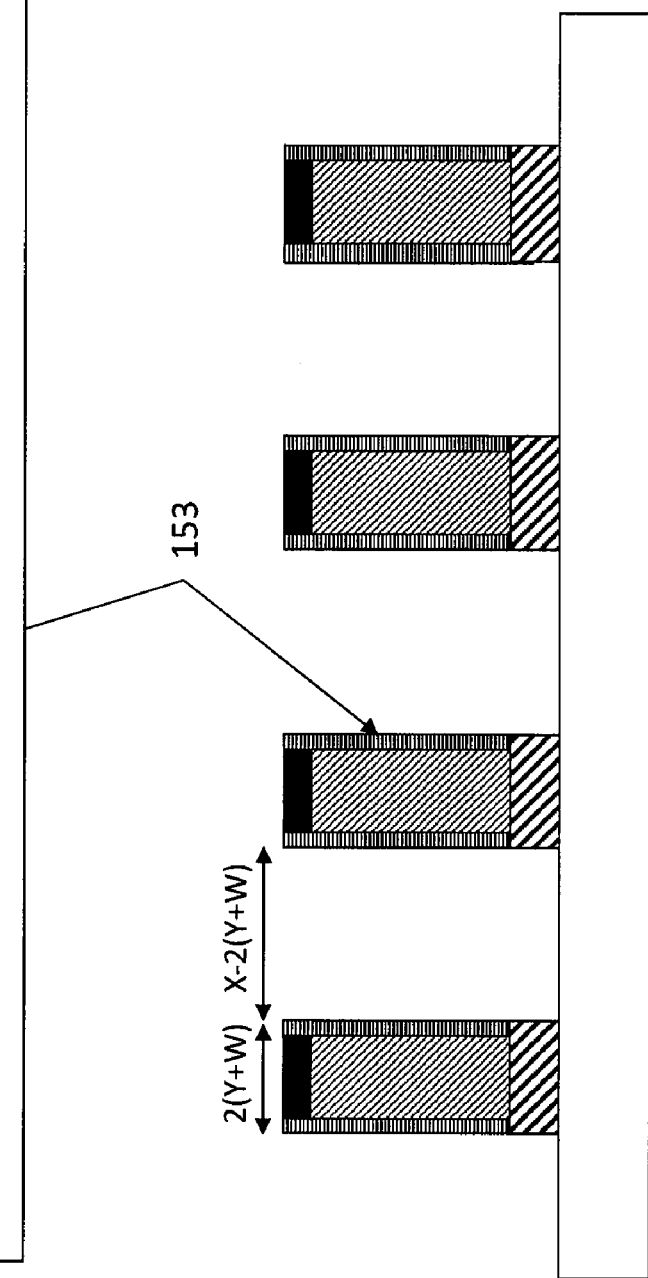
Fig. 5K
Fig. 5L

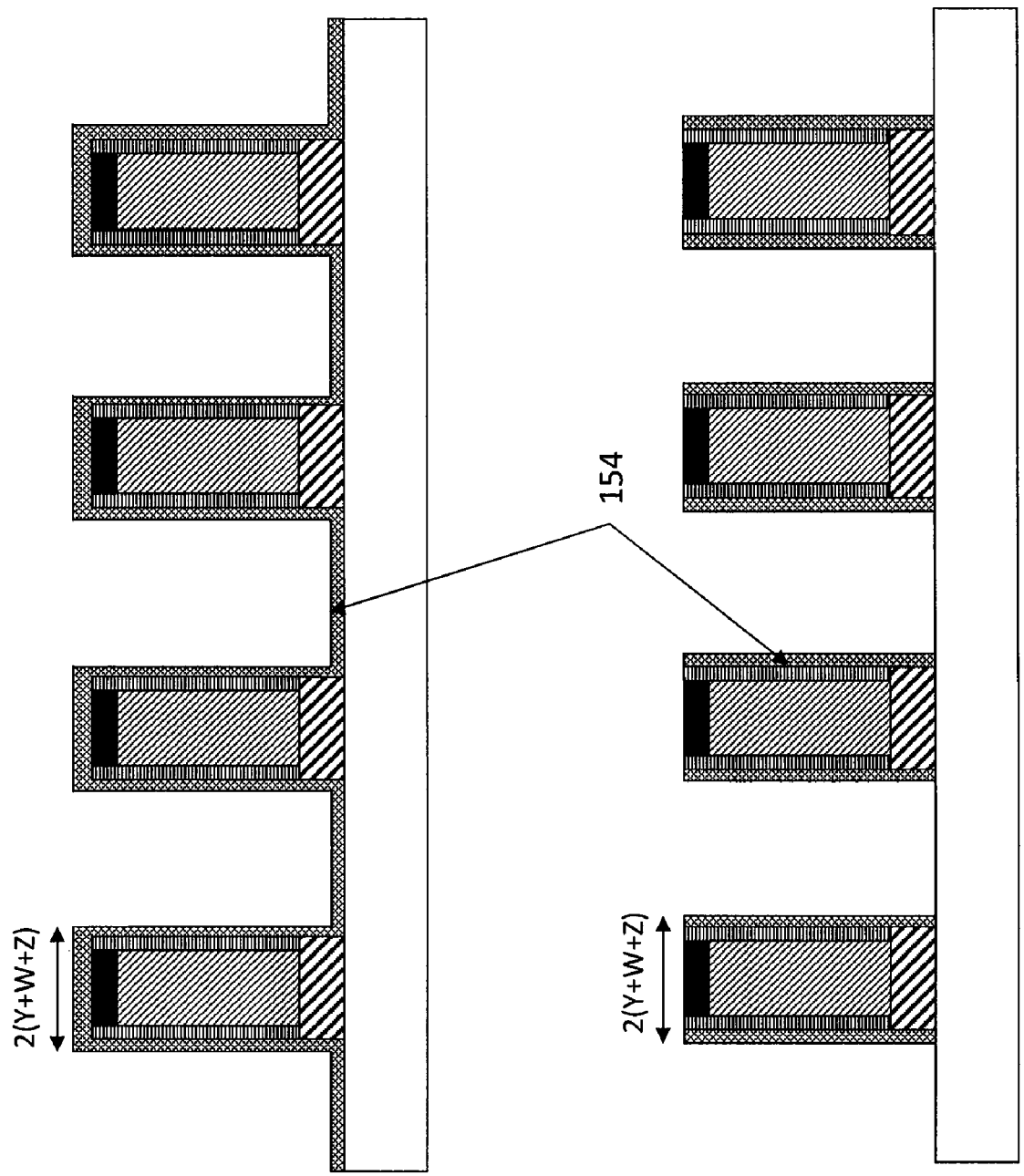

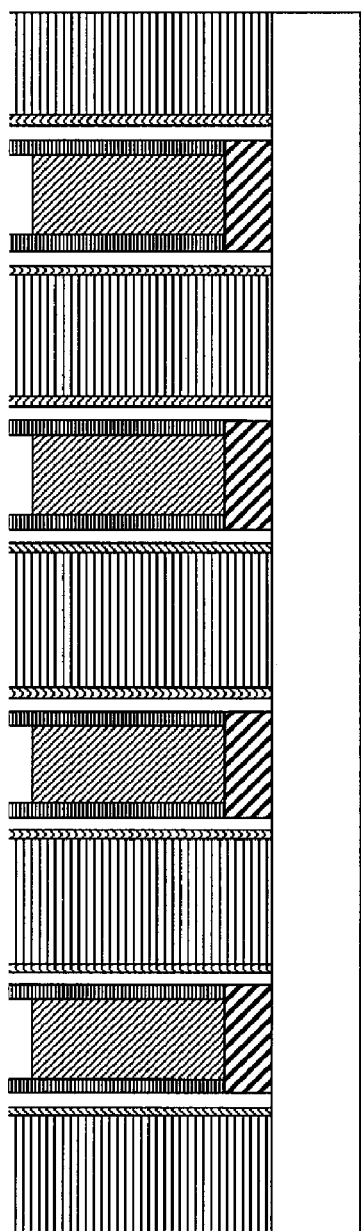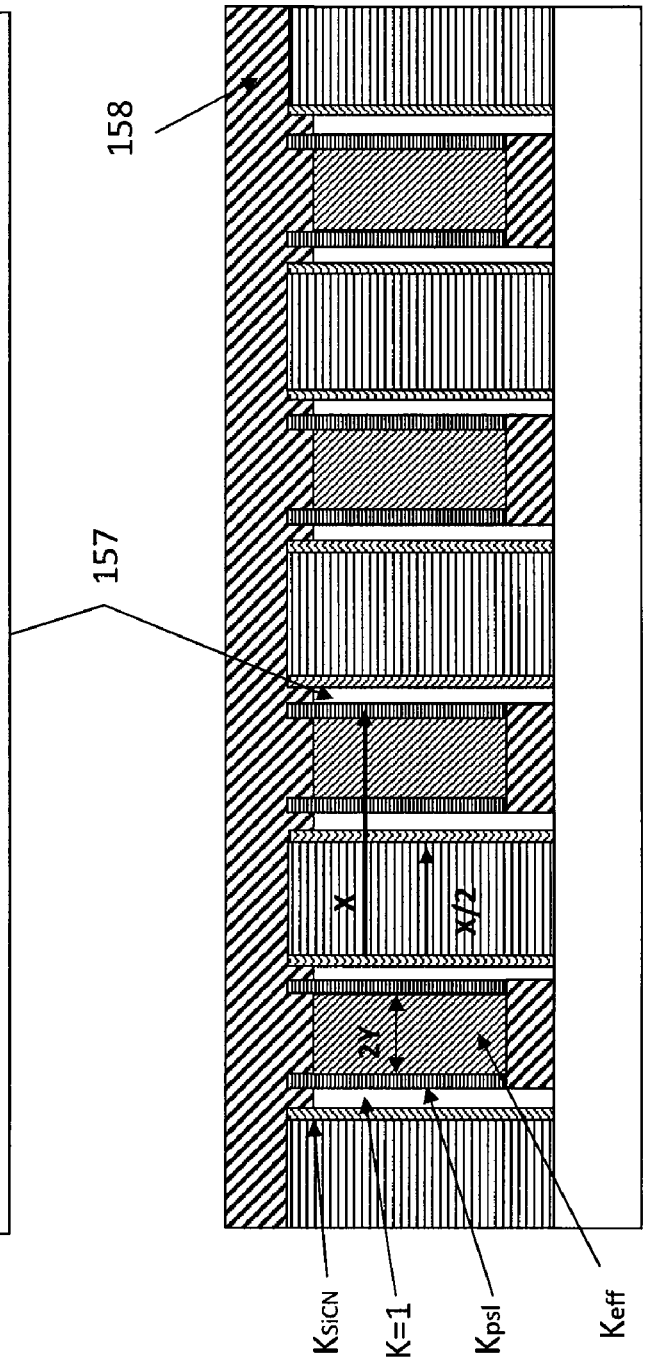
Fig. 5S
Fig. 5T

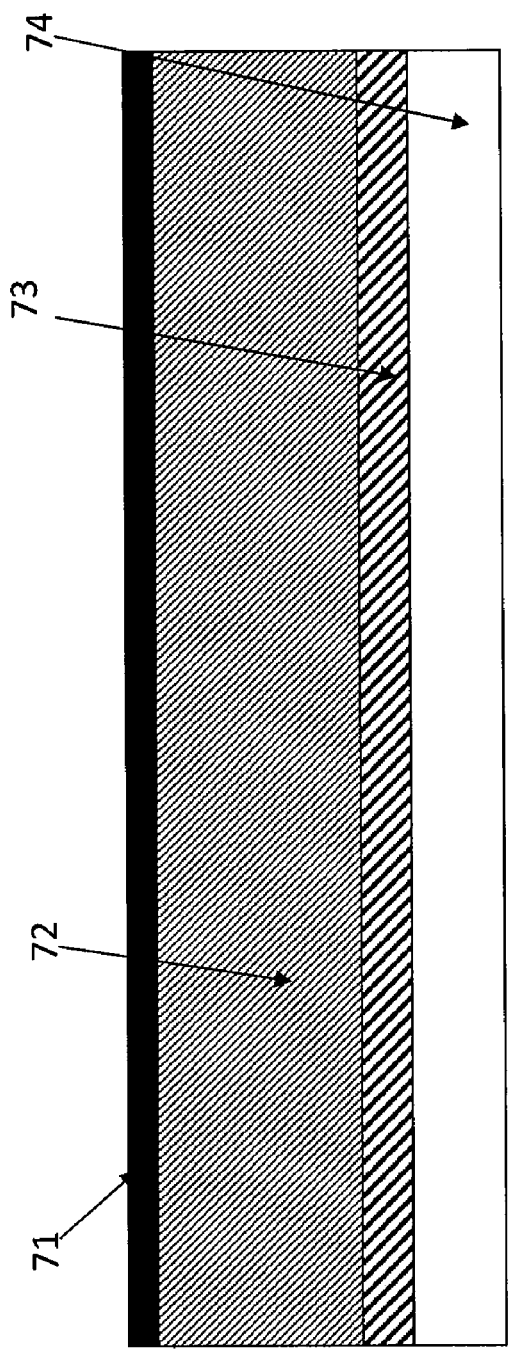
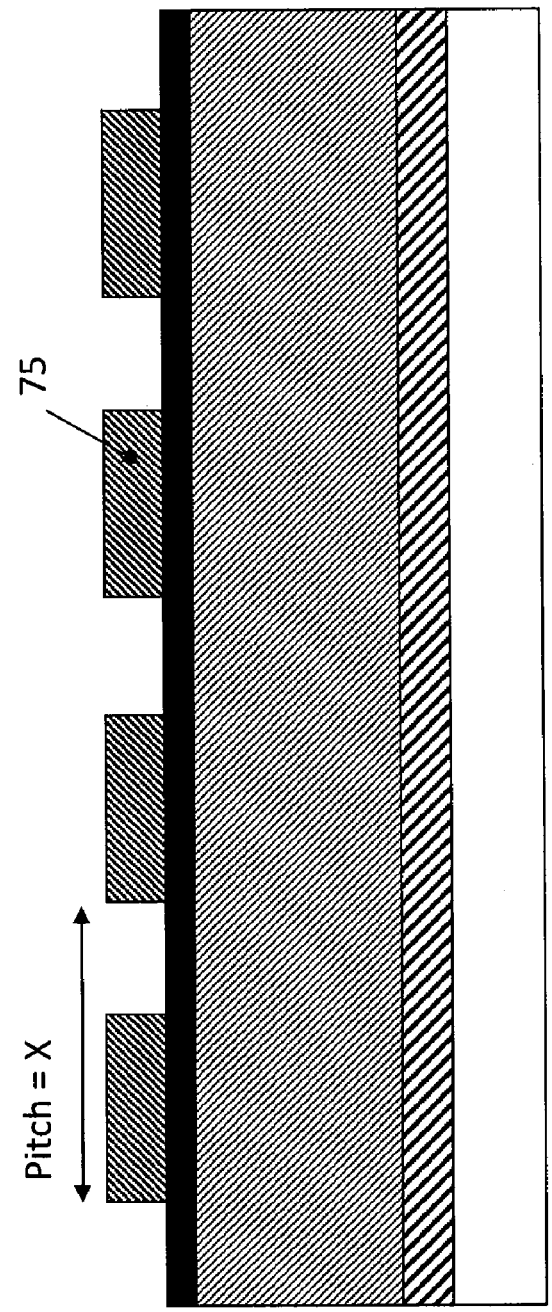
Fig. 7A
Fig. 7B

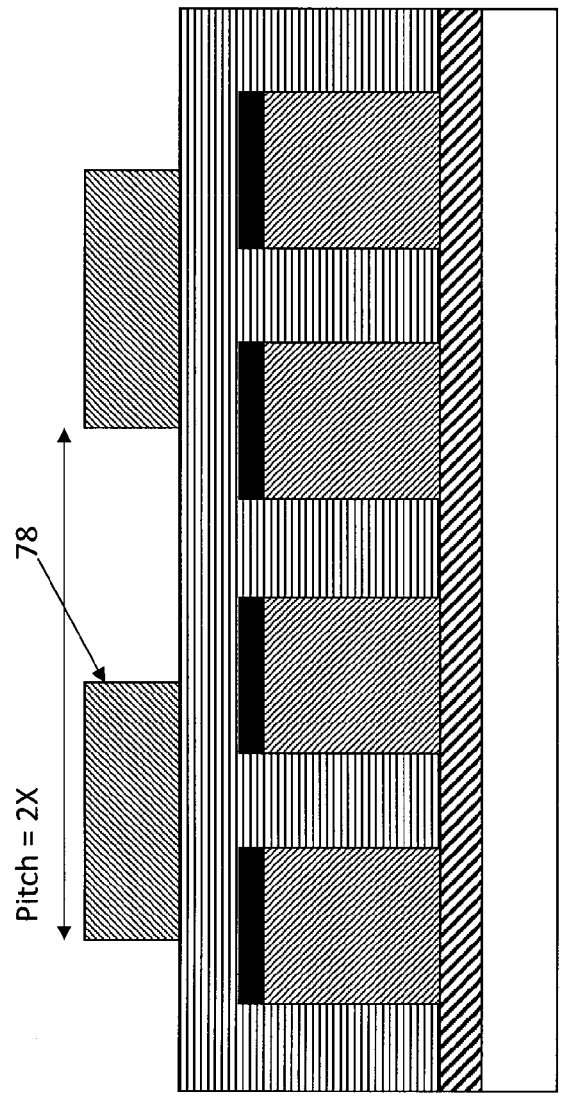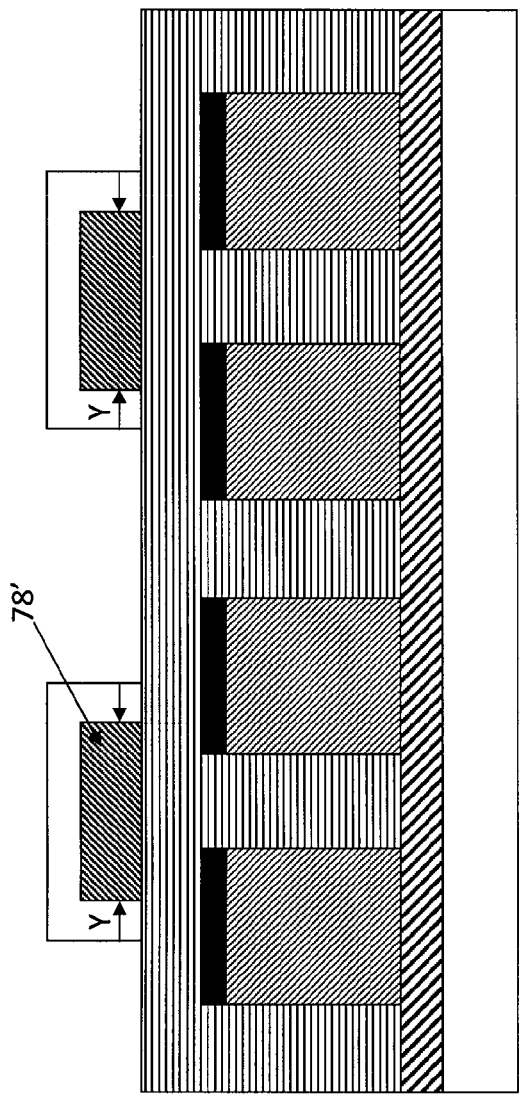
Fig. 7E
Fig. 7F

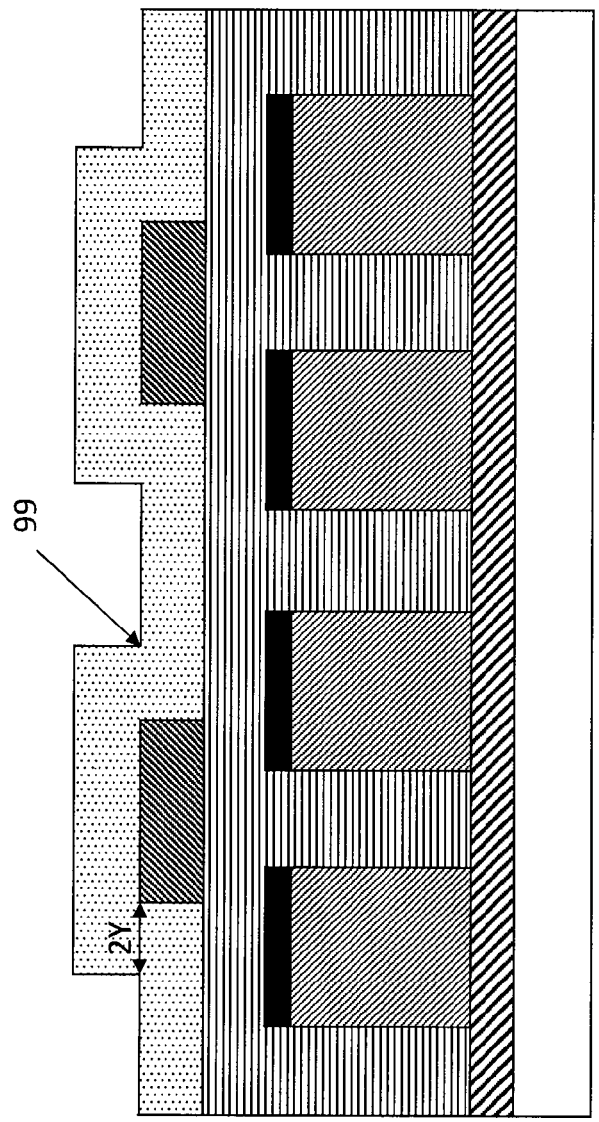
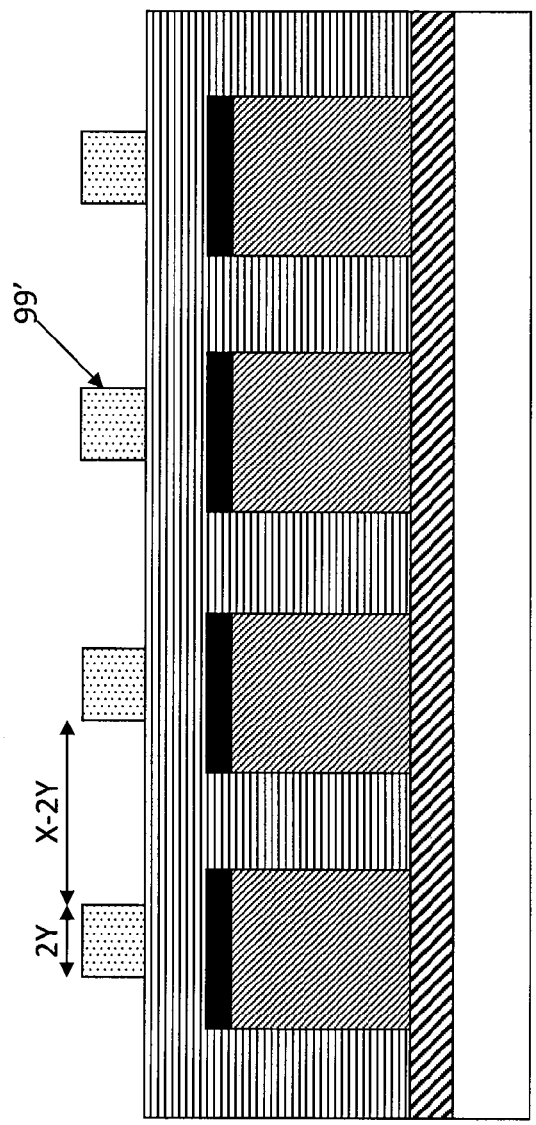
Fig. 9G
Fig. 9H

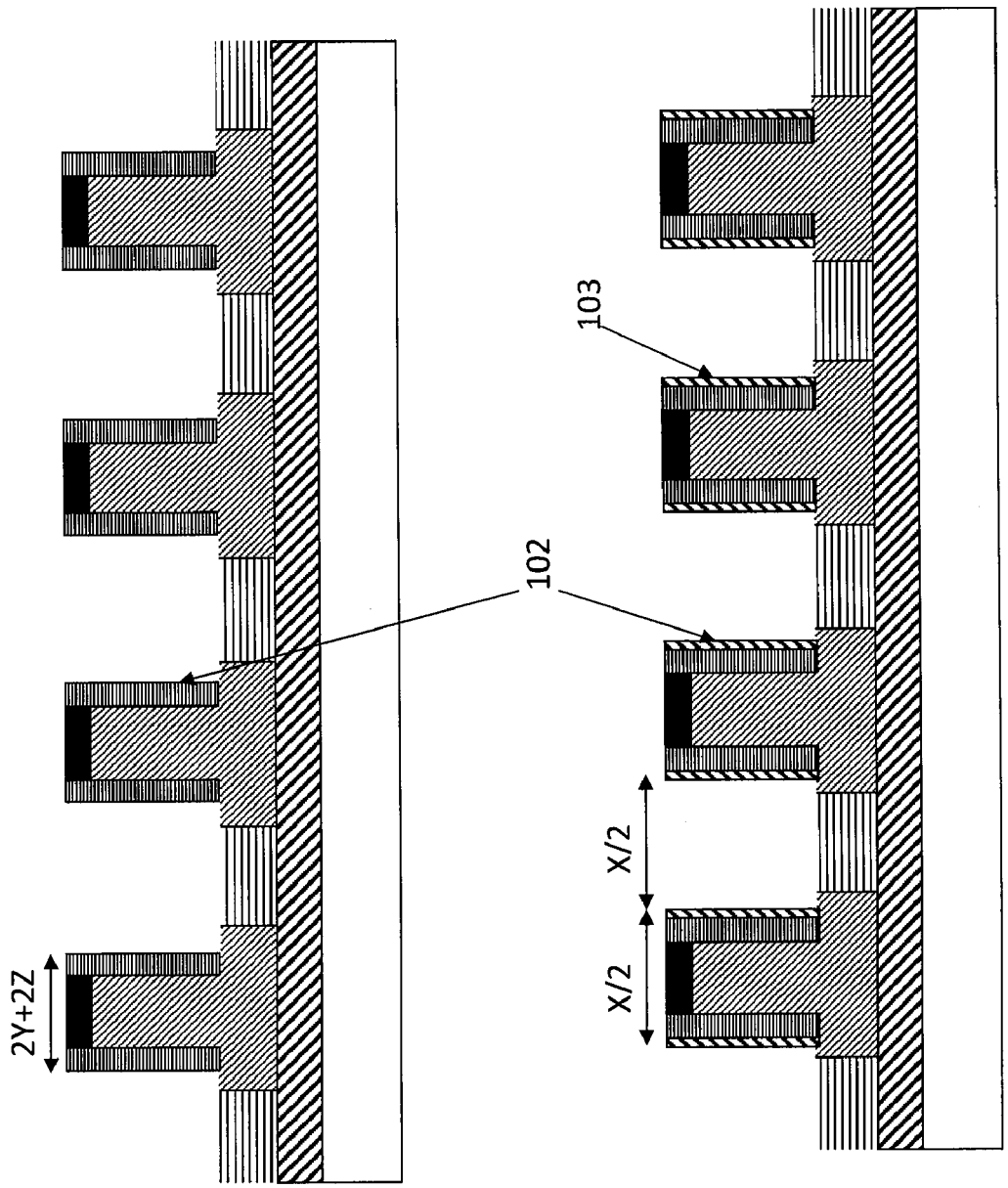

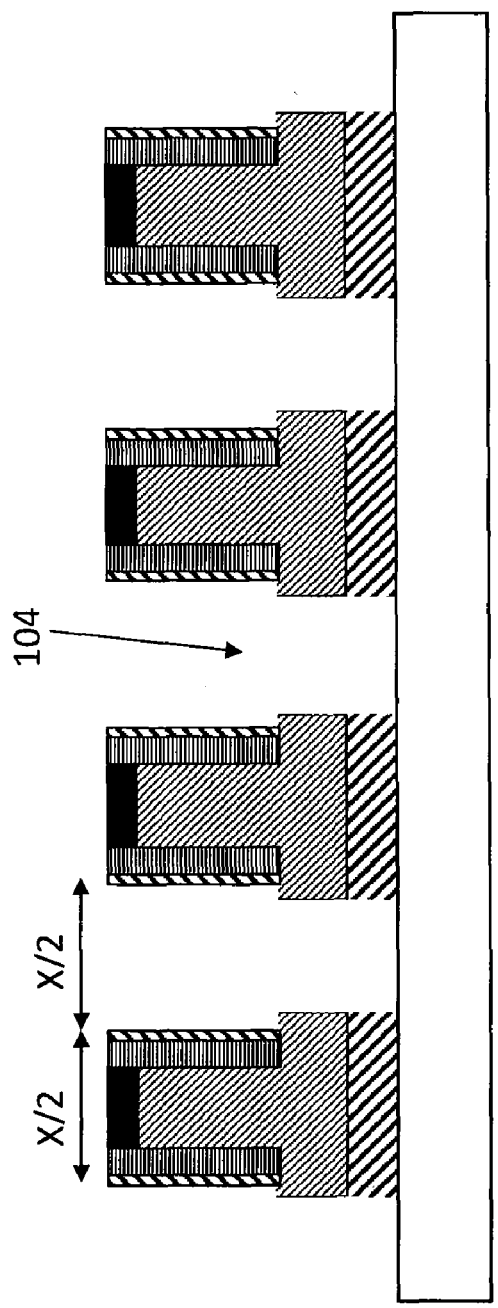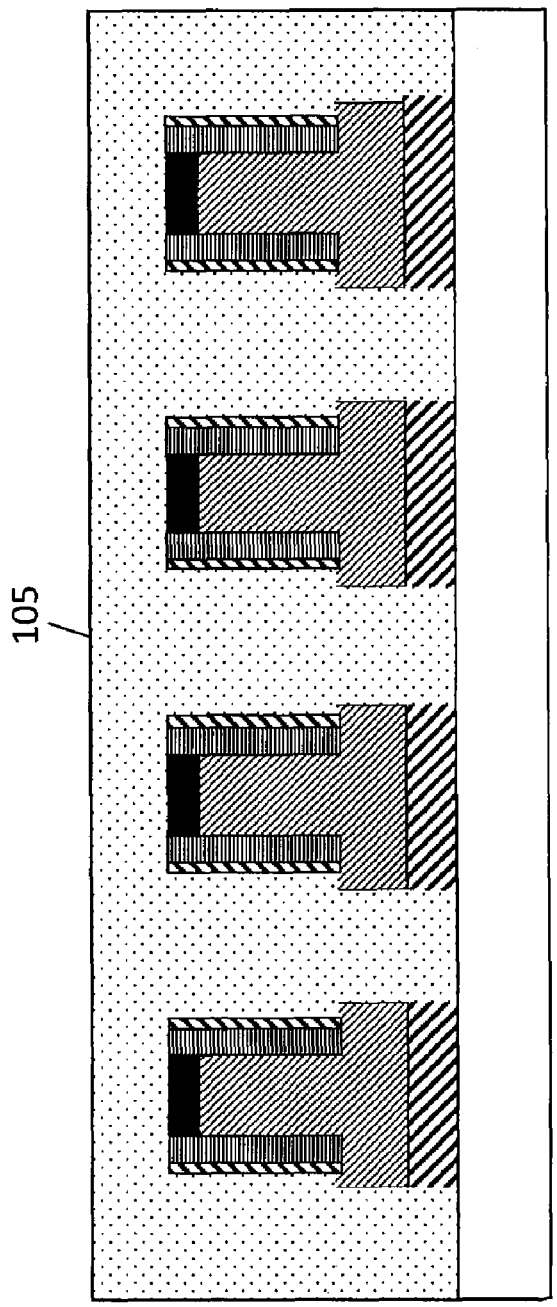

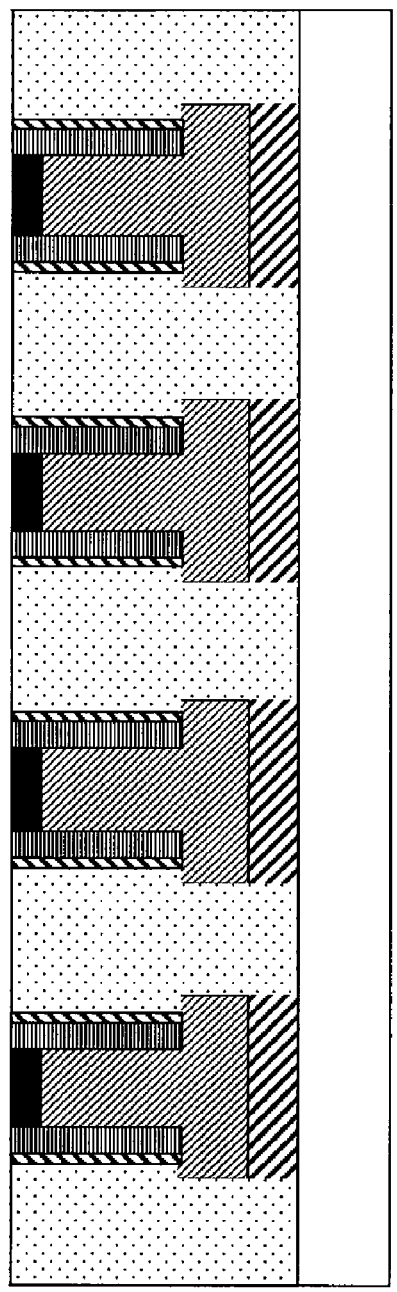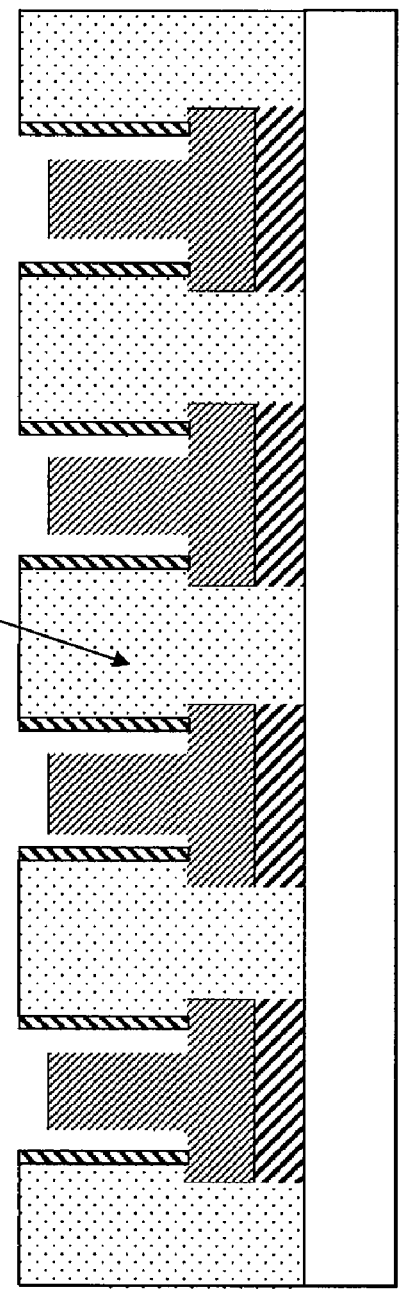
Fig. 9O
Fig. 9P

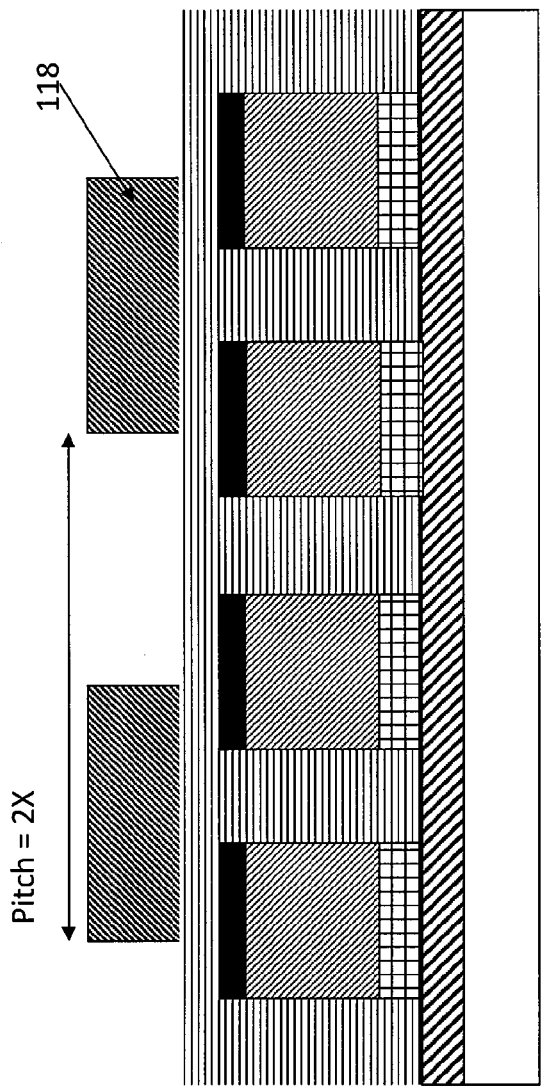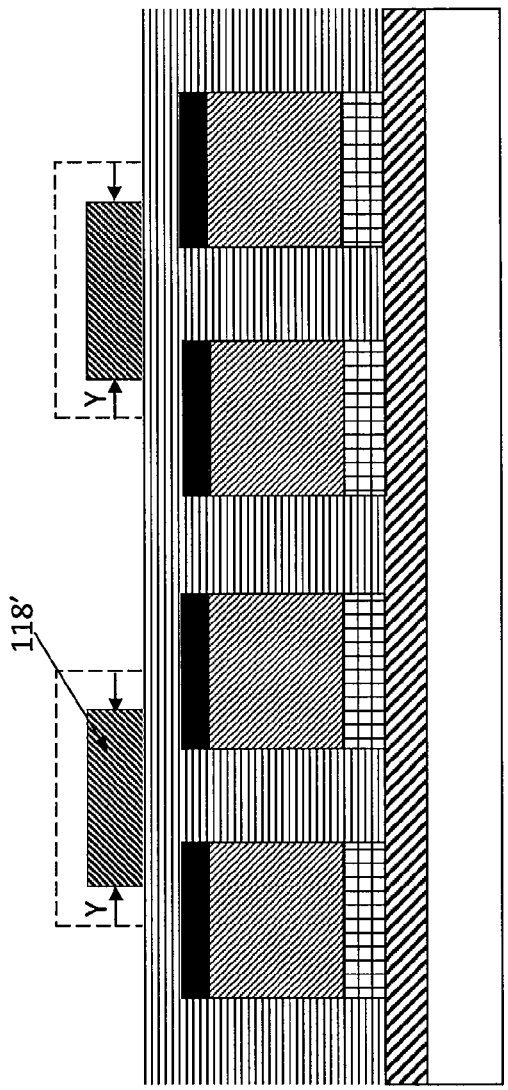

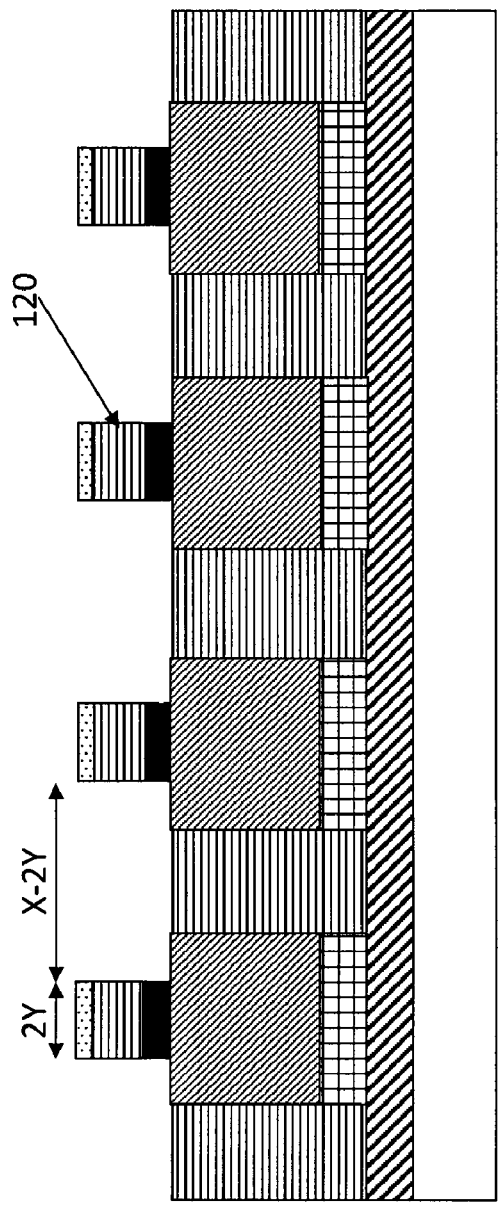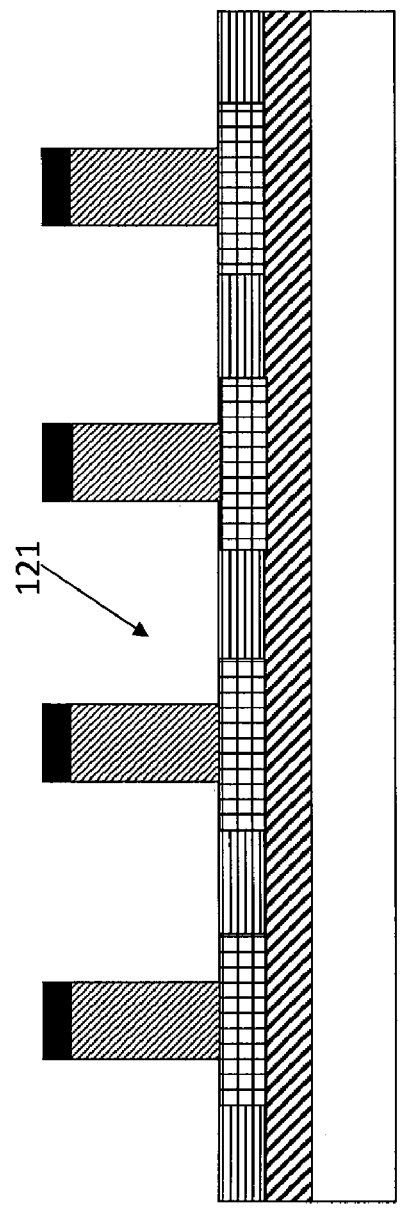
Fig. 11I
Fig. 11J

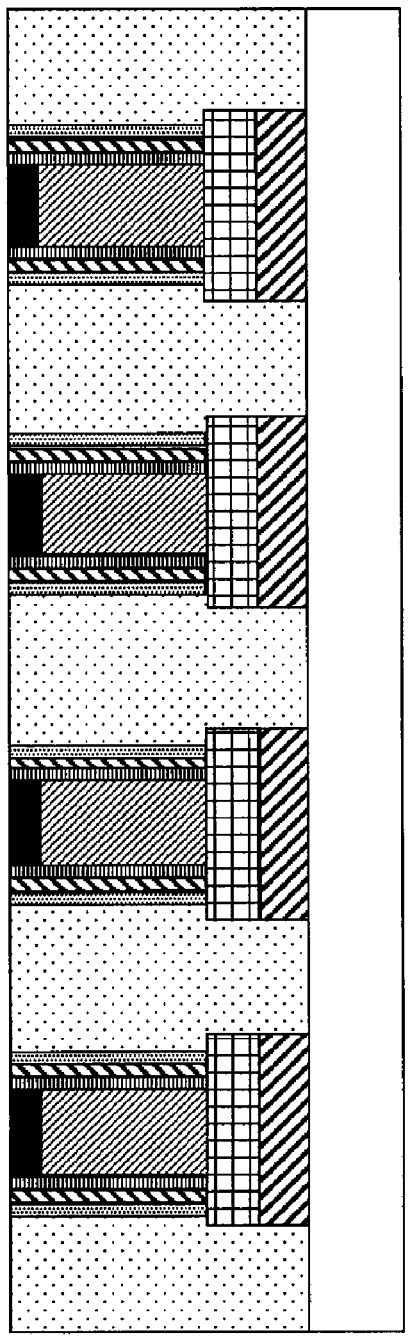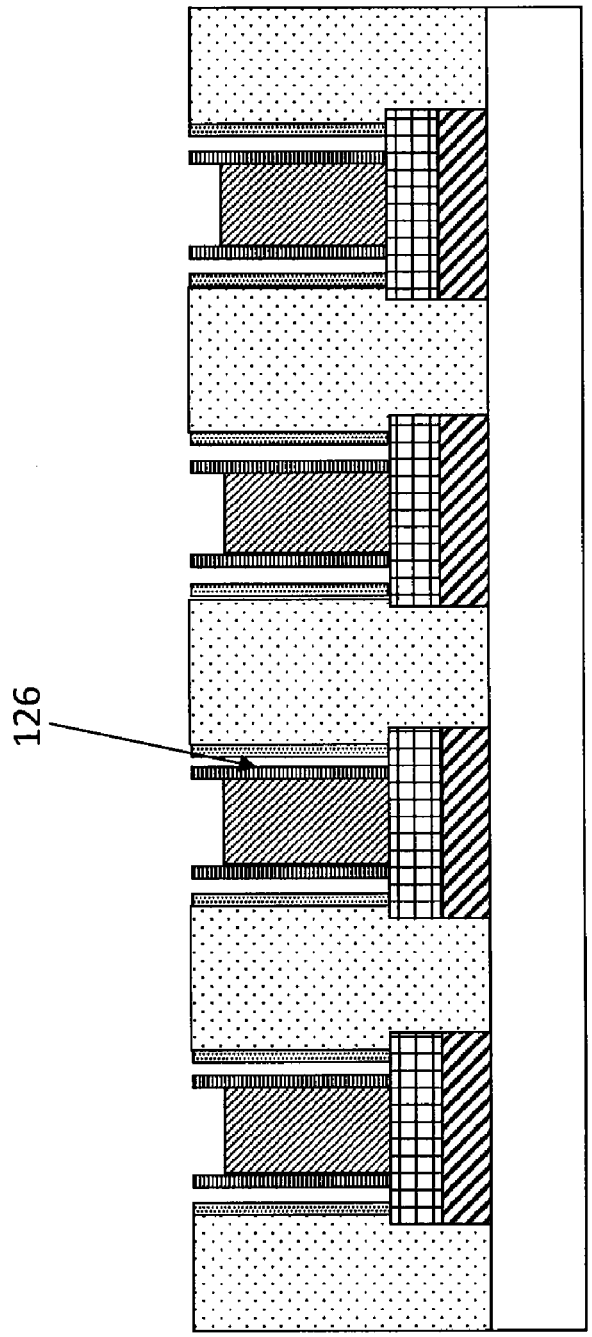
Fig. 11O
Fig. 11P

METHOD FOR FORMING INTERCONNECT STRUCTURE HAVING AIRGAP

BACKGROUND

1. Field of the Invention

The present invention generally relates to a method for forming interconnect structures, particularly to a method for forming interconnect structures having airgaps.

2. Description of the Related Art

As the dimension between metal lines decreases for each successive technology node, it is necessary to continue scaling down the capacitance between metal lines to reduce cross-talk and RC delay. Towards this objective, the k value (dielectric constant) of dielectric materials has been scaled down aggressively in the past decade from 4.0 to about 2.5. Leading edge manufacturing companies have recently reached a Keff of about 2.7 (effective k value) with the use of low-k CDO (carbon doped oxide) having a k value of about 2.5 and SiCN dielectric diffusion barrier having a k value of about 5.0. In order to achieve scaling Keff significantly below 2.5, a further decrease of k value from 2.5 to less than 2.3 will be required. The ITRS roadmap stated the target k value for bulk dielectric should be about 2.2 for a 22-nm technology node. However, it has been difficult to develop a dielectric material having a k value of less than 2.5 with good mechanical and suitable integration properties. For example, if a high porosity material is used for forming a dielectric film having a k value of less than 2.5, its mechanical strength will be significantly degraded. In addition, high porosity can lead to connected-pore problems, causing severe process integration challenges (e.g., diffusion problems in ALD/CVD-based metal process technology).

Considering the above, drastic changes have been proposed to develop airgap technology to achieve a Keff reduction for future extendibility. Nevertheless, all of the airgap processes require drastic changes to the existing process schemes. For example, Hsien-Wei Chen, et al. ("A Self-aligned Airgap Interconnect Scheme," Interconnect Technology Conference, 2009. IITC 2009. IEEE International, 1-3 Jun. 2009, pp. 146-148) use a plasma damage layer as a sacrificing layer for forming an airgap. Although this scheme does not require an additional patterning step for forming an airgap, it is difficult to control the thickness of airgap because the thickness of the plasma damage layer is not readily controllable. Patterning the airgaps is also difficult because it is difficult to deposit a sacrificing layer on sidewalls of trenches with high conformality. The conformality of a layer formed by thermal CVD tends to be better than that of plasma enhanced CVD, but thermal CVD requires high heat which is not suitable for metal (e.g., copper) interconnect structures.

SUMMARY

Consequently, some embodiments of the present invention uses conformal dielectric ALD (atomic layer deposition) process to create airgap spacing, thus reducing Keff without having to further scale down the k value of the bulk dielectric while keeping the current process flow intact or without substantial changes. More specifically, in some embodiments, the dielectric ALD process is performed at a temperature of lower than 400° C. to be compatible with BEOL (back end of line) copper damascene processing. In some embodiments, plasma enhanced ALD (PEALD) is used in a manner to control spacing for pitch halving and airgap formation simultaneously. Airgaps are formed by using sidewall spacers as sacrificing layers. In some embodiments, the sacrificing layer may be made of SiO or SiON. In some embodiments, a pore-sealing layer is deposited on sidewalls of a trench as an underlying layer for the sacrificing layer, and/or a protective layer is deposited on the sacrificing layer, which protective layer protects a surface of copper. In some embodiments, the protective layer is deposited by PEALD and may be made of SiCN or SiN.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION

Figure 1A:
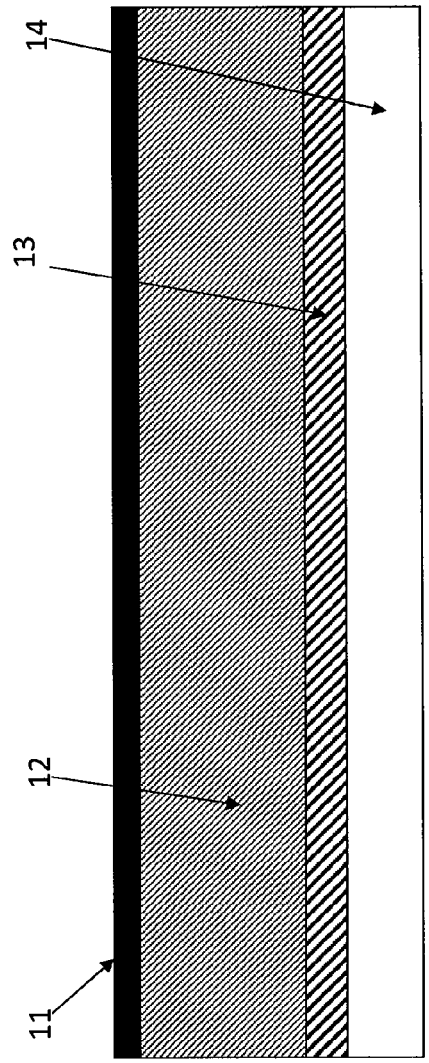
FIGS. 1A to 1P are schematic cross sections of a partially fabricated integrated circuit, showing a single damascene process scheme according to an embodiment of the present invention.

An embodiment provides a method for forming an interconnect structure with airgaps, comprising: (i) providing a structure having a trench formed on a substrate; (ii) depositing a spacer oxide layer on sidewalls of the trench as sidewall spacers preferably by plasma enhanced atomic layer deposition; (iii) filling the trench having the sidewall spacers with copper; (iv) removing the sidewall spacers to form an airgap structure; and (v) encapsulating the airgap structure, wherein airgaps are formed between the filled copper and the sidewalls of the trench.

In some embodiments, the method may further comprise depositing a $SiC_xN_y$-based spacer layer (hereinafter in "$SiC_xN_y$", x and y indicate a type of film, rather than indicating actual atomic compositions, and are independently 0 or 1, typically both x and y are 1) on the sidewall spacers by atomic layer deposition before filling the trench, wherein airgaps are formed between the $SiC_xN_y$-based spacer layer and the sidewalls of the trench. In some embodiments, the method may further comprise depositing a pore-sealing layer on the sidewalls before depositing the spacer oxide layer, wherein airgaps are formed between the pore-sealing layer and the $SiC_xN_y$-based spacer layer.

In any of the foregoing embodiments, the step of providing the structure may comprise: (a) producing a via structure on the substrate; (b) performing SLAM (simultaneous location and mapping) processing to cover the via structure with a SLAM layer; and (c) forming a trench by etching part of the SLAM layer, wherein the method further comprises forming a via by removing a remaining part of the SLAM layer after the SiC-based spacer layer is deposited on the sidewall spacers but before filling the trench with copper wherein the trench and the via are filled with copper. In some embodiments, the method may further comprise depositing a $SiC_xN_y$-based spacer layer on the sidewall spacers by atomic layer deposition before forming the via, wherein airgaps are formed between the $SiC_xN_y$-based spacer layer and the sidewalls of the trench. In some embodiments, the method may further comprise depositing a pore-sealing layer on the sidewalls of the trench before depositing the spacer oxide layer, wherein airgaps are formed between the $SiC_xN_y$-based spacer layer and the pore-sealing layer.

In some embodiments, the spacer oxide layer may be a silicon oxide layer.

In some embodiments, the structure having the trench on the substrate may be a layered structure comprising a diffusion barrier layer, a low-k layer, and a hard mask formed in this layering order on the substrate, wherein the trench penetrates the hard mask, the low-k layer, and the diffusion barrier layer.

In some embodiments, the step of providing the structure may comprises: (i) forming a photoresist pattern on the hard mask; (ii) depositing an oxide spacer on the photoresist and an area of the hard mask uncovered by the photoresist, by PEALD at a temperature of 400° C. or lower; (iii) etching the oxide spacer by a thickness of the oxide spacer in a thickness direction, thereby leaving a sidewall portion of the oxide spacer deposited on sidewalls of the photoresist; (iv) etching an area of the hard mask exposed after the etching of the oxide spacer, followed by removing the sidewall portion of the oxide spacer and the photoresist to obtain a patterned hard mask and an exposed portion of the low-k layer; (v) forming a second photoresist pattern on the exposed portion of the low-k layer and a part of the patterned hard mask; (vi) depositing a second oxide spacer on the second photoresist and an area of the patterned hard mask uncovered by the second photoresist, by PEALD at a temperature of 400° C. or lower; (vii) etching the second oxide spacer by a thickness of the second spacer in a thickness direction, thereby leaving a sidewall portion of the second oxide spacer deposited on sidewalls of the second photoresist; (viii) etching an area of the patterned hard mask exposed after the etching of the second oxide spacer, followed by removing the sidewall portion of the second oxide spacer and the second photoresist to obtain a second patterned hard mask and an exposed portion of the low-k layer; and (ix) etching the low-k layer and the diffusion barrier layer using the second patterned hard mask. The above scheme is a double-exposure BEOL process, wherein a photoresist is used twice to form a trench.

In some embodiment, the step of providing the structure comprises: (i) forming a photoresist pattern on the hard mask; (ii) trimming the photoresist to reduce the dimensions; (iii) depositing an oxide spacer on the trimmed photoresist and an area of the hard mask uncovered by the trimmed photoresist, by PEALD at a temperature of 400° C. or lower; (iv) etching the oxide spacer by a thickness of the oxide spacer in a thickness direction, thereby leaving a sidewall portion of the oxide spacer deposited on sidewalls of the trimmed photoresist, followed by removing the trimmed photoresist; (v) etching an area of the hard mask exposed after the etching of the oxide spacer and the removal of the trimmed photoresist, followed by etching the sidewall portion of the oxide spacer to obtain a patterned hard mask and an exposed portion of the low-k layer; and (vi) etching the low-k layer and the diffusion barrier layer using the patterned hard mask. The above process is a single-exposure BEOL process, wherein a photoresist is used once for forming a trench.

In any of the disclosed embodiments, either the above double-exposure process or the single-exposure process can be used to etch any interlayer dielectric.

In some embodiments, the $SiC_xN_y$-based spacer layer on the sidewall spacers may be constituted by SiCN.

In some embodiments, the structure having the trench on the substrate may be a layered structure comprising a diffusion barrier layer, a low-k layer, and a hard mask formed in this layering order on the substrate, wherein the trench penetrates the hard mask and the low-k layer, but does not penetrate the diffusion barrier layer, whereby the pore-sealing layer is disposed on the sidewalls of the hard mask and the low-k layer, followed by extending the trench downward to penetrate the diffusion barrier layer before depositing the spacer oxide layer.

In some embodiments, the via structure may be a layered structure comprising a diffusion barrier layer, a low-k layer, and a hard mask in this layering order on the substrate, wherein a via penetrates the hard mask and the low-k layer, but not the diffusion barrier layer, wherein when the via is formed by removing the remaining part of the SLAM layer, the diffusion barrier layer is also removed.

In some embodiments, the via structure may be a layered structure comprising a diffusion barrier layer, a dense low-k layer, a porous low-k layer, and a hard mask in this layering order on the substrate, wherein a via penetrates the hard mask, the porous low-k layer, and the dense low-k layer, wherein the step of forming the trench comprises etching the porous low-k layer, but not the dense low-k layer, wherein when the via is formed by removing the remaining part of the SLAM layer, the diffusion barrier layer is also removed.

In any of the foregoing embodiments, the method may further comprise selecting a thickness of the spacer oxide layer to achieve a targeted dielectric constant of the encapsulated airgap structure between the copper filled in the trench and copper filled in an immediately adjacent trench, and the step of depositing the spacer oxide layer is controlled to obtain the spacer oxide layer at the selected thickness. In some embodiments, the thickness of the spacer oxide layer may be controlled at 0.4 nm to 10 nm. In some embodiments, the targeted dielectric constant of the encapsulated airgap structure may be less than 2.5.

In this disclosure, the term "trench" may refer to a deeply etched area used to isolate one area from another or to form a storage capacitor on a wafer. The trench may be filled with copper and constitute a metal layer.

The term "via" may refer to an opening in the dielectric layer(s) through which a riser passes, or in which the walls are made conductive; an area that provides an electrical pathway (typically a vertical pathway) from one metal layer to the metal layer above or below. The via may connect two trench layers formed in a layering direction.

The term "Keff" may refer to the effective dielectric constant of a material constituted by more than one layer or portion which can be calculated based on the dielectric constant of each layer or portion constituting the material and the thickness of each layer or portion, wherein the layer or portion includes an "airgap" which has a dielectric constant of one.

A "layer" may consist of a single layer (uniform or homogenous layer) or may be comprised of multiple layers stacked in a thickness or layering direction, and may be a continuous or discontinuous layer extending in a direction perpendicular to a thickness or layering direction. "Forming a layer on another layer" may refer to a layer formed immediately or directly on another layer or formed indirectly on another layer where one or more intervening layers are formed therebetween. Further, "gas" may include vaporized solid and/or liquid and may be constituted by a mixture of gases.

In the present disclosure where conditions and/or structures are not specified, the skilled artisan in the art can readily provide such conditions and/or structures, in view of the present disclosure, as a matter of routine experimentation.

Also, in the present disclosure, the numerical numbers applied in specific embodiments can be modified by a range of at least ±50% in other embodiments, and the ranges applied in embodiments may include or exclude the endpoints.

The present invention will be explained in detail with reference to preferred embodiments which are not intended to limit the present invention.

The first three process flows described below are related to a single damascene process, and the second three process flows described later are related to a dual damascene process. However, the present invention is not intended to be limited to these particular applications. The skilled artisan would appreciate that the process flows disclosed herein can be applied to any suitable process schemes for forming interconnect structures. Unless specified otherwise, deposition of layers can be accomplished by any suitable plasma methods including enhanced CVD, thermal CVD, high density plasma CVD, UV radiation, plasma enhanced ALD, and thermal ALD.

The first process flow is shown in FIGS. 1A to 1P and uses three spacers (e.g., oxide ALD layers) to achieve pitch halving in a double exposure scheme and controlling airgap spacing.

Figure 1B:
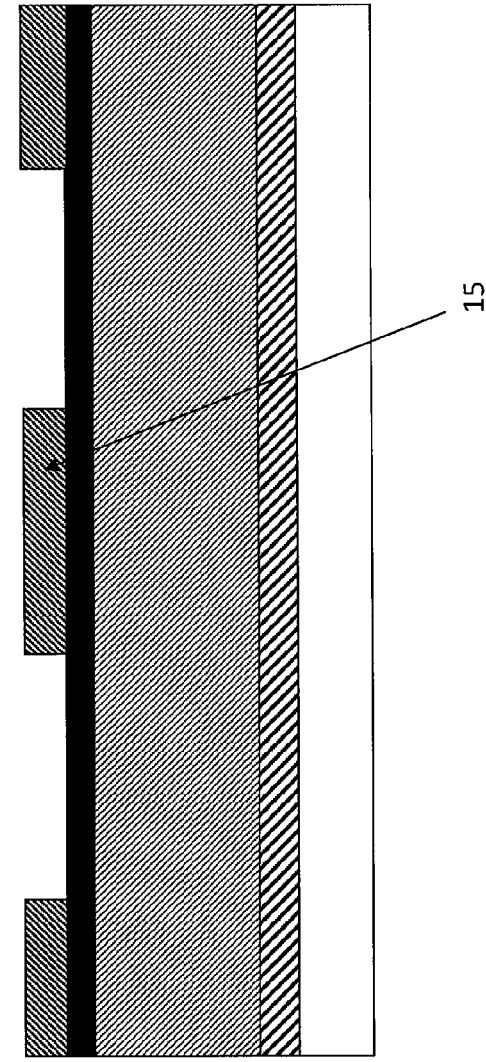
Figure 1C:
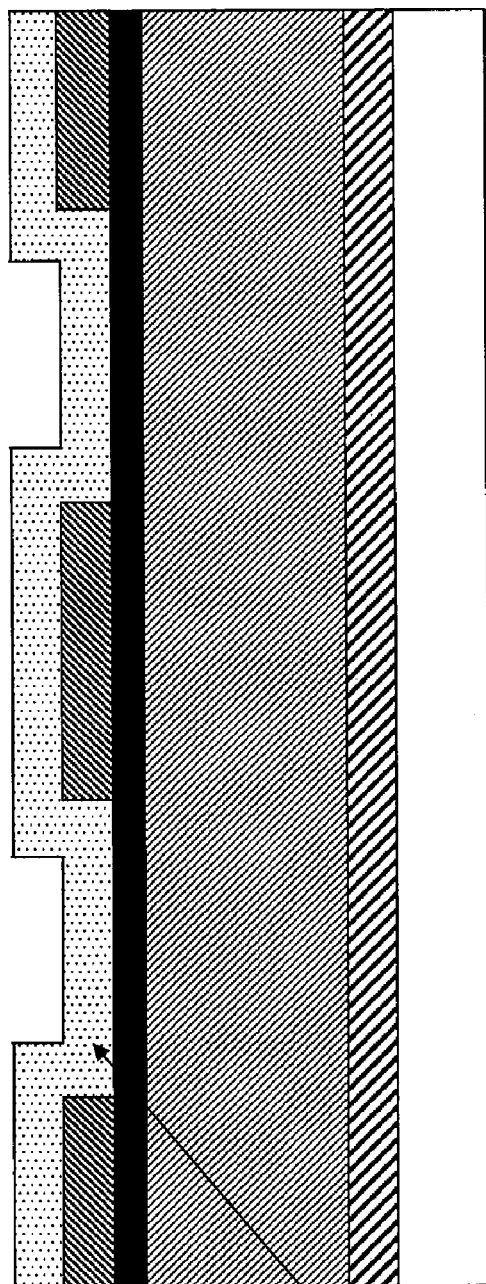
Figure 1D:
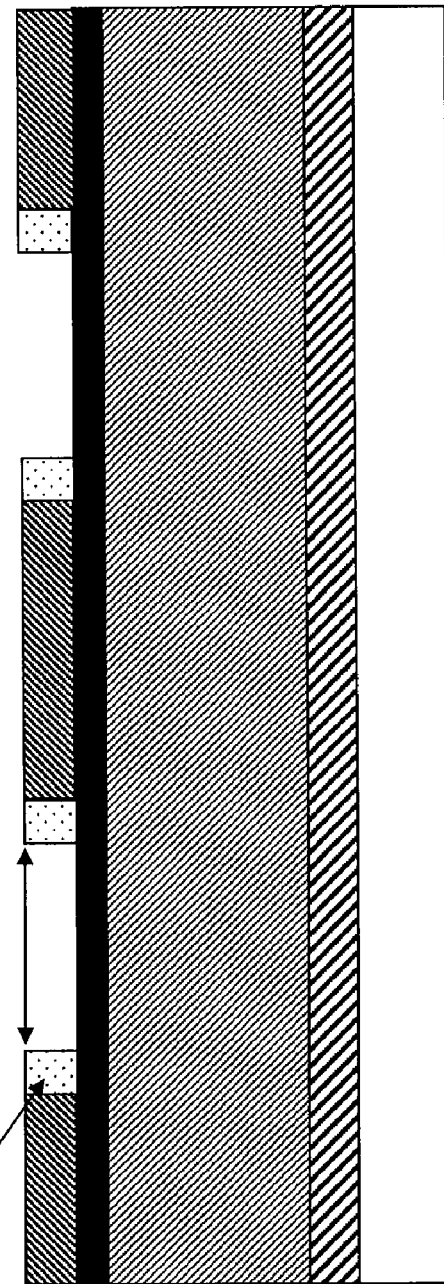
Figure 1E:
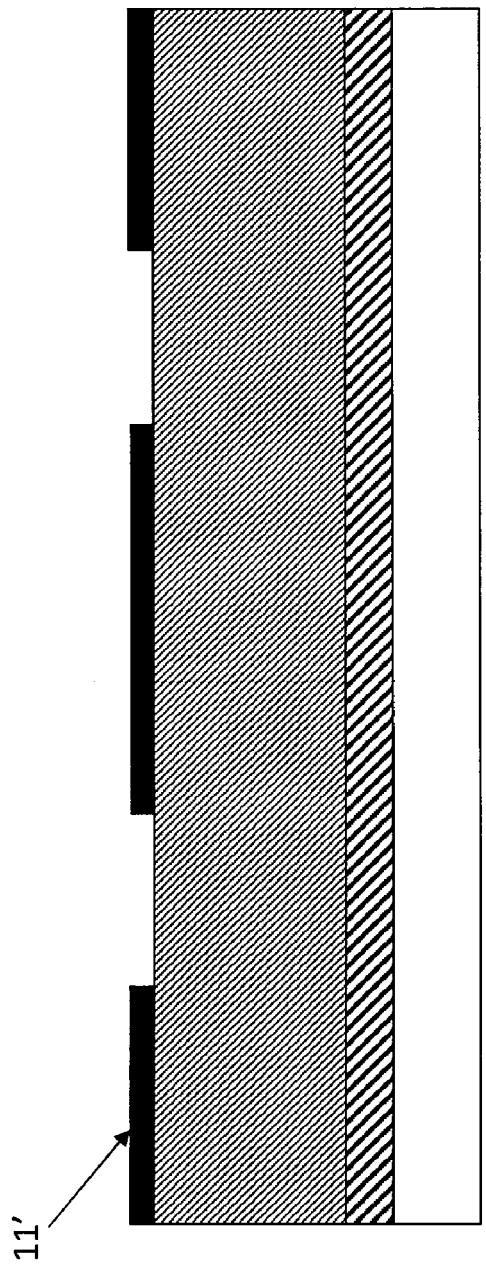
Figure 1F:
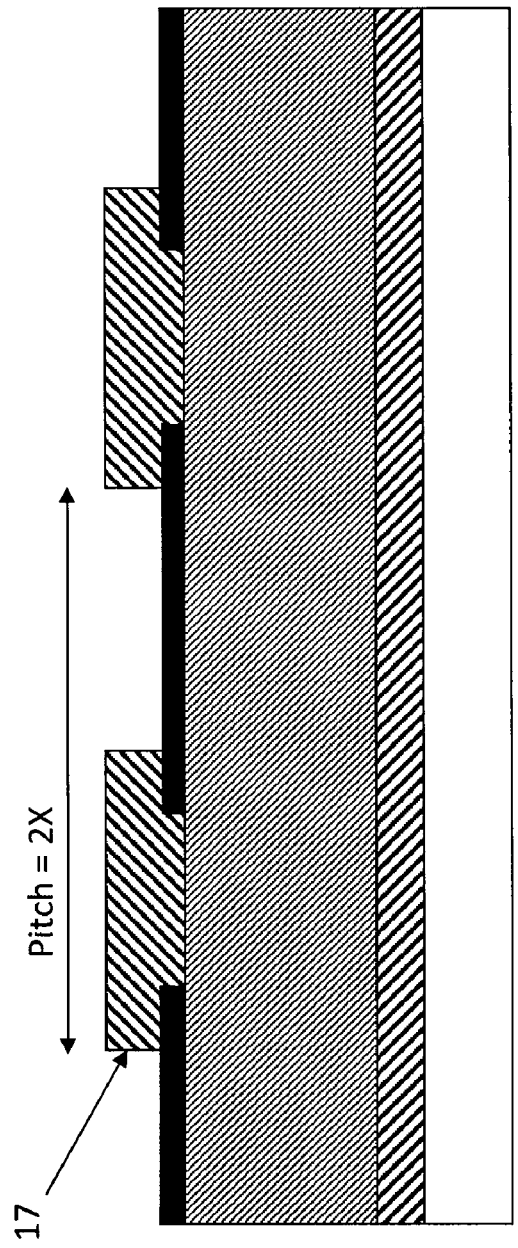
Figure 1G:
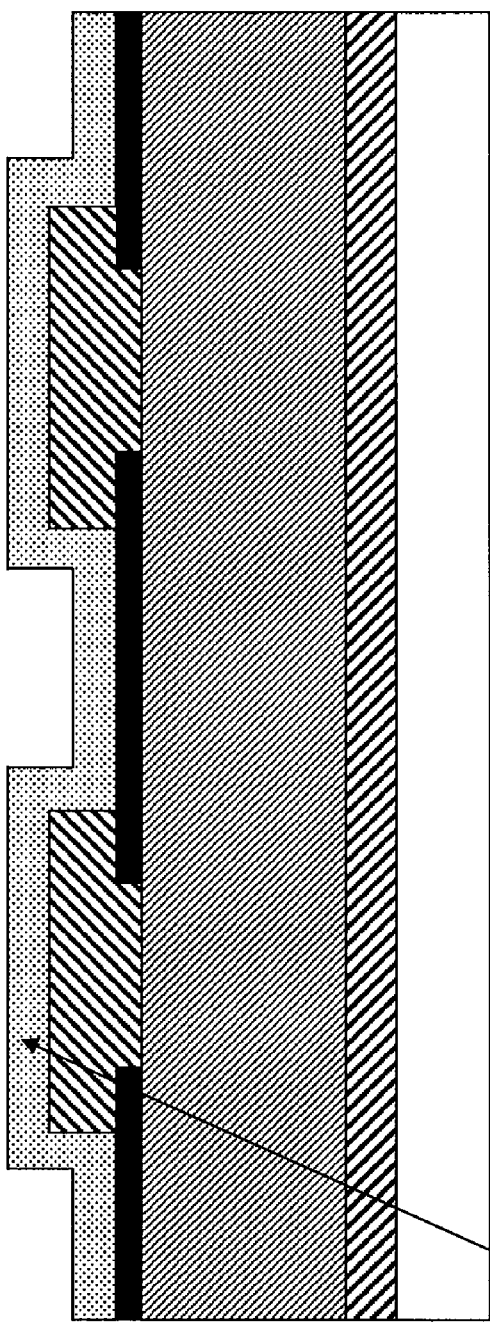
Figure 1H:
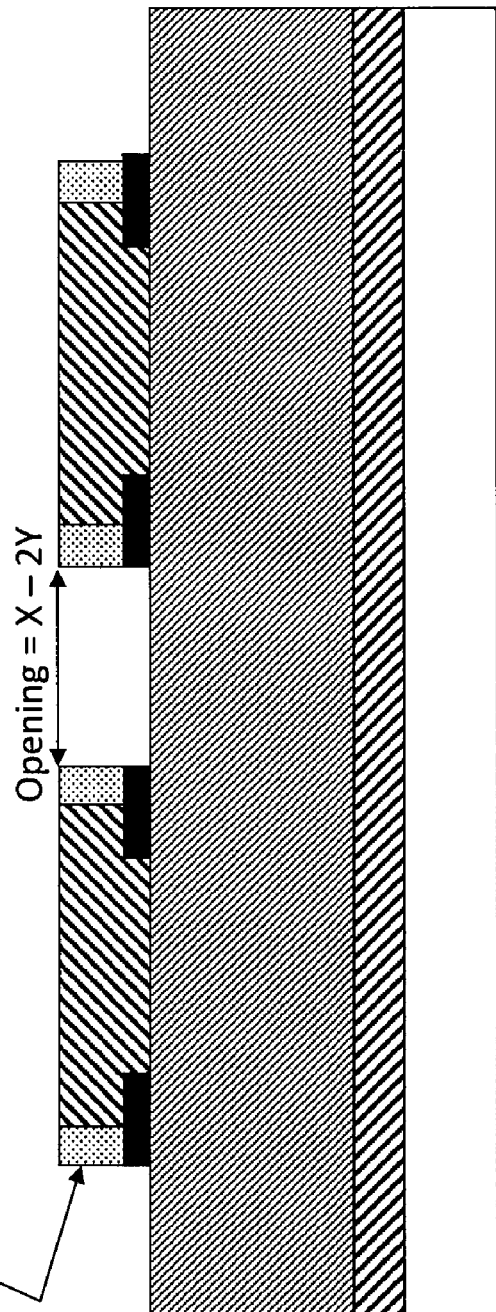

As shown in FIG. 1A, as a bulk dielectric, a diffusion barrier layer 13 (e.g., SiCN), a low-k layer 12 (e.g., carbon doped oxide (CDO) or porous CDO), and a hard mask 11 (e.g., TiN) are formed on a substrate 14 (e.g., silicon). On top of the hard mask, a photoresist 15 is formed and subjected to patterning ($1^{St}$ exposure) at a pitch of 2X (e.g., X=10 nm to 1000 nm, in some embodiments X=30 nm to 100 nm) as shown in FIG. 1B. Next, a spacer 16 is deposited at a thickness of Y (e.g., Y is less than X/4, in some embodiments Y is more than X/10 and less than X/6, on the photoresist as shown in FIG. 1C. The spacer 16 and the hard mask 11 are then etched by, e.g., anisotoropic etching in a vertical direction (which is defined as a relative direction referring to a layering or thickness direction of the bulk dielectric or a direction as viewed on the drawings) so as to have an opening having a size of X−2Y as shown in FIG. 1D. The spacer 16 is then removed and the photoresist 15 is stripped, followed by cleaning of surfaces, thereby forming a patterned hard mask 11' as shown in FIG. 1E. Next, a photoresist 17 is formed and subjected to patterning ($2^{nd}$ exposure) at a pitch of 2X connecting a piece of the patterned hard mask 11' and an immediately adjacent piece of the patterned hard mask 11' as shown in FIG. 1F. Next, a spacer 18 is formed at a thickness of Y as shown in FIG. 1G. The spacer 18 and the hard mask 11' are then etched in a vertical direction so as to have an opening having a size of X−2Y as shown in FIG. 1H. The spacer 18 is then removed and the photoresist 17 is stripped, followed by cleaning of surfaces, thereby forming a patterned hard mask 11" at a pitch of X as shown in FIG. 1I. Next, the low-k layer 12 and the diffusion barrier layer 13 are etched using e.g., $CH_xF_y$ chemistry in a vertical direction using the patterned hard mask 11", thereby forming a trench 19 having an opening of X−2Y with a separation wall having a width of 2Y as shown in FIG. 1J.

In the above, the SiCN layer can be deposited by any suitable methods including, but not limited to, those disclosed in U.S. Patent Application Publication No. 2008/0038485, the disclosure of which is herein incorporated by reference in its entirety. The CDO layer can be deposited by any suitable methods including, but not limited to, those disclosed in U.S. Pat. No. 6,455,445, the disclosure of which is herein incorporated by reference in its entirety. The porous CDO layer can be deposited by any suitable methods including, but not limited to, those disclosed in U.S. Pat. No. 7,098,149, the disclosure of which is herein incorporated by reference in its entirety. The TiN layer (hard mask) can be deposited by any suitable methods including, but not limited to, spattering and thermal CVD.

Next, a spacer oxide layer 20 is deposited as a sidewall spacer as shown in FIG. 1K. In this embodiment, after the spacer oxide layer 20 is deposited, the opening of the trench and the width of the separation wall are substantially the same (X/2). Thus, the thickness of the spacer oxide layer is calculated at X/4−Y. The spacer oxide layer is deposited by any suitable methods, but preferably by PEALD which can deposit a layer with a conformality of 90% or higher. The spacer oxide layer may be of SiO or SiON. Preferable PEALD includes, but is not limited to, those disclosed in U.S. patent application Ser. No. 12/416,809 achieving a high conformality at a relatively low temperature (400° C. or lower). Deposition of the spacer oxide layer 20 does not require particularly low temperatures, and thus, the methods disclosed in U.S. patent application Ser. No. 12/618,355 can also be used. In some embodiments, the methods disclosed in U.S. patent application Ser. No. 12/467,017 can be used wherein a high conformality is achieved by CVD. All of the above listed applications are owned by the same assignee as in the present application, and each disclosure of the applications is herein incorporated by reference in its entirety. In some embodiments, depending on the dimension and configuration of the interconnect structure, the spacer may be formed by the methods disclosed in U.S. Pat. Nos. 5,916,365 and 6,652,924, each disclosure of which is herein incorporated by reference in its entirety.

In this embodiment, as described above, three spacers 16, 18, 20 are used. The spacers 16, 18 can be deposited in methods which are similar to or the same as those for the spacer 20, so that accurate patterning can be realized due to the high conformality of deposited layers. Low-temperature PEALD methods, particularly methods disclosed in above-mentioned U.S. patent application Ser. No. 12/416,809, are preferably used for spacers 16 and 18 if the heat resistance of photoresists 15 and 17 is not sufficient, and also for spacer 20 if a lower film density and a higher film removal rate of the spacer are desired.

Next, the spacer oxide layer is etched in a vertical direction so as to form a sidewall spacer 20 as shown in FIG. 1L. Copper barrier/seed deposition (e.g., Ta/TaN barrier) is then conducted (not shown), and then the trench is filled with copper 21 by, e.g., electroplating as shown in FIG. 1M. The copper layer 21 is subjected to chemical physical polishing (CMP) and the hard mask is removed to expose the low-k layer 12 as shown in FIG. 1N. The sidewall spacer 20 is then removed by e.g., HF wet etching for SiOx-selective removal, thereby forming airgaps 22 as shown in FIG. 1O. The airgap structure is then encapsulated by deposition of, e.g., SiCN layer 23. In this embodiment, the thickness of the airgaps is calculated at X/2−2Y (each airgap has a thickness of X/4−Y). The dielectric constant of the airgap is assumed to be one (K=1). The thickness of the separation wall is 2Y. The effective dielectric constant of the separation wall (Keff) can be calculated based on the proportions of the low-k layer and the diffusion barrier layer. The effective dielectric constant of the airgap structure (between the copper filled in the trench and copper filled in an immediately adjacent trench) (Keff (airgap)) can be calculated by the following equation:

$$\text{Keff (airgap)} = [(2Y*\text{Keff}) + (X/2 - 2Y)]/X/2 = 1 + 4Y/X*(\text{Keff} - 1)$$

Figure 2:
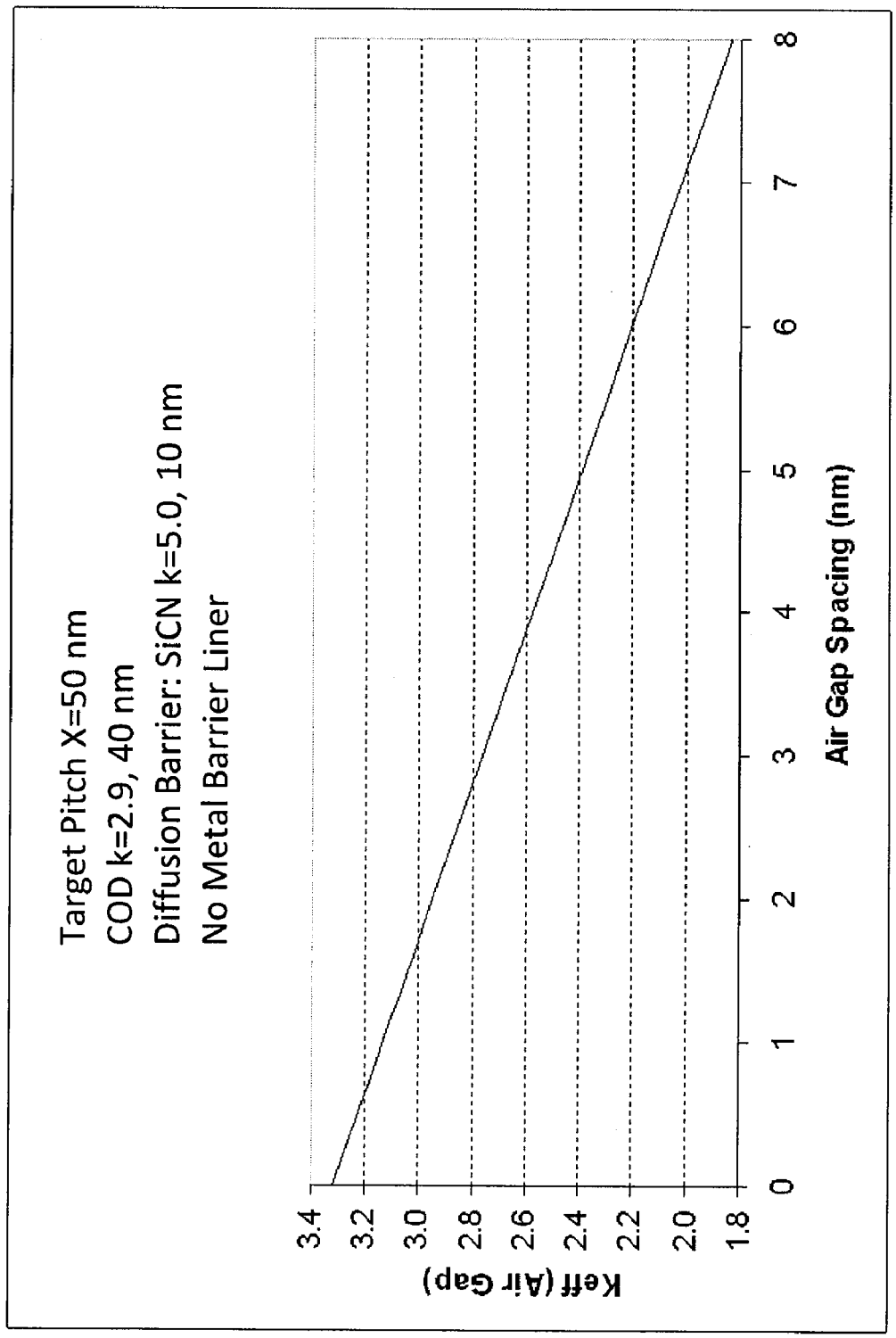
FIG. 2 is a graph showing the relationship between Keff and airgap spacing for the interconnect structures shown in FIGS. 1A to 1P according to an embodiment of the present invention.

In the above, when the thickness of the low-k layer (e.g., K=2.9 for dense CDO) is 40 nm, and the thickness of the diffusion barrier layer (e.g., K=5.0 for SiCN) is 10 nm, Keff can be calculated at 3.32. When the target pitch X is 50 nm, Keff (airgap) can be adjusted as shown in FIG. 2 by adjusting the thickness of the airgap (airgap spacing). By selecting the airgap spacing from about 1 nm to about 7 nm, Keff (airgap) can proportionally be adjusted from about 3.1 to about 2.0. In the above, a K value of dense CDO may vary in a range of 2.8-2.9, and a K value of SiCN diffusion barrier may vary in a range of 5.0-5.5.

In this disclosure, the process conditions described in relation to an embodiment can readily apply to another embodiment unless described otherwise.

Figure 3C:
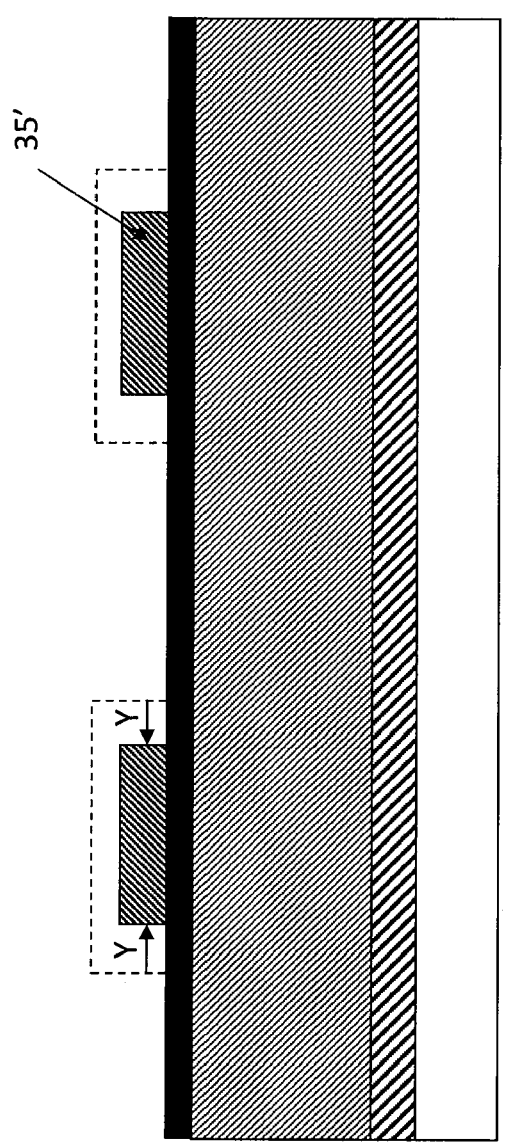
FIGS. 3A to 3N are schematic cross sections of a partially fabricated integrated circuit, showing a single damascene process scheme according to an embodiment of the present invention.
Figure 3D:
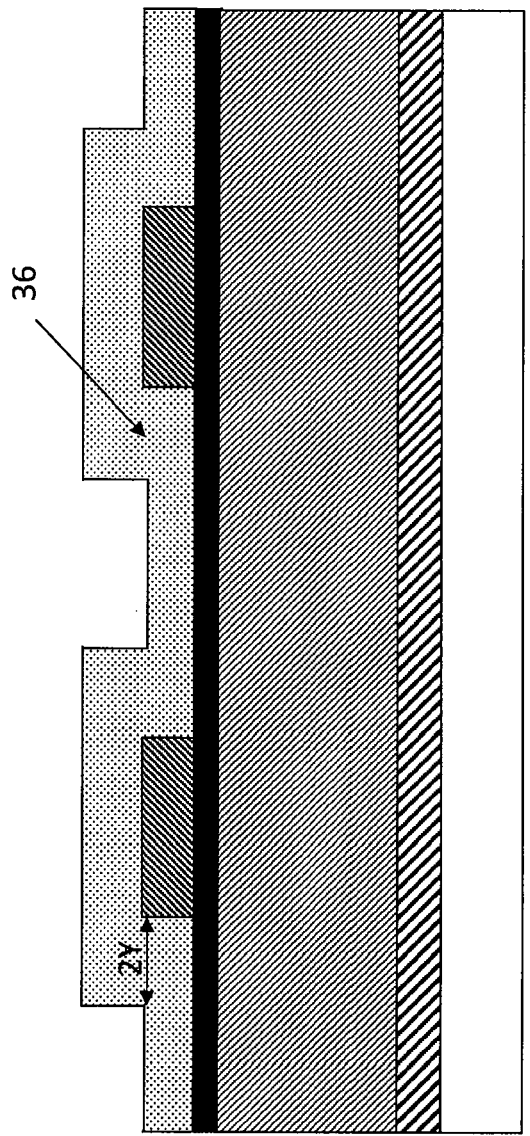
Figures 3E, 3F:
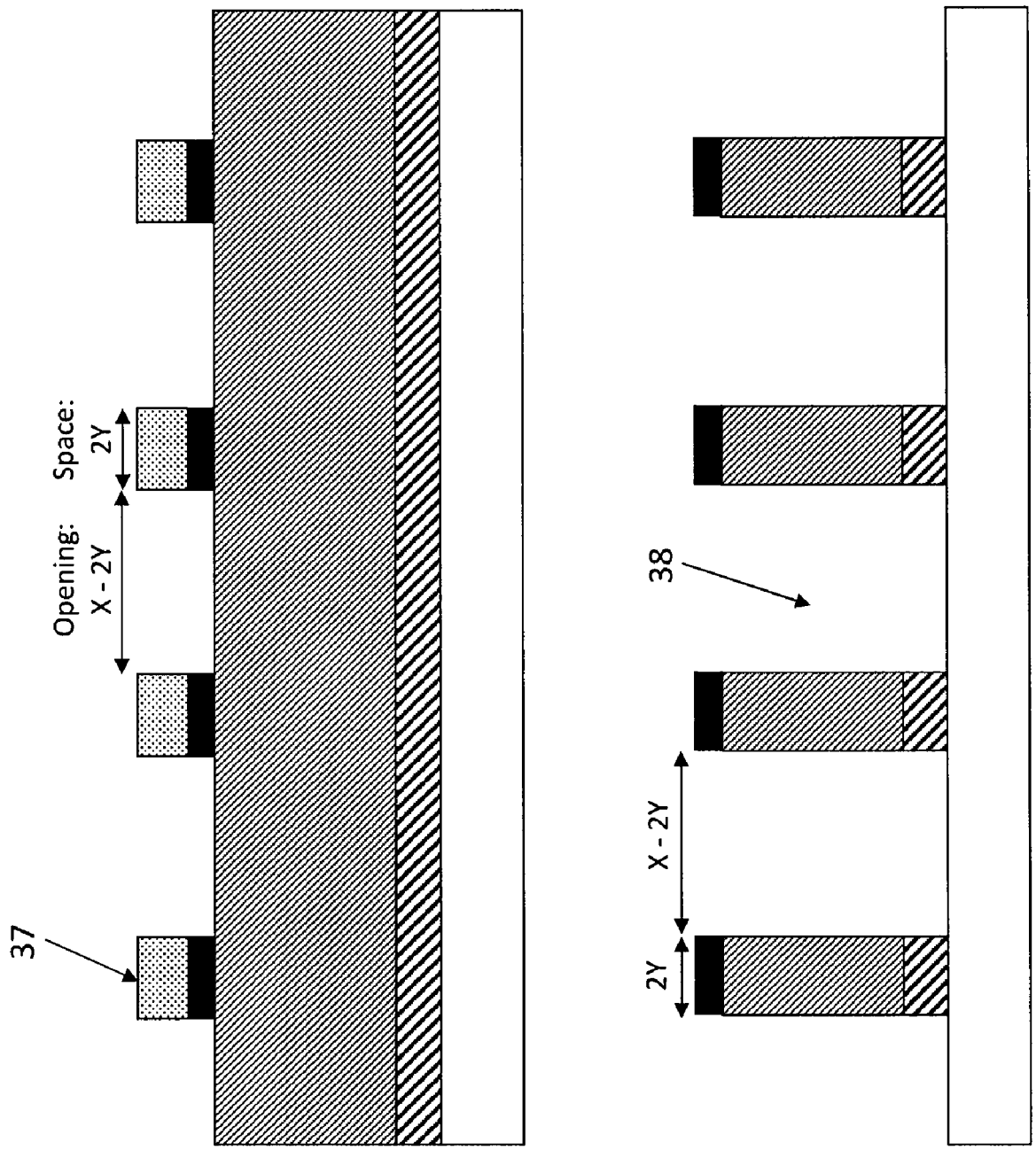
Figures 3I, 3J:
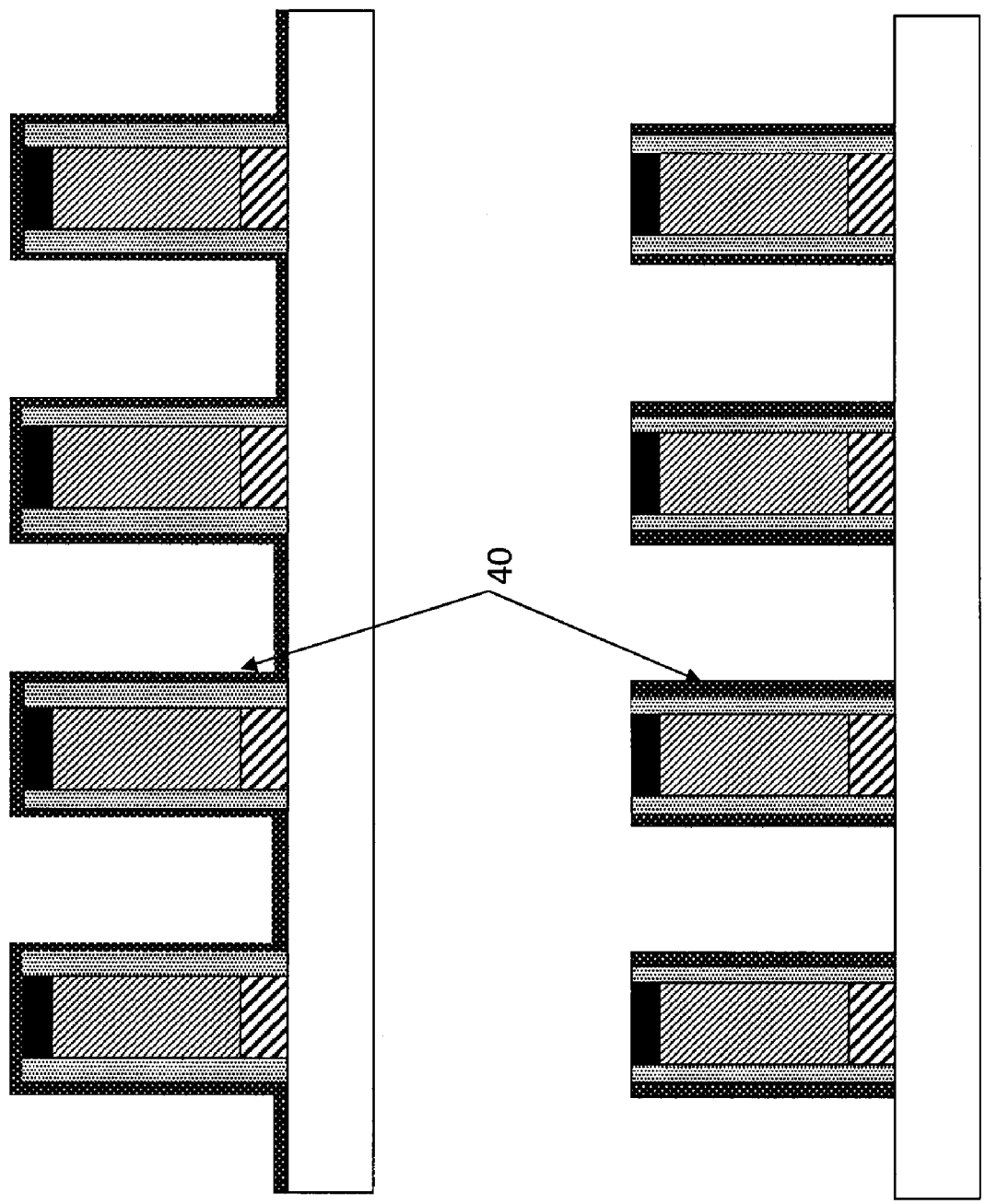
Figure 3K:
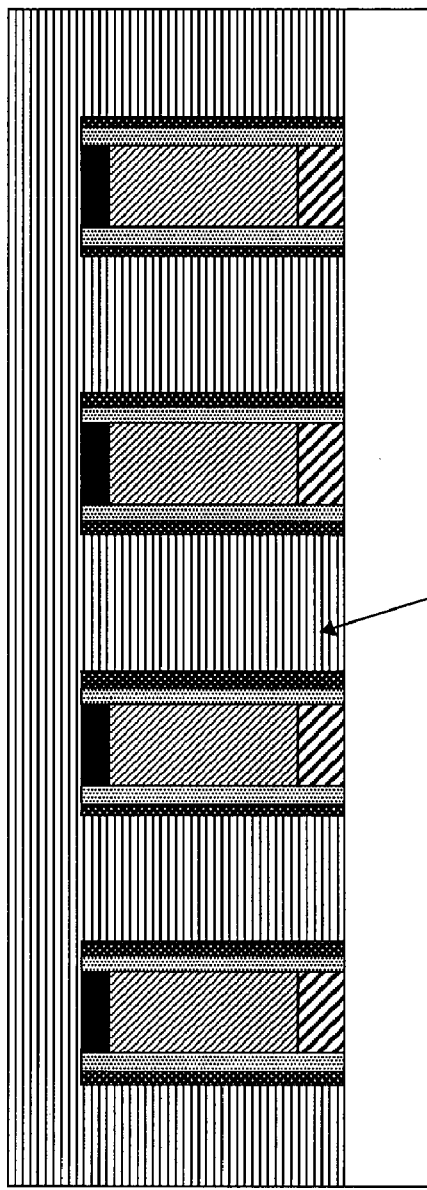
Figure 3L:
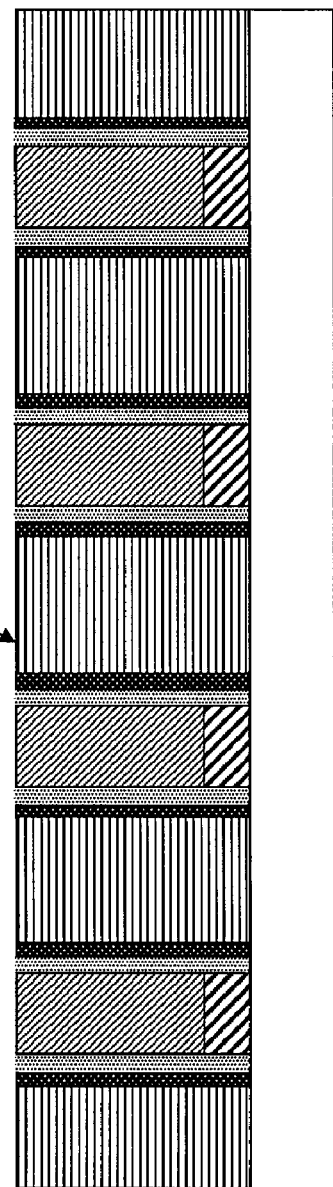
Figure 3M:
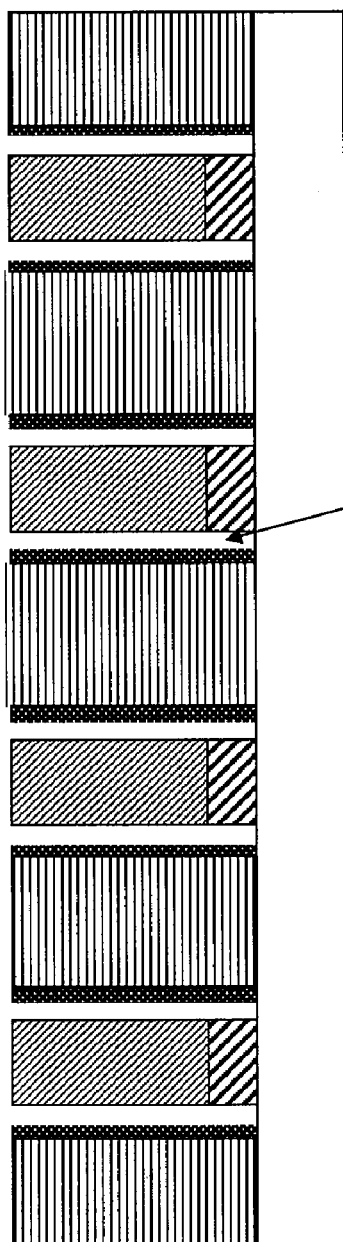
Figure 3N:
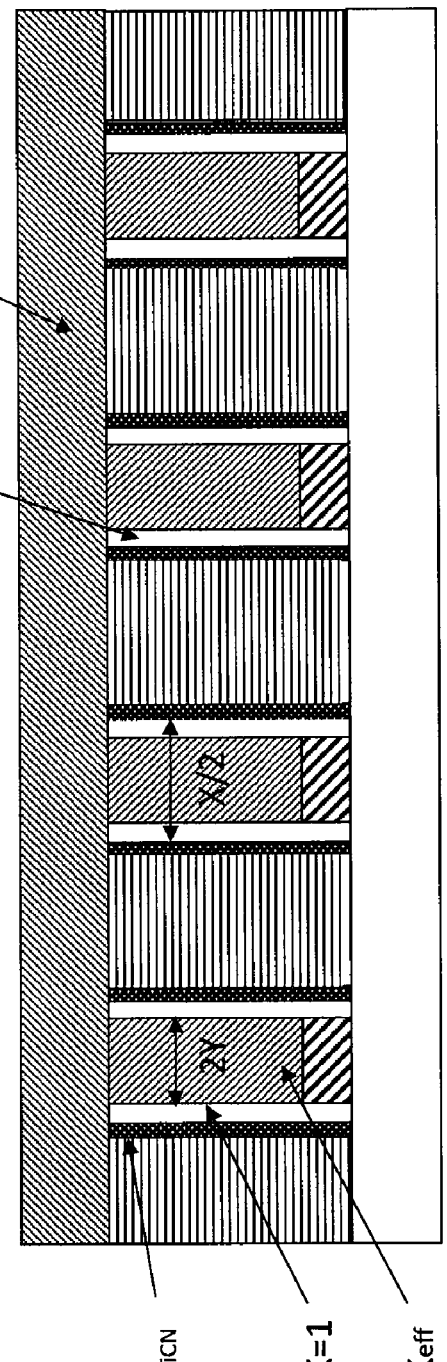

The second process flow is shown in FIGS. 3A to 3N and uses three spacers (e.g., ALD layers) to achieve pitch halving and controlling airgap spacing. One of the three spacers here is a protective liner layer for barrier metal film. In this embodiment, the pitch halving uses a single exposure scheme. However, the double exposure scheme can also be used with an additional ALD deposition step as shown in FIGS. 1A to 1P.

As shown in FIG. 3A, as a bulk dielectric, a diffusion barrier layer 33 (e.g., SiCN), a low-k layer 32 (e.g., carbon doped oxide (CDO) or porous CDO), and a hard mask 31 (e.g., TiN) are formed on a substrate 34 (e.g., silicon). On top of the hard mask, a photoresist 35 is formed and subjected to patterning at a pitch of 2X (e.g., X=10 nm to 1000 nm, in some embodiments X=30 nm to 100 nm) as shown in FIG. 3B. Next, the photoresist 35 is trimmed by Y (e.g., Y is less than X/4, in some embodiment Y is more than X/10 and less than X/6) from both sides so as to form a trimmed patterned photoresist 35' as shown in FIG. 3C. A spacer oxide layer 36 is then deposited at a thickness of, e.g., 2Y on the trimmed photoresist 35' as shown in FIG. 3D. The spacer oxide layer 36 is etched in a vertical direction by a thickness of 2Y so as to leave only a portion of the spacer oxide layer on sidewalls of the trimmed photoresist 35', and further an exposed portion of the hard mask is etched and the trimmed photoresist is stripped, followed by cleaning of surfaces. As a result, an opening having a size of X−2Y and an etched spacer 37 having a width of 2Y are formed as shown in FIG. 3E. Next, the low-k layer 32 and the diffusion barrier layer 33 are etched in a vertical direction using the etched spacer 37, thereby forming a trench 38 having an opening of X−2Y with a separation wall having a width of 2Y as shown in FIG. 3F.

Next, a spacer oxide layer 39 is deposited as a sidewall spacer at a thickness of Z (e.g., Z=1 nm to 100 nm, in some embodiment Z=3 nm to 20 nm) as shown in FIG. 3G. In this embodiment, after the spacer oxide layer 39 is deposited, the width of the separation wall is calculated at 2Y+2Z. The spacer oxide layer is deposited preferably by PEALD substantially in the same manner as the spacer oxide layer 20 in FIG. 1K.

The spacer oxide layer is then etched in a vertical direction so as to form a sidewall spacer 39 as shown in FIG. 3H. Next, as a protective layer, a liner layer (e.g., SiCN) 40 is deposited at a thickness of, e.g., X/4−Y−Z (e.g., 1 nm to 100 nm, in some embodiments 3 nm to 20 nm) as shown in FIG. 3I. The SiCN liner can be deposited by any suitable methods, preferably PEALD disclosed in U.S. Provisional Application No. 61/251,526 and No. 61/225,800, each of which is owned by the same assignee as in the present application, and each of the disclosure of the applications is herein incorporated by reference in its entirety. In particular, the process conditions disclosed in Example 1 of each of U.S. Provisional Application No. 61/251,526 and No. 61/225,800 are preferable.

The liner 40 is then etched in a vertical direction so as to form a sidewall liner layer 40 as shown in FIG. 3J. Next, copper barrier/seed deposition is conducted (not shown), and then the trench is filled with copper 41 by, e.g., electroplating as shown in FIG. 3K. The copper layer 41 is subjected to chemical physical polishing (CMP) and the hard mask is removed to expose the low-k layer 32 as shown in FIG. 3L. The sidewall spacer 39 is then selectively removed (leaving the sidewall liner layer), thereby forming airgaps 42 as shown in FIG. 3M. The airgap structure is then encapsulated by deposition of, e.g., SiCN layer 43. In this embodiment, the thickness of the airgaps is 2Z (each airgap has a thickness of Z). The dielectric constant of the airgap is assumed to be one (K=1). The thickness of the sidewall liner layer is X/4−Y−Z. The dielectric constant of the sidewall liner layer is K(SiCN). The thickness of the separation wall is 2Y. The effective dielectric constant of the separation wall (Keff) can be calculated based on the proportions of the low-k layer and the diffusion barrier layer. The effective dielectric constant of the airgap structure (between the copper filled in the trench and copper filled in an immediately adjacent trench) (Keff (airgap)) can be calculated by the following equation:

$$\text{Keff (airgap)} = [2Z + (K(\text{SiCN}))*(X/2 - 2Y - 2Z) + (\text{Keff}*2Y)]/X/2 = 4Z/X + \text{Keff}*4Y/X + K(\text{SiCN})(1 - 4Y/X - 4Z/X)$$

Figure 4:
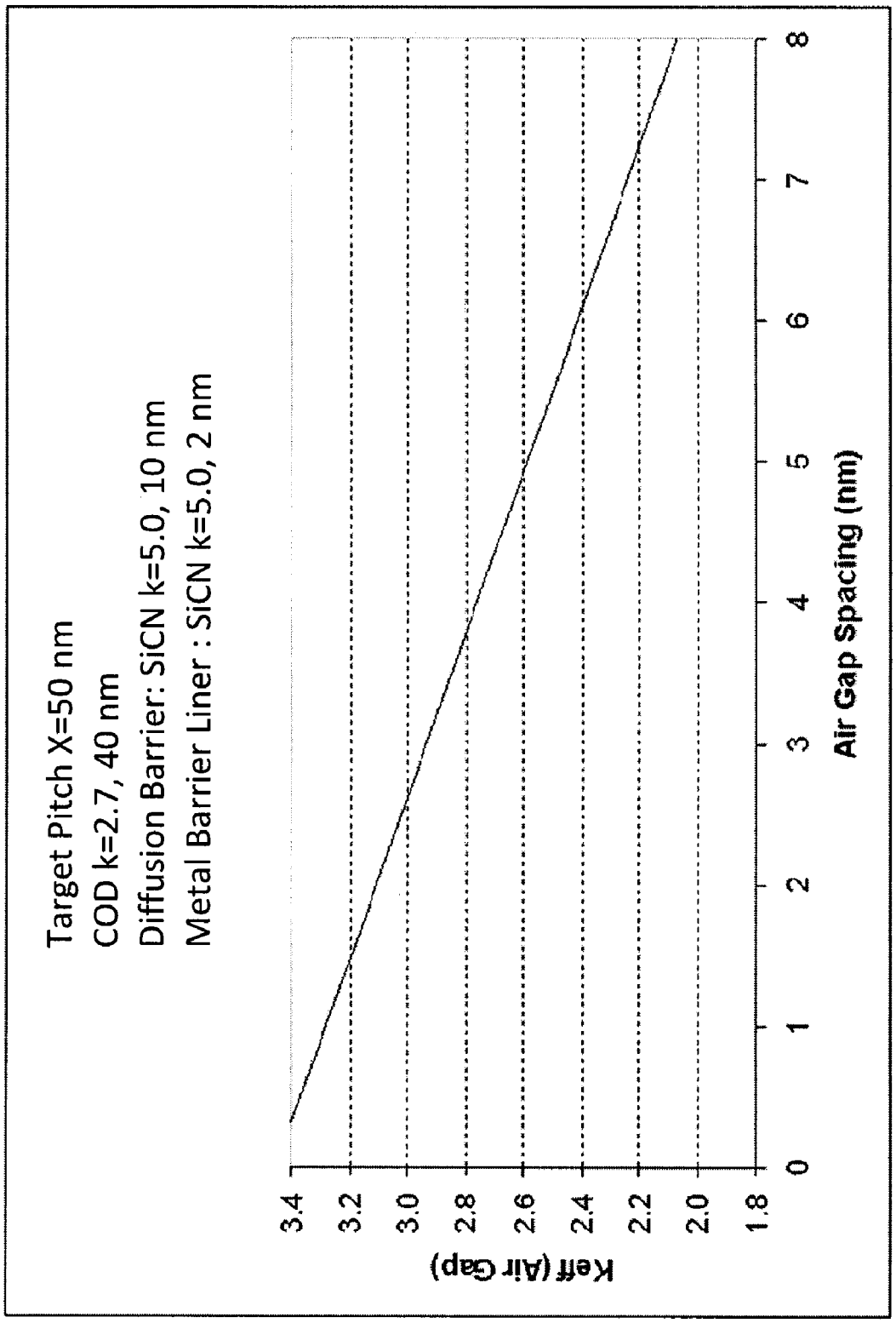
FIG. 4 is a graph showing the relationship between Keff and airgap spacing for the interconnect structures shown in FIGS. 3A to 3N according to an embodiment of the present invention.

In the above, when the thickness of the low-k layer (e.g., K=2.7 for CDO) is 40 nm, and the thickness of the diffusion barrier layer (e.g., K=5.0 for SiCN) is 10 nm, Keff can be calculated at 3.32. The thickness of the sidewall liner layer is 2 nm, and K(SiCN) is 5.0. When the target pitch X is 50 nm, Keff (airgap) can be adjusted as shown in FIG. 4 by adjusting the thickness of the airgap (airgap spacing). By selecting the airgap spacing from about 1 nm to about 8 nm, Keff (airgap) can proportionally be adjusted from about 3.3 to about 2.1. In the above, a K value of dense CDO may vary in a range of 2.65-2.75, and a K value of SiCN diffusion barrier may vary in a range of 5.0-5.5. In the above, preferably, not only the spacer 39 and the liner 40, but also the spacer 36 is deposited by PEALD.

Figure 5A:
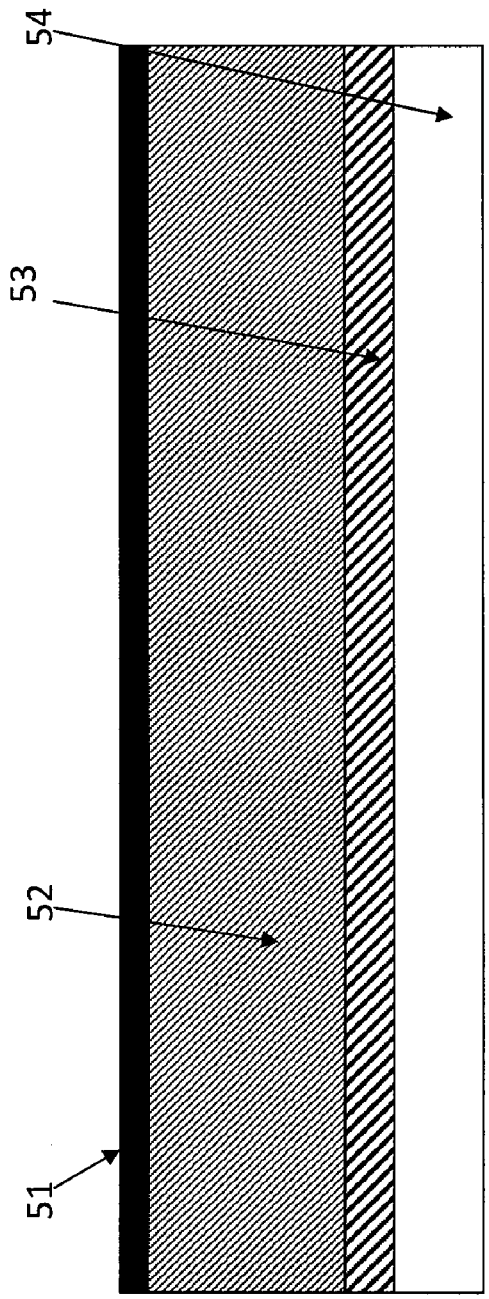
FIGS. 5A to 5T are schematic cross sections of a partially fabricated integrated circuit, showing a single damascene process scheme according to an embodiment of the present invention.
Figure 5B:
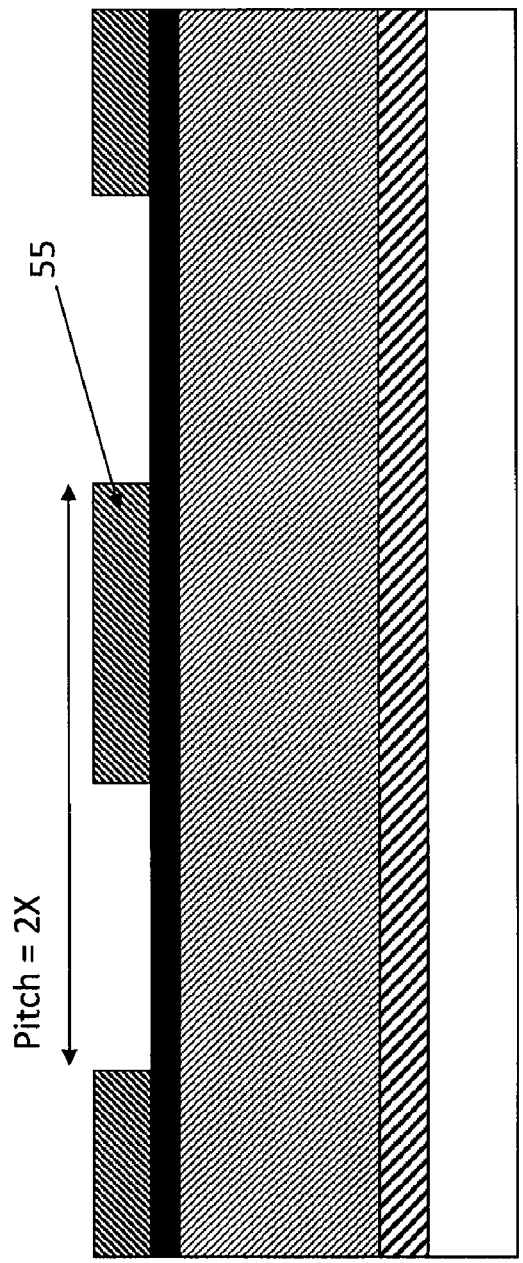
Figure 5G:
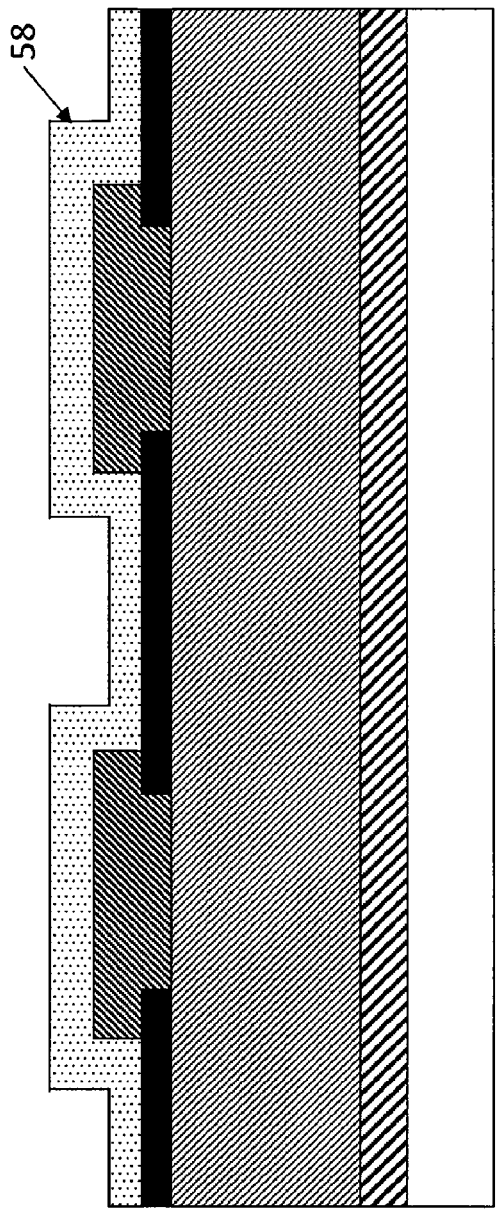
Figure 5H:
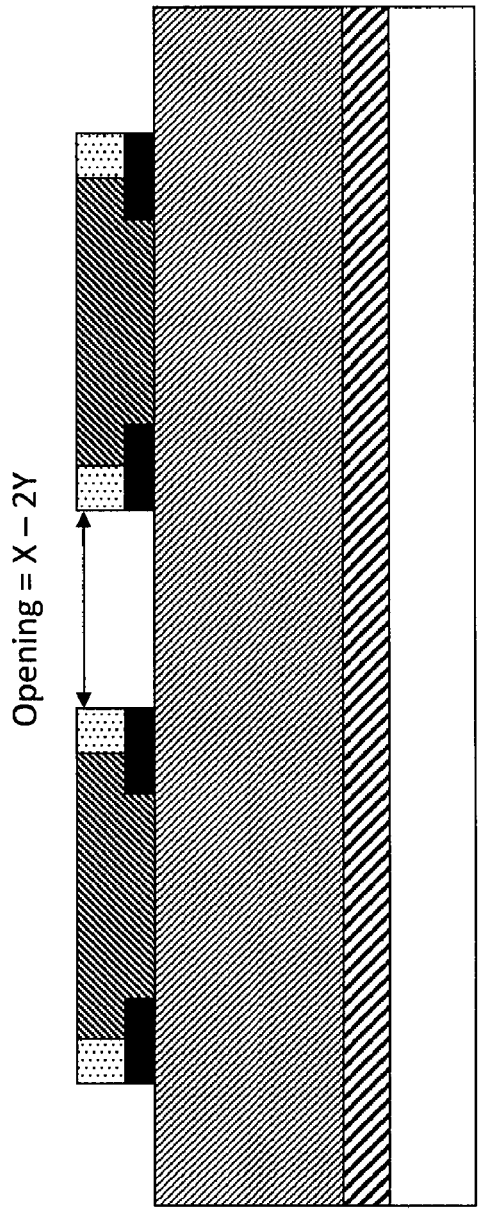
Figures 5O, 5P:
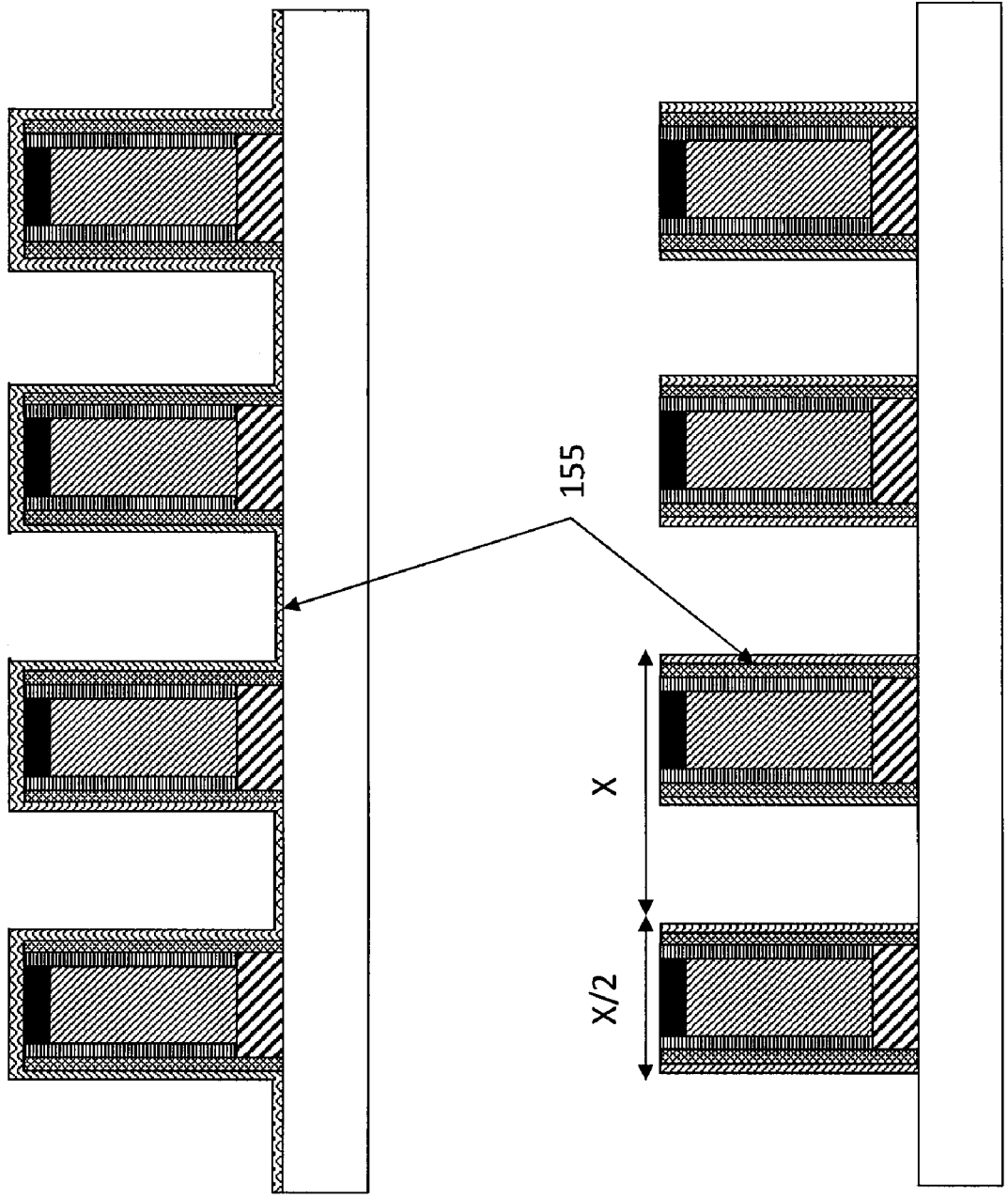
Figure 5Q:
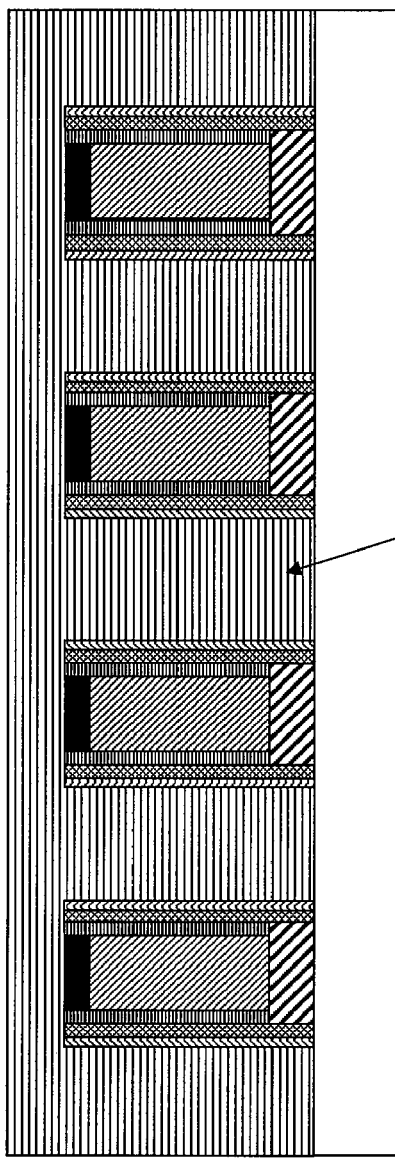
Figure 5R:
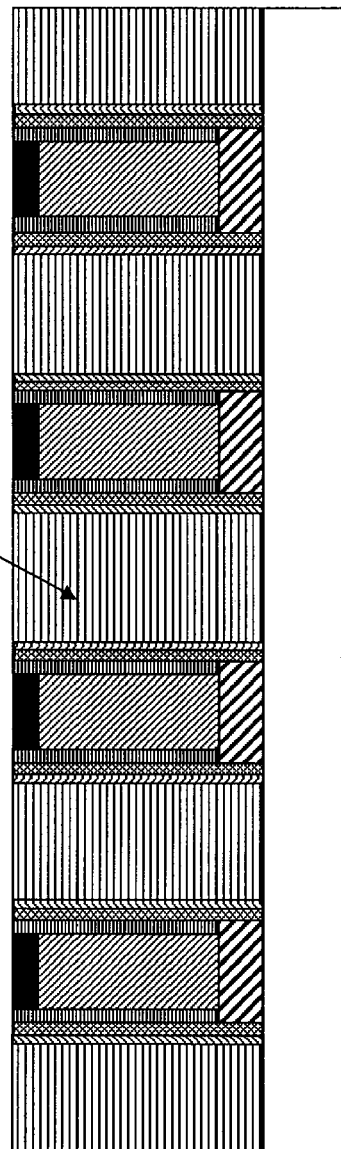

The third process flow is shown in FIGS. 5A to 5R and uses five spacers (e.g., ALD layers) to achieve pitch halving in a double exposure scheme, including a pore sealing layer for the bulk dielectric layer (low-k layer), and an airgap layer having controlled airgap spacing as well as a protective liner layer for barrier metal film.

As shown in FIG. 5A, as a bulk dielectric, a diffusion barrier layer 53 (e.g., SiCN), a porous ultra low-k layer 52 (e.g., porous carbon doped oxide (CDO)), and a hard mask 51 (e.g., TiN) are formed on a substrate 54 (e.g., silicon). On top of the hard mask, a photoresist 55 is formed and subjected to patterning ($1^{st}$ exposure) at a pitch of 2X (e.g., X=10 nm to 1000 nm, in some embodiments X=30 nm to 100 nm) as shown in FIG. 5B. Next, a spacer 56 is deposited at a thickness of Y (e.g., Y is less than X/4, in some embodiments more than X/10 and less than X/6) on the photoresist as shown in FIG. 5C. The spacer 56 and the hard mask 51 are then etched in a vertical direction so as to have an opening having a size of X−2Y as shown in FIG. 5D. The spacer 56 is then removed and the photoresist 55 is stripped, followed by cleaning of surfaces, thereby forming a patterned hard mask 51' as shown in FIG. 5E. Next, a photoresist 57 is formed and subjected to patterning ($2^{nd}$ exposure) at a pitch of 2X connecting a piece of the patterned hard mask 51' and an immediately adjacent piece of the patterned hard mask 51' as shown in FIG. 5F. Next, a spacer 58 is formed at a thickness of Y as shown in FIG. 5G. The spacer 58 and the hard mask 51' are then etched in a vertical direction so as to have an opening having a size of X−2Y as shown in FIG. 5H. The spacer 58 is then removed and the photoresist 57 is stripped, followed by cleaning of surfaces, thereby forming a patterned hard mask 51" at a pitch of X as shown in FIG. 5I. Next, the ultra low-k layer 52 and the diffusion barrier layer 53 are etched in a vertical direction using the patterned hard mask 51", thereby forming a trench 152 having an opening of X−2Y with a separation wall having a width of 2Y as shown in FIG. 5J.

After the etching for interlayer dielectric (ILD) wiring patterns of the low-k layer, a pore-sealing layer 153 is deposited at a thickness of W (e.g., W=1 nm to 10 nm, in some embodiments W=2 nm to 6 nm) to seal pores of sidewalls of the ultra low-k layer as shown in FIG. 5K. The pore sealing layer is a thin film formed of e.g., SiCO, SiCN, or carbon film and covering sidewalls of the low-k layer to protect the sidewalls from plasma generated in subsequent processes such as ashing and/or cleaning.

The pore-sealing layer 153 is then etched in a vertical direction, and further the diffusion barrier layer is etched in a vertical direction as shown in FIG. 5L. The width of the trench is expressed as X−2(Y+W), and the width of the separation wall is expressed as 2(Y+W). Next, a spacer oxide layer 154 is deposited as a sidewall spacer as shown in FIG. 5M. In this embodiment, after the spacer oxide layer 154 is deposited, the width of the separation wall is expressed as 2(Y+W+Z). The spacer oxide layer is deposited preferably by PEALD substantially in the same manner as the spacer oxide layer 20 in FIG. 1K.

The spacer oxide layer is then etched in a vertical direction so as to form a sidewall spacer 154 as shown in FIG. 5N. Next, as a protective layer, a liner layer (e.g., SiCN) 155 is deposited at a thickness of, e.g., X/4−(Y+W+Z) (e.g., 1 nm to 100 nm, in some embodiments 3 nm to 20 nm) as shown in FIG. 5O. The liner 155 is then etched in a vertical direction so as to form a sidewall liner layer 155 as shown in FIG. 5P. Next, copper barrier/seed deposition is conducted (not shown), and then the trench is filled with copper 156 by, e.g., electroplating as shown in FIG. 5Q. The copper layer 156 is subjected to chemical physical polishing (CMP) which is stopped on the hard mask as shown in FIG. 5R. The hard mask and the sidewall spacer 154 are then selectively removed (leaving the pore-sealing layer and the sidewall liner layer), thereby forming airgaps 157 as shown in FIG. 5S. The airgap structure is then encapsulated by deposition of, e.g., SiCN layer 158 as shown in FIG. 5T. In this embodiment, the thickness of the airgaps is 2Z (each airgap has a thickness of Z). The dielectric constant of the airgap is assumed to be one (K=1). The thickness of the sidewall liner layer is X/4−Y−W−Z. The dielectric constant of the sidewall liner layer is K(SiCN). The thickness of the separation wall is 2Y. The effective dielectric constant of the separation wall (Keff) can be calculated based on the proportions of the low-k layer and the diffusion barrier layer. The thickness of the pore-sealing layer is W, and the dielectric constant thereof is Kps1. The effective dielectric constant of the airgap structure (between the copper filled in the trench and copper filled in an immediately adjacent trench) (Keff (airgap)) can be calculated by the following equation:

$$\text{Keff (airgap)} = [(K(\text{SiCN}))*(X/2 - 2Y - 2W - 2Z) + 2Z + (\text{Kps1})*W + (\text{Keff}*2Y)]/X/2 = 4Z/X + \text{Keff}*4Y/X + \text{Kps1}*4W/X + K(\text{SiCN})(1 - 4Y/X - 4W/X - 4Z/X)$$

Figure 6:
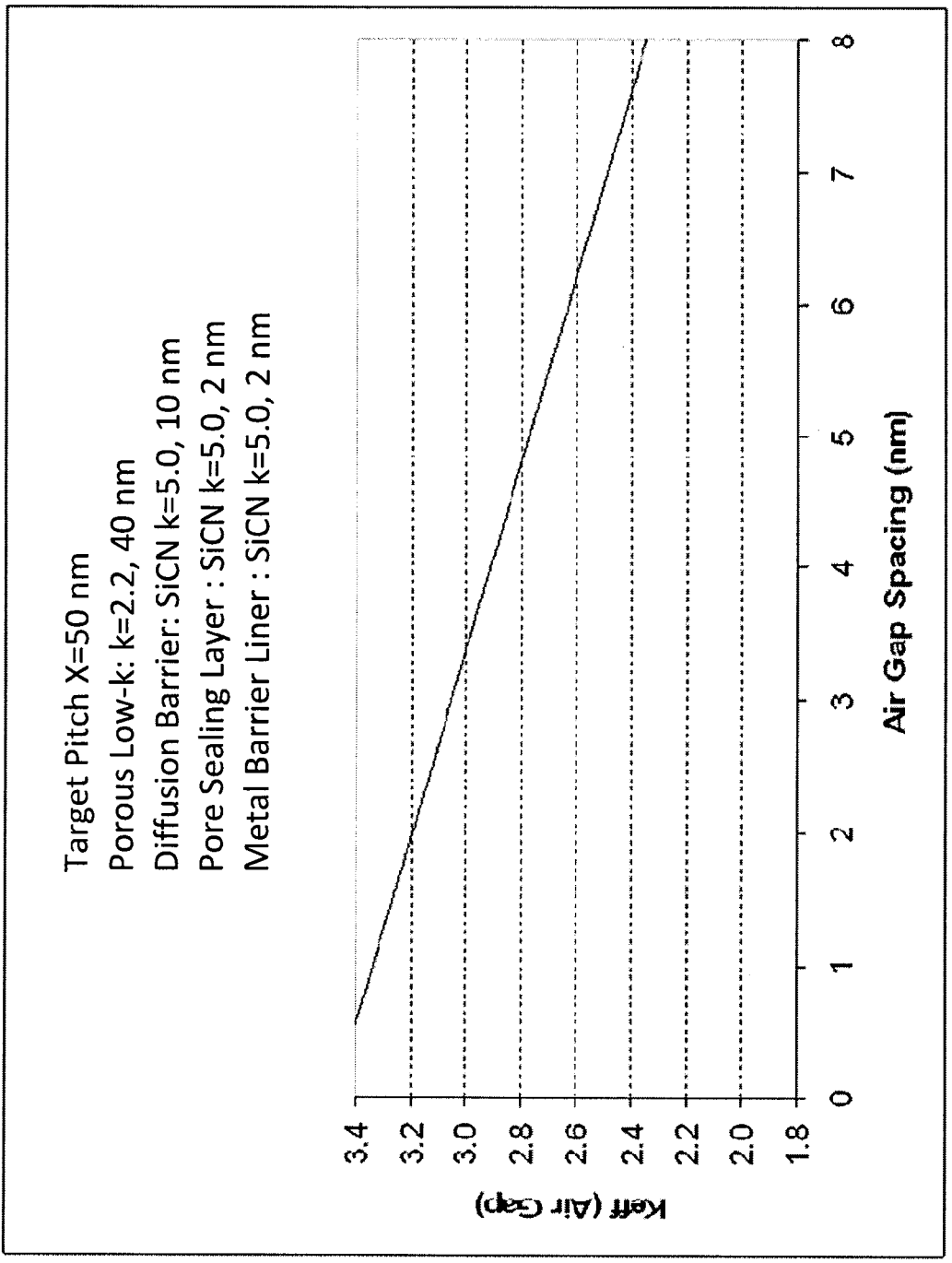
FIG. 6 is a graph showing the relationship between Keff and airgap spacing for the interconnect structures shown in FIGS. 5A to 5R according to an embodiment of the present invention.

In the above, when the thickness of the ultra low-k layer (e.g., K=2.2 for porous CDO) is 40 nm, and the thickness of the diffusion barrier layer (e.g., K=5.0 for SiCN) is 2 nm, Keff can be calculated at 2.76. The thickness of the sidewall liner layer is 2 nm, and K(SiCN) is 5.0. The thickness of the pore-sealing layer is 2 nm, and Kps1 is 5.0. When the target pitch X is 50 nm, Keff (airgap) can be adjusted as shown in FIG. 6 by adjusting the thickness of the airgap (airgap spacing). By selecting the airgap spacing from about 1 nm to about 8 nm, Keff (airgap) can proportionally be adjusted from about 3.3 to about 2.4. In the above, a K value of porous CDO may vary in a range of 2.2-2.3, and a K value of SiCN diffusion barrier may vary in a range of 5.0-5.5. In the above, preferably, not only the spacer 54 and the liner 55, but also the spacers 56, 57 are deposited by PEALD. The pore-sealing layer can be deposited by PEALD, but can be deposited also by UV polymerization such as those disclosed in U.S. Provisional Application No. 61/290,631, which is owned by the same assignee as in the present application and the disclosure of which is herein incorporated by reference in its entirety.

The next three process flows relate to dual damascene schemes. These process flows basically use the same principle as described in relation to the first three process flows of single damascene schemes.

Figure 7C:
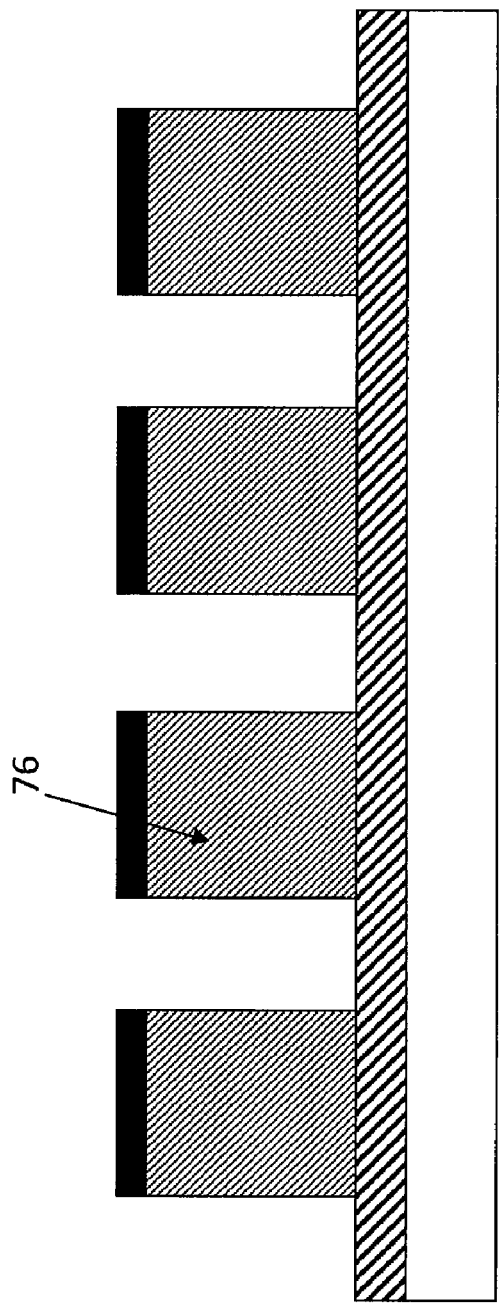
FIGS. 7A to 7P are schematic cross sections of a partially fabricated integrated circuit, showing a dual damascene process scheme according to an embodiment of the present invention.
Figure 7D:
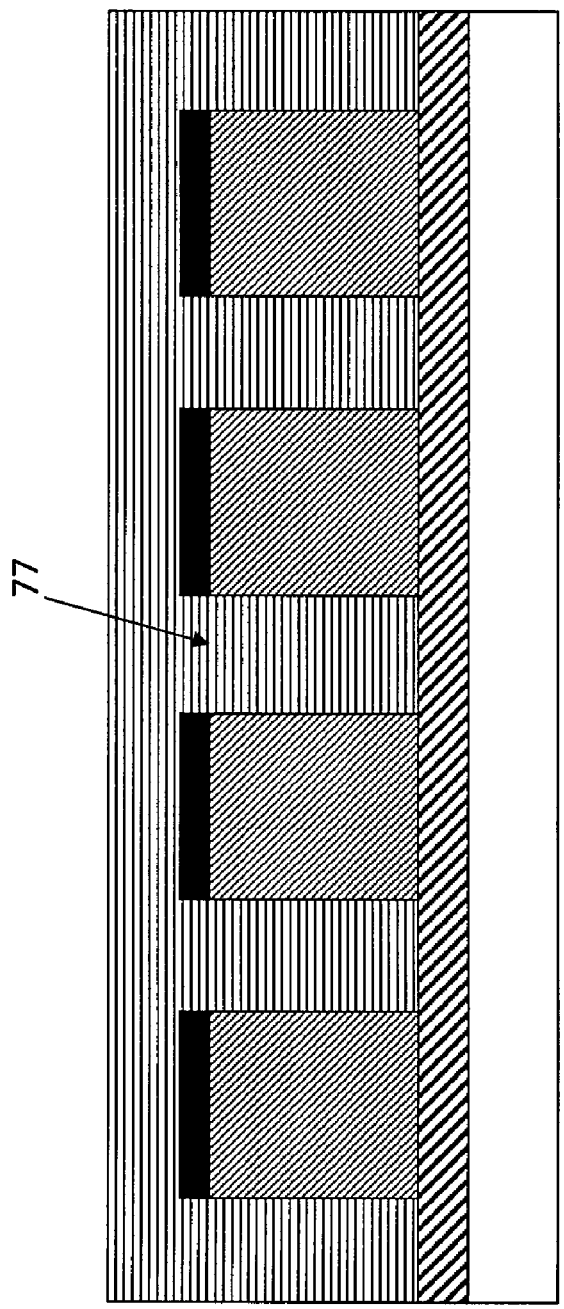
Figure 7G:
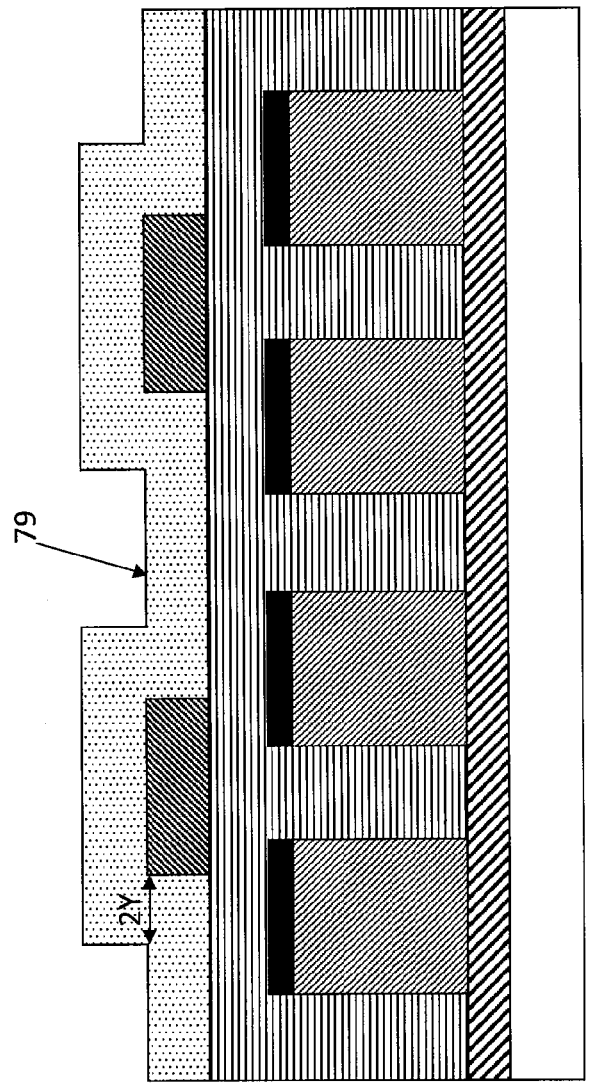
Figure 7H:
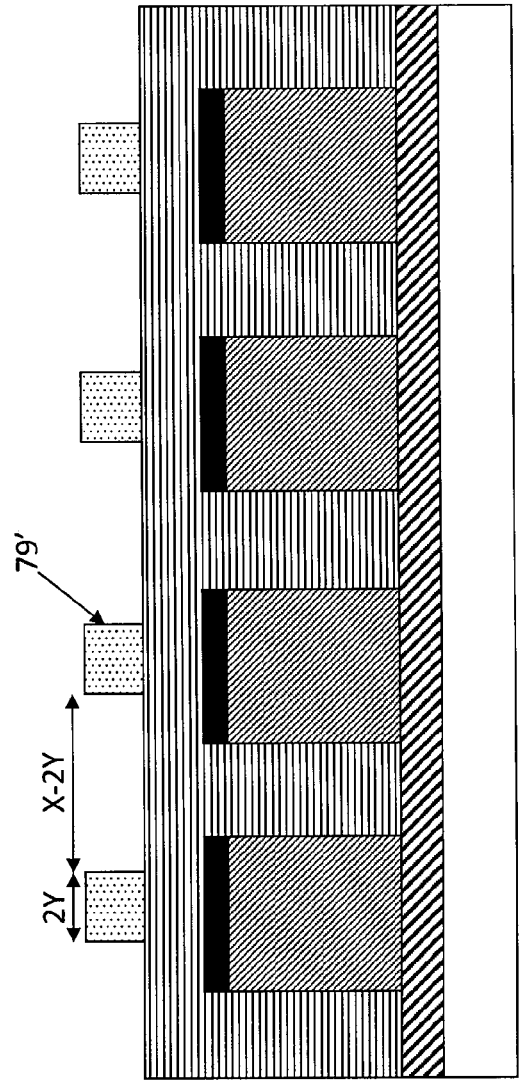
Figure 7I:
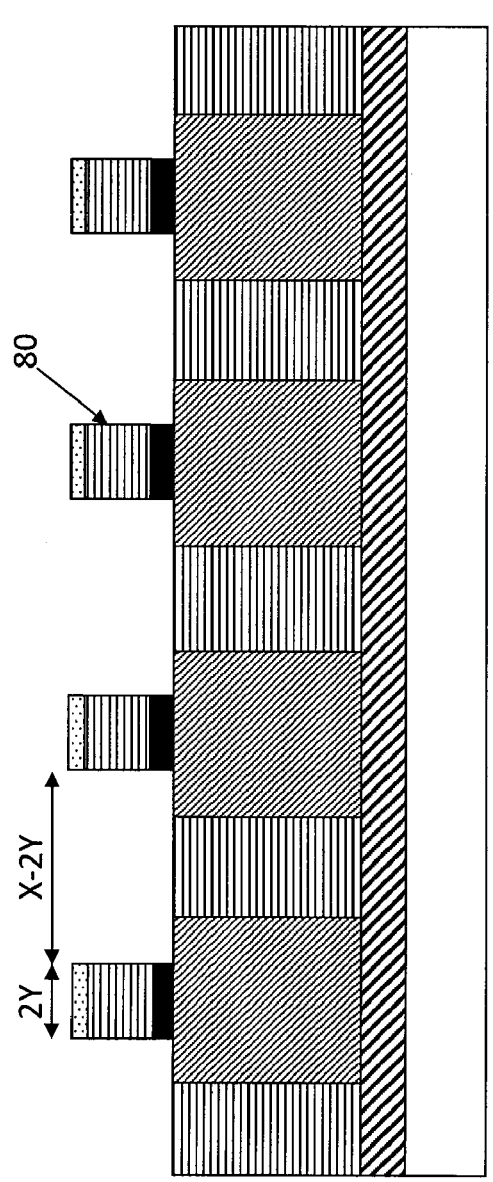
Figure 7J:
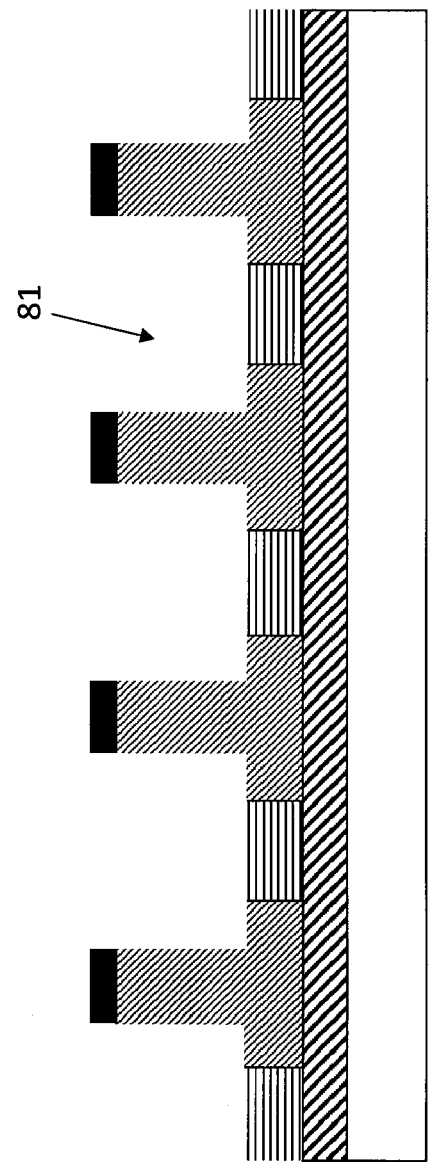
Figure 7K:
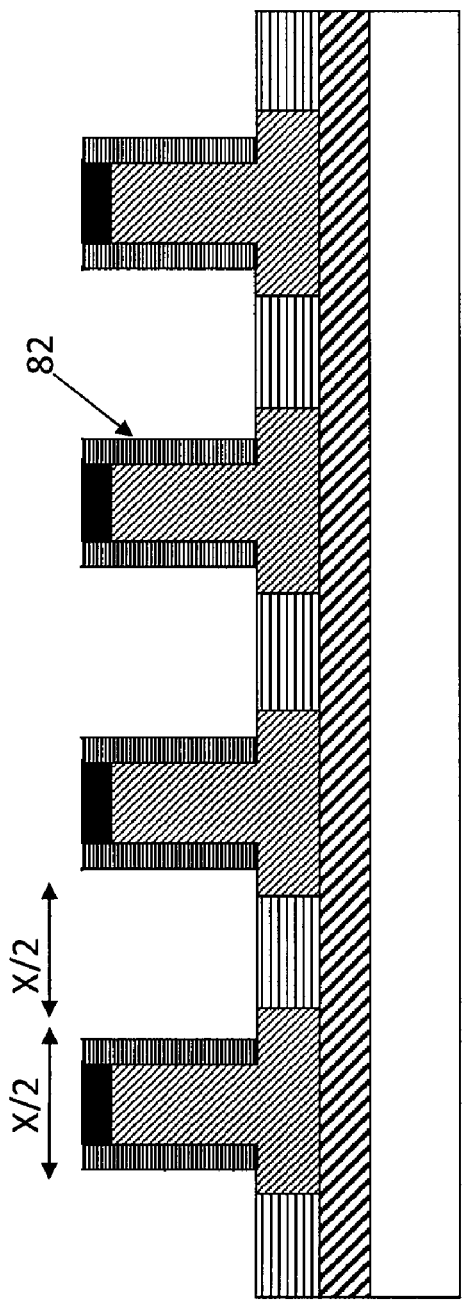
Figure 7L:
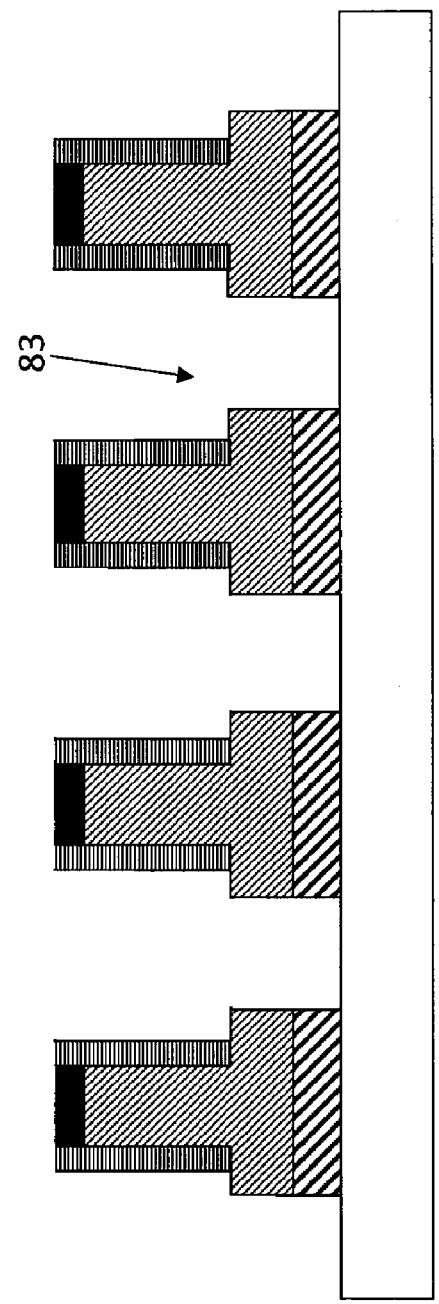
Figure 7M:
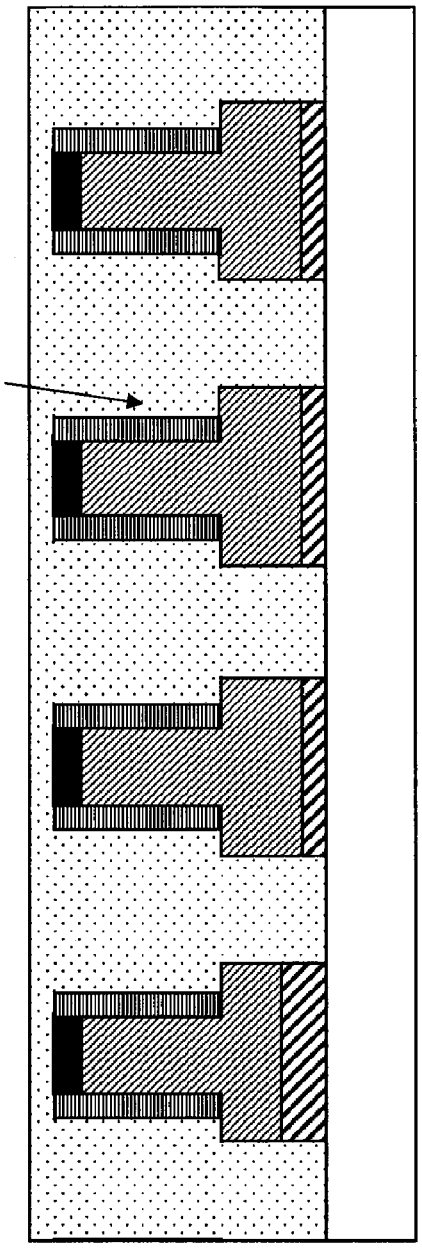
Figure 7N:
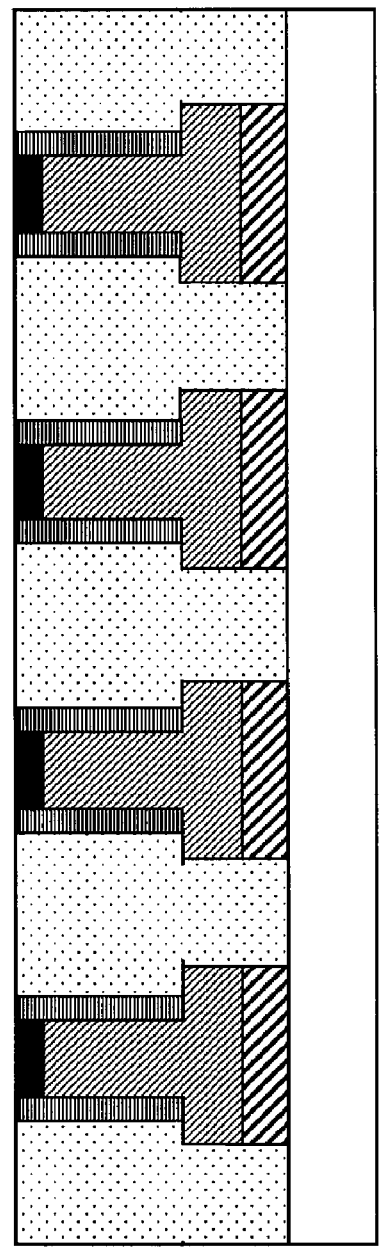
Figure 7O:
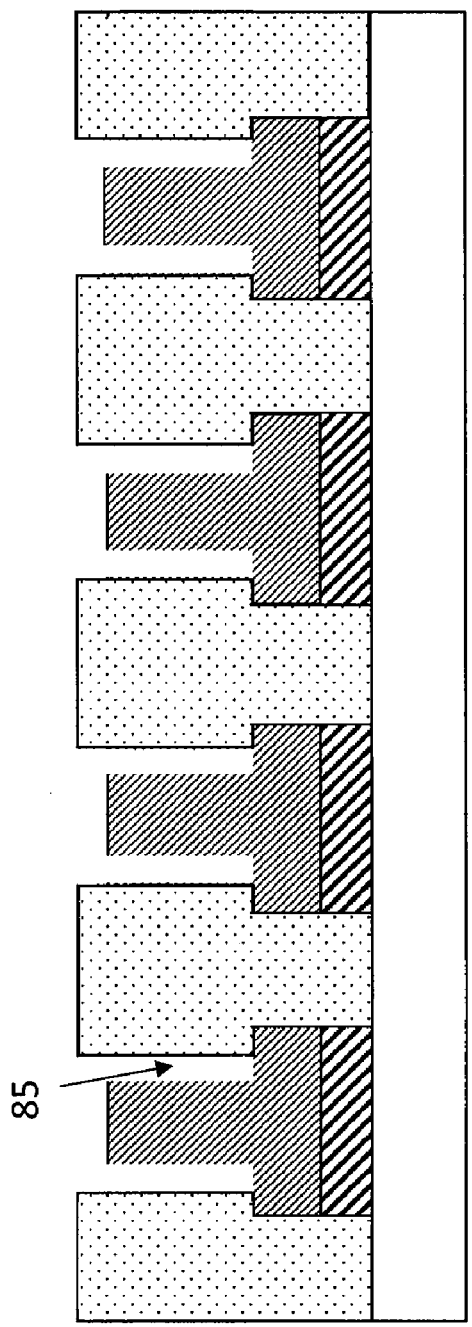
Figure 7P:
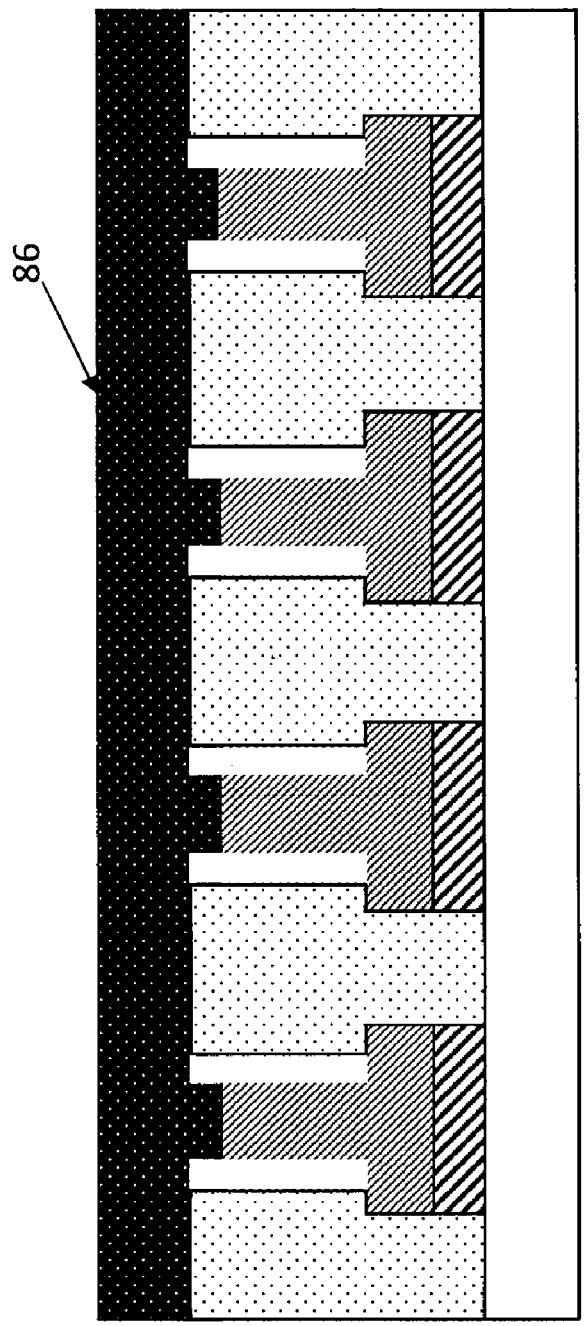

The first process flow is shown in FIGS. 7A to 7P and uses two oxide ALD layers to achieve pitch halving in a double exposure scheme and controlling air gap spacing.

As shown in FIG. 7A, as a bulk dielectric, a diffusion barrier layer 73 (e.g., SiCN), a low-k layer 72 (e.g., carbon doped oxide (CDO) or porous CDO), and a hard mask 71 (e.g., TiN) are formed on a substrate 74 (e.g., silicon). On top of the hard mask, a photoresist 75 is formed and subjected to patterning at a pitch of X (e.g., X=10 nm to 1000 nm, in some embodiments X=30 nm to 100 nm) as shown in FIG. 7B. Using the photoresist, the hard mask and the low-k layer are etched in a vertical direction, and the photoresist is stripped, followed by cleaning of surfaces, thereby forming a via 76 as shown in FIG. 7C. Next, SLAM (simultaneous location and mapping) processing is performed to fill the via 76 with a SLAM material 77 (e.g., a siloxane material) as shown in FIG. 7D. The SLAM processing is typically a process wherein after trench patterning, the trench line is filled with siloxane-based coating film, subjected to planarization, followed by via formation. The process disclosed in, for example, U.S. Pat. No. 6,876,017 can be used, the disclosure of which is herein incorporated by reference in its entirety. In this embodiment, the SLAM processing is applied after the via patterning in FIG. 7C, the via is filled with the SLAM material, followed by planarization.

A photoresist 78 is formed and subjected to patterning wherein a pitch is set at 2X as shown in FIG. 7E. The photoresist 78 is trimmed by Y (e.g., Y=1 nm to 100 nm, in some embodiments Y=3 nm to 20 nm) from both sides so as to form a trimmed patterned photoresist 78' as shown in FIG. 7F. A spacer oxide layer 79 is then deposited at a thickness of, e.g., 2Y on the trimmed photoresist 78' as shown in FIG. 7G. The spacer oxide layer 79 is etched in a vertical direction by a thickness of 2Y so as to leave only a portion of the spacer oxide layer on sidewalls of the trimmed photoresist 79', and the trimmed photoresist is stripped, followed by cleaning of surfaces. As a result, an opening having a size of X−2Y and an etched spacer 79' having a width of 2Y are formed as shown in FIG. 7H. Next, the SLAM material and the hard mask are etched in a vertical direction using the etched spacer 79', leaving a pattern 80 as shown in FIG. 7I. The width of the pattern 80 is 2Y, and the distance between immediately adjacent patterns 80 is X−2Y. Using the pattern 80, the SLAM material and the low-k layer are etched in a vertical direction to form a trench 81 having an opening of X−2Y with a separation wall having a width of 2Y as shown in FIG. 7J.

Next, a spacer oxide layer 82 is deposited as a sidewall spacer at a thickness of X/4−Y (e.g., 1 nm to 100 nm, in some embodiments 3 nm to 20 nm), followed by spacer etching in a vertical direction as shown in FIG. 7K. In this embodiment, after the spacer oxide layer 82 is deposited, the width of the separation wall is calculated at 2X. The spacer oxide layer is deposited preferably by PEALD substantially in the same manner as the spacer oxide layer 20 in FIG. 1K.

The SLAM material and the diffusion barrier layer are then etched to form a via 83 as shown in FIG. 7L. Next, copper barrier/seed deposition is conducted (not shown), and then the via and the trench are filled with copper 84 by, e.g., electroplating as shown in FIG. 7M. The copper layer 84 is subjected to chemical physical polishing (CMP) which is stopped on the hard mask as shown in FIG. 7N. The hard mask and the sidewall spacer 82 are then selectively removed, thereby forming airgaps 85 as shown in FIG. 7O. The airgap structure is then encapsulated by deposition of, e.g., SiCN layer 86 as shown in FIG. 7P. In this embodiment, Keff (airgap) can be calculated in a manner similar to those described earlier. However, typically, Keff (airgap) for dual damascene structures is reflected by inter-level capacitance contribution and will be higher than Keff (airgap) for single damascene structures as there is no air gap in the inter-level or via-level dielectric layer in the dual damascene structures.

Figure 8:
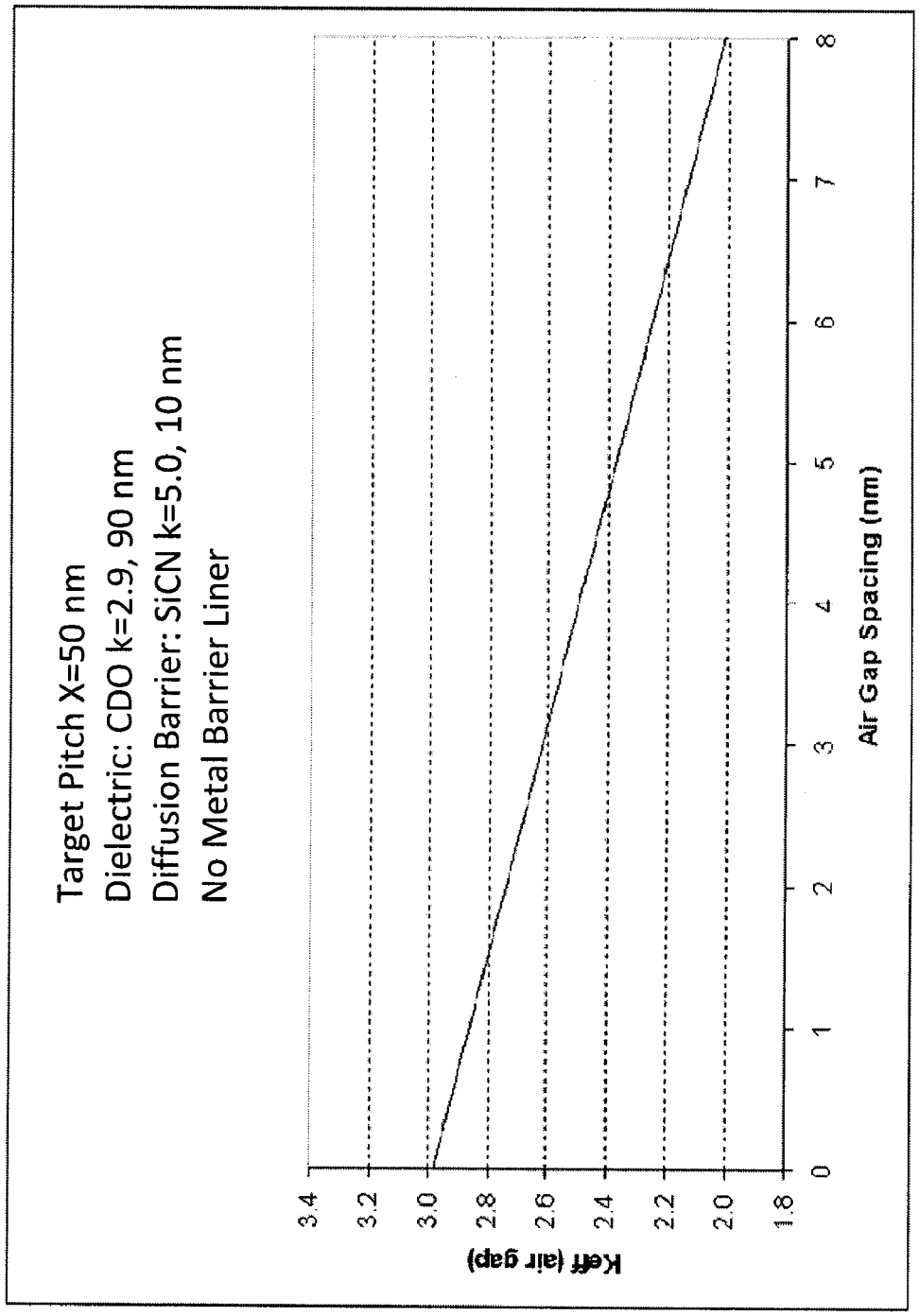
FIG. 8 is a graph showing the relationship between Keff and airgap spacing for the interconnect structures shown in FIGS. 7A to 7P according to an embodiment of the present invention.

When the thickness of the low-k layer (e.g., K=2.9 for dense CDO) is 90 nm, and the thickness of the diffusion barrier layer (e.g., K=5.0 for SiCN) is 10 nm (Keff is about 3.1). When the target pitch X is 50 nm, Keff (airgap) can be adjusted as shown in FIG. 8 by adjusting the thickness of the airgap (airgap spacing). By selecting the airgap spacing from about 1.0 nm to about 8 nm, Keff (airgap) can proportionally be adjusted from about 2.9 to about 2.0. In the above, a K value of dense CDO may vary in a range of 2.8-2.9, and a K value of SiCN diffusion barrier may vary in a range of 5.0-5.5. In the above, preferably, not only the spacer 82, but also the spacer 79 is deposited by PEALD.

Figure 9A:
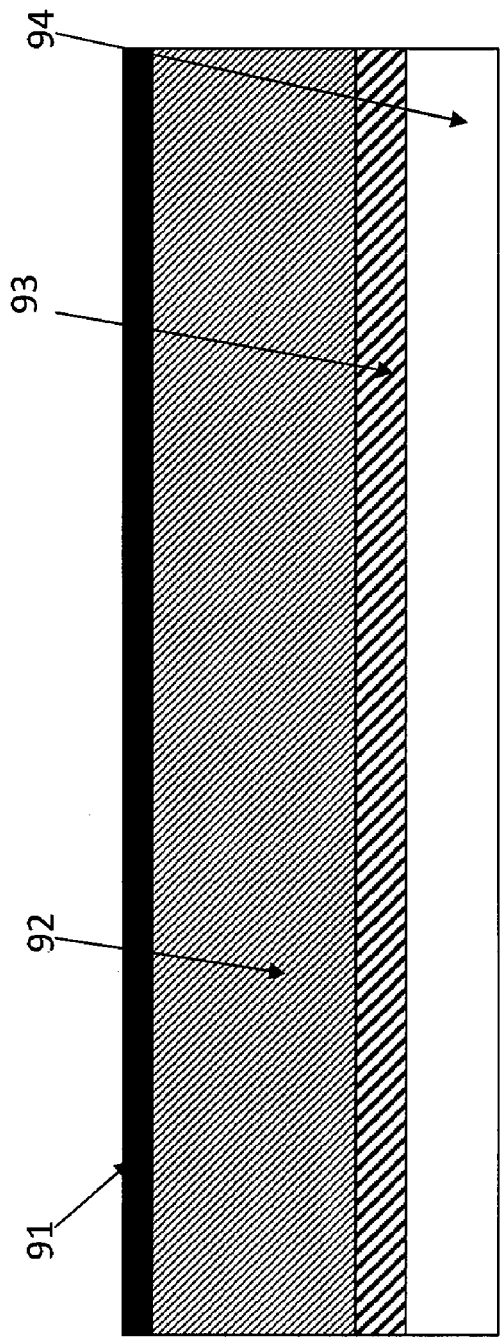
FIGS. 9A to 9Q are schematic cross sections of a partially fabricated integrated circuit, showing a dual damascene process scheme according to an embodiment of the present invention.

The second process flow is shown in FIGS. 9A to 9P and uses three ALD layers to achieve pitch halving and controlling air gap spacing. One of the three ALD layers is a protective liner for barrier metal film. The pitch halving scheme described here is based on a single exposure scheme.

Figure 9B:
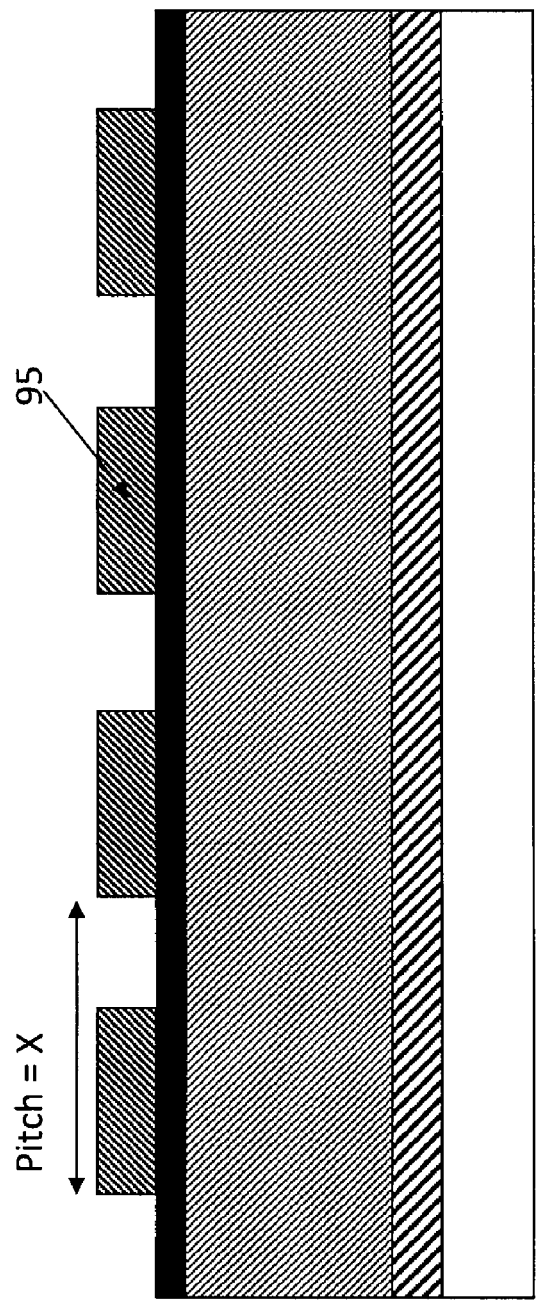
Figure 9C:
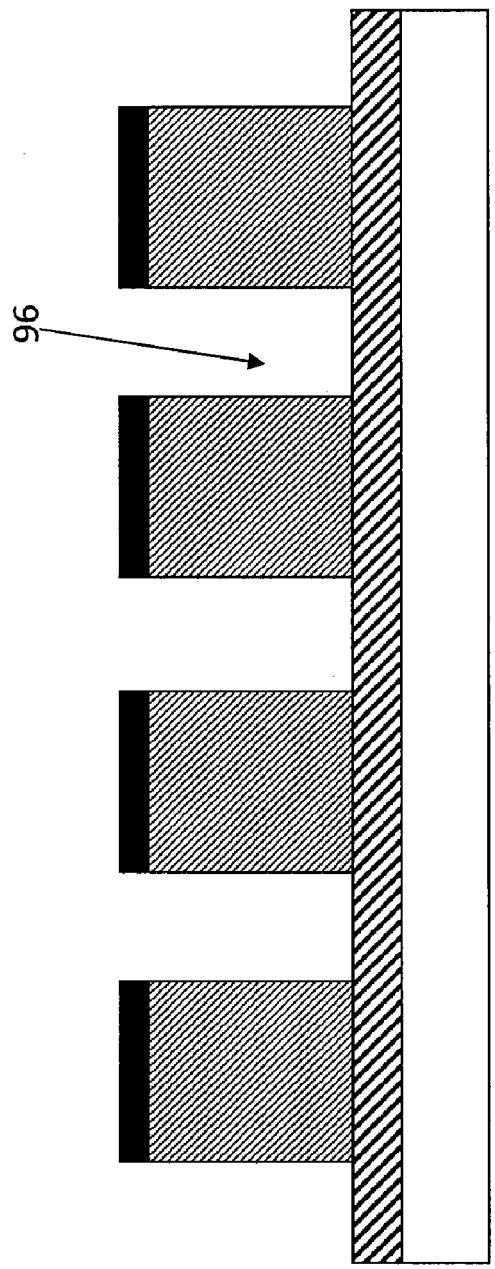
Figure 9D:
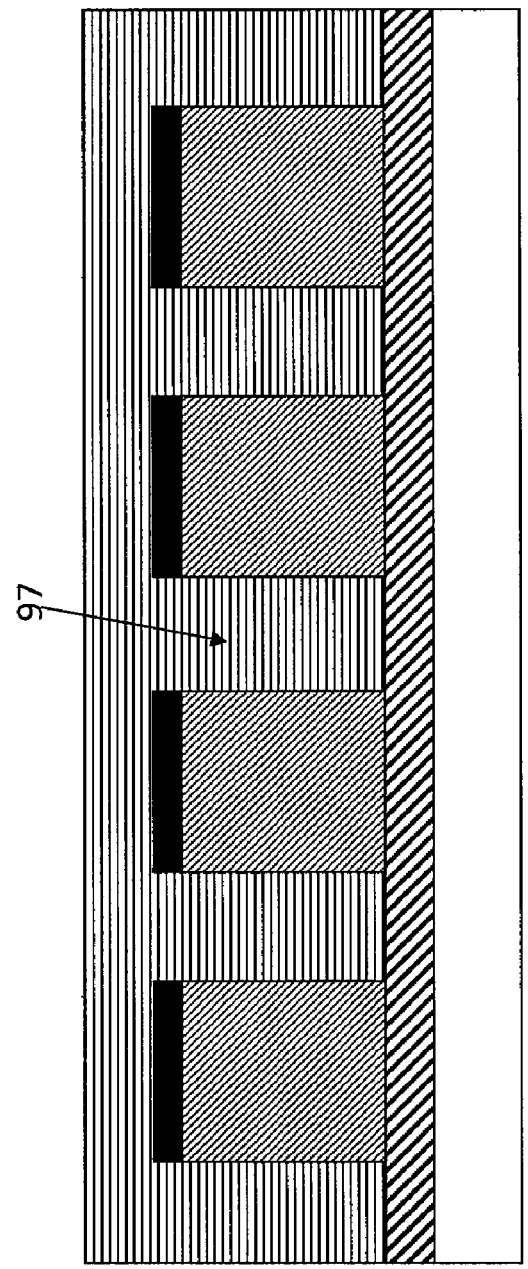
Figure 9E:
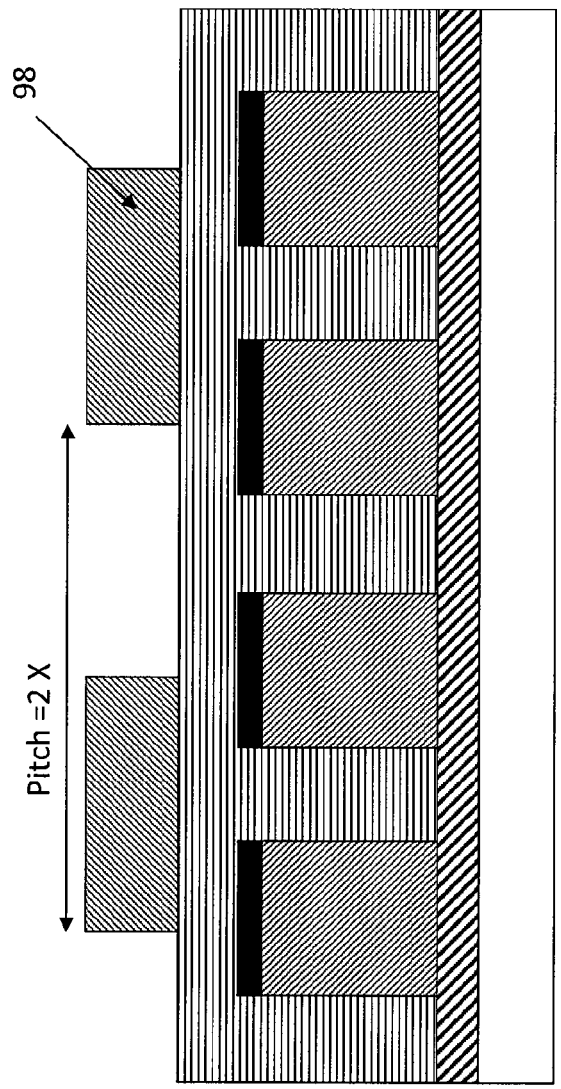
Figure 9F:
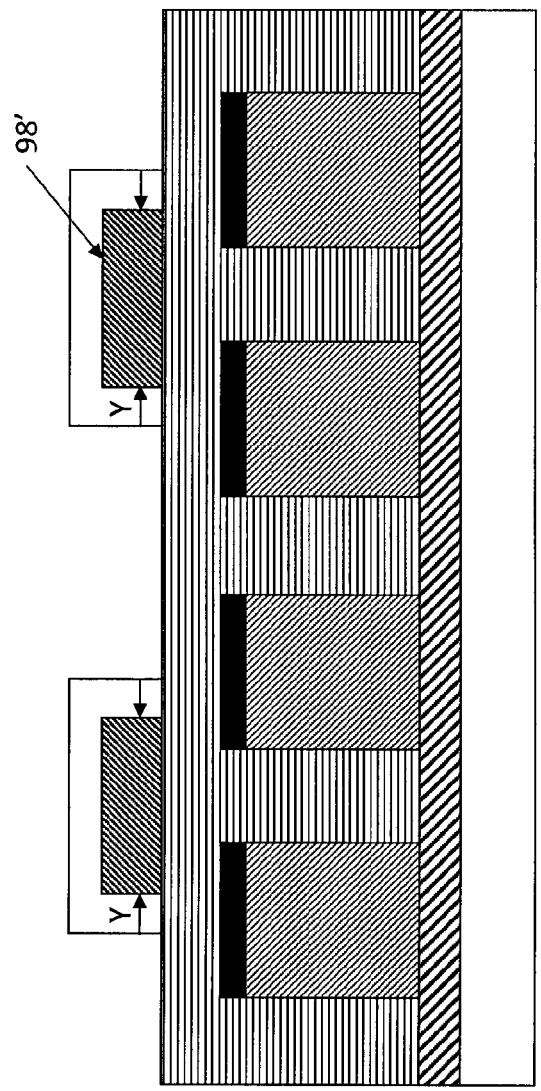
Figure 9I:
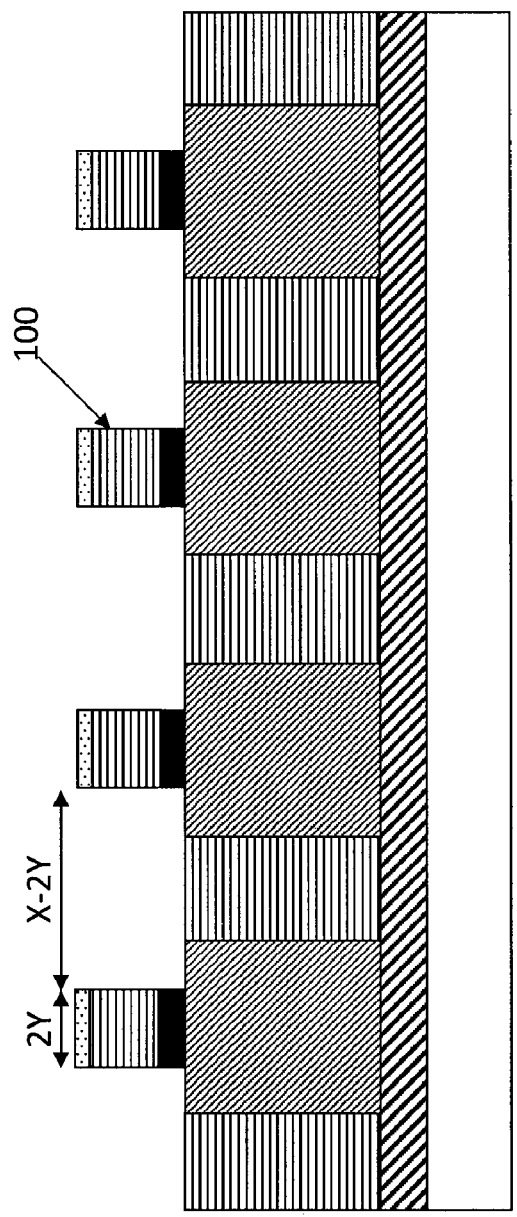
Figure 9J:
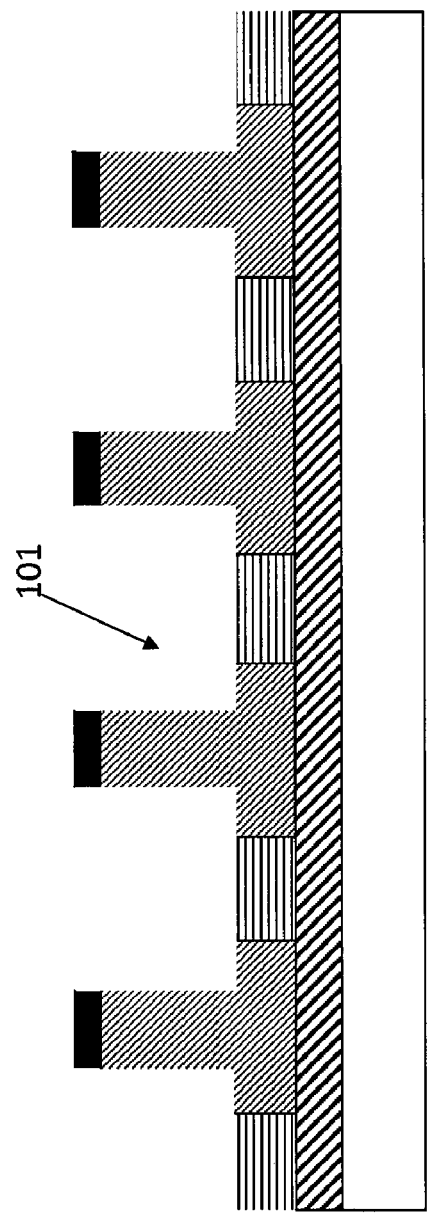

As shown in FIG. 9A, as a bulk dielectric, a diffusion barrier layer 93 (e.g., SiCN), a low-k layer 92 (e.g., carbon doped oxide (CDO) or porous CDO), and a hard mask 91 (e.g., TiN) are formed on a substrate 94 (e.g., silicon). On top of the hard mask, a photoresist 95 is formed and subjected to patterning at a pitch of X (e.g., X=10 nm to 1000 nm, in some embodiments X=30 nm to 100 nm) as shown in FIG. 9B. Using the photoresist, the hard mask and the low-k layer are etched in a vertical direction, and the photoresist is stripped, followed by cleaning of surfaces, thereby forming a via 96 as shown in FIG. 9C. Next, SLAM processing is performed to fill the via 96 with a SLAM material 97 as shown in FIG. 9D. A photoresist 98 is formed and subjected to patterning wherein a pitch is set at 2X as shown in FIG. 9E. The photoresist 98 is trimmed by Y (e.g., Y is less than X/4, in some embodiments more than X/10 and less than X/6) from both sides so as to form a trimmed patterned photoresist 98' as shown in FIG. 9F. A spacer oxide layer 99 is then deposited at a thickness of, e.g., 2Y on the trimmed photoresist 98' as shown in FIG. 9G. The spacer oxide layer 99 is etched in a vertical direction by a thickness of 2Y so as to leave only a portion of the spacer oxide layer on sidewalls of the trimmed photoresist 98', and the trimmed photoresist is stripped, followed by cleaning of surfaces. As a result, an opening having a size of X−2Y and an etched spacer 99' having a width of 2Y are formed as shown in FIG. 9H. Next, the SLAM material and the hard mask are etched in a vertical direction using the etched spacer 99', leaving a pattern 100 as shown in FIG. 9I. The width of the pattern 100 is 2Y, and the distance between immediately adjacent patterns 100 is X−2Y. Using the pattern 100, the SLAM material and the low-k layer are etched in a vertical direction to form a trench 101 having an opening of X−2Y with a separation wall having a width of 2Y as shown in FIG. 9J.

Next, a spacer oxide layer 102 is deposited as a sidewall spacer at a thickness of Z (e.g., 1 nm to 100 nm, in some embodiments 3 nm to 20 nm), followed by spacer etching in a vertical direction as shown in FIG. 9K. In this embodiment, after the spacer oxide layer 102 is deposited, the width of the separation wall is calculated at 2Y+Z. The spacer oxide layer is deposited preferably by PEALD substantially in the same manner as the spacer oxide layer 20 in FIG. 1K.

Figure 9Q:
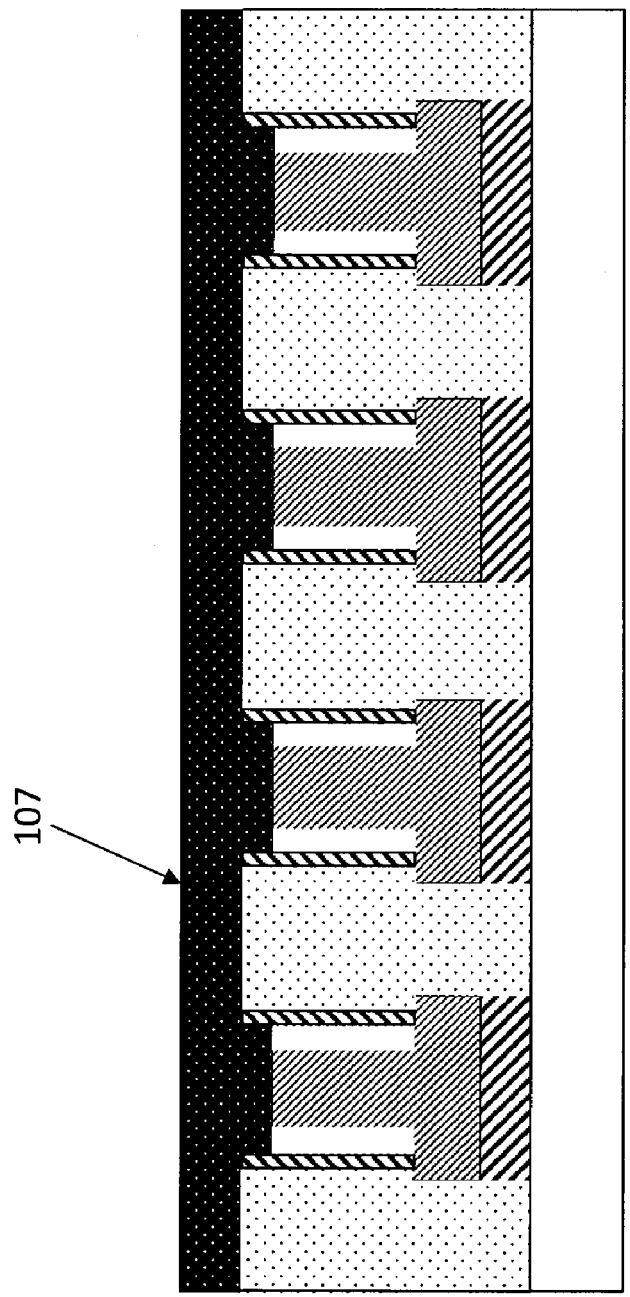

Next, as a protective layer, a liner layer (e.g., SiCN) 103 is deposited at a thickness of, e.g., X/4−Y−Z (e.g., 1 nm to 100 nm, in some embodiments 3 nm to 20 nm). The liner 103 is then etched in a vertical direction so as to form a sidewall liner layer 103 as shown in FIG. 9L. In this embodiment, after the liner layer 103 is deposited, the width of the separation wall is X/2, and the distance between immediately adjacent separation walls is also X/2. The SLAM material and the diffusion barrier layer are then etched to form a via 104 as shown in FIG. 9M. Next, copper barrier/seed deposition is conducted (not shown), and then the via and the trench are filled with copper 105 by, e.g., electroplating as shown in FIG. 9N. The copper layer 105 is subjected to chemical physical polishing (CMP) which is stopped on the hard mask as shown in FIG. 9O. The hard mask and the sidewall spacer 102 are then selectively removed (leaving the sidewall liner layer), thereby forming airgaps 106 as shown in FIG. 9P. The airgap structure is then encapsulated by deposition of, e.g., SiCN layer 107 as shown in FIG. 9Q. In this embodiment, Keff (airgap) can be calculated in a manner similar to those described earlier.

Figure 10:
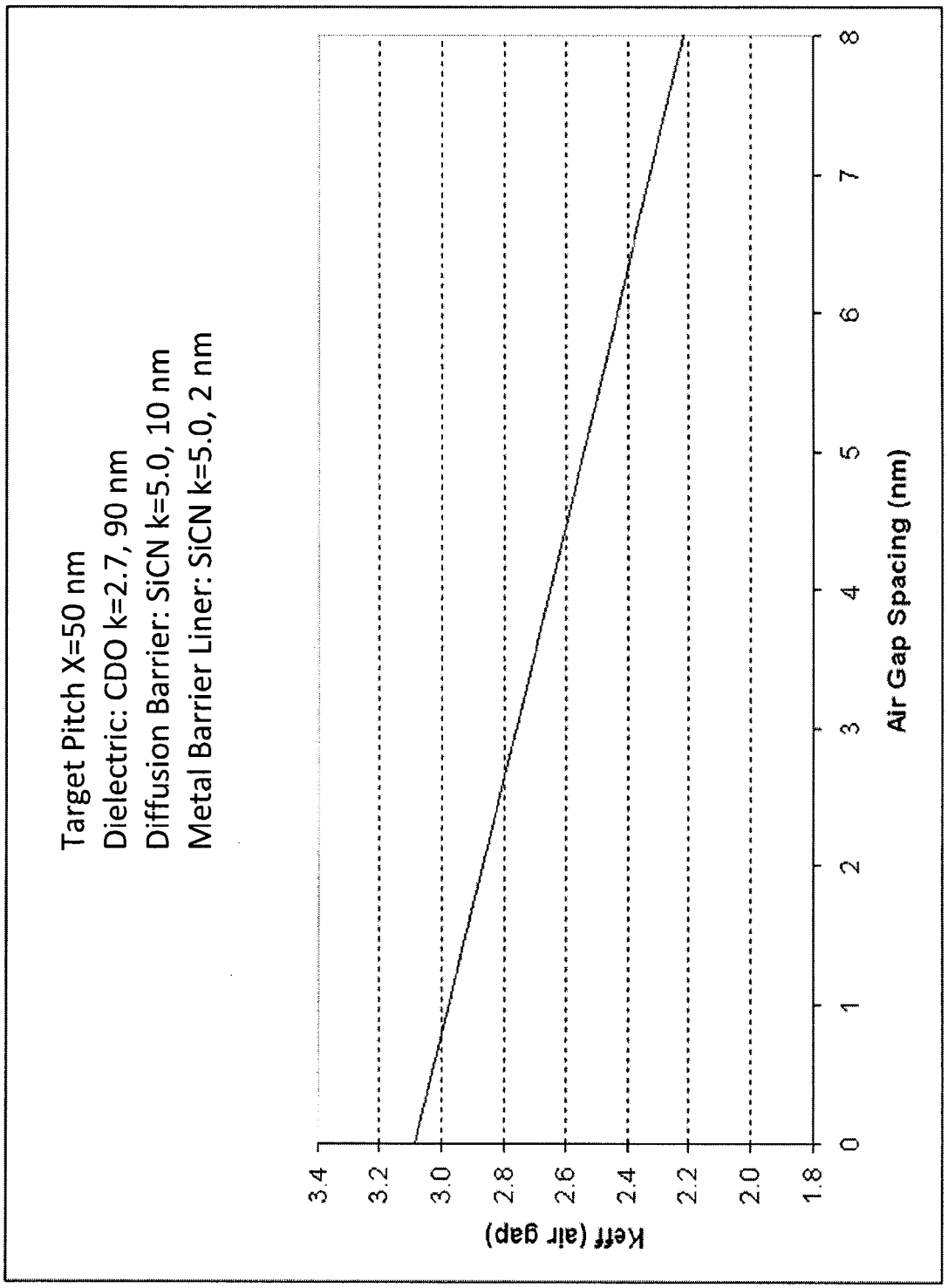
FIG. 10 is a graph showing the relationship between Keff and airgap spacing for the interconnect structures shown in FIGS. 9A to 9Q according to an embodiment of the present invention.

When the thickness of the low-k layer (e.g., K=2.7 for CDO) is 90 nm, and the thickness of the diffusion barrier layer (e.g., K=5.0 for SiCN) is 10 nm (Keff is about 2.9). The thickness of the liner layer is 2 nm (e.g., K=5.0 for metal liner). When the target pitch X is 50 nm, Keff (airgap) can be adjusted as shown in FIG. 10 by adjusting the thickness of the airgap (airgap spacing). By selecting the airgap spacing from about 1.0 nm to about 8 nm, Keff (airgap) can proportionally be adjusted from about 3.0 to about 2.2. In the above, a K value of dense CDO may vary in a range of 2.65-2.75, and a K value of SiCN diffusion barrier may vary in a range of 5.0-5.5. In the above, preferably, not only the spacer 102, but also the spacer 99 and the line layer 103 are deposited by PEALD.

Figure 11A:
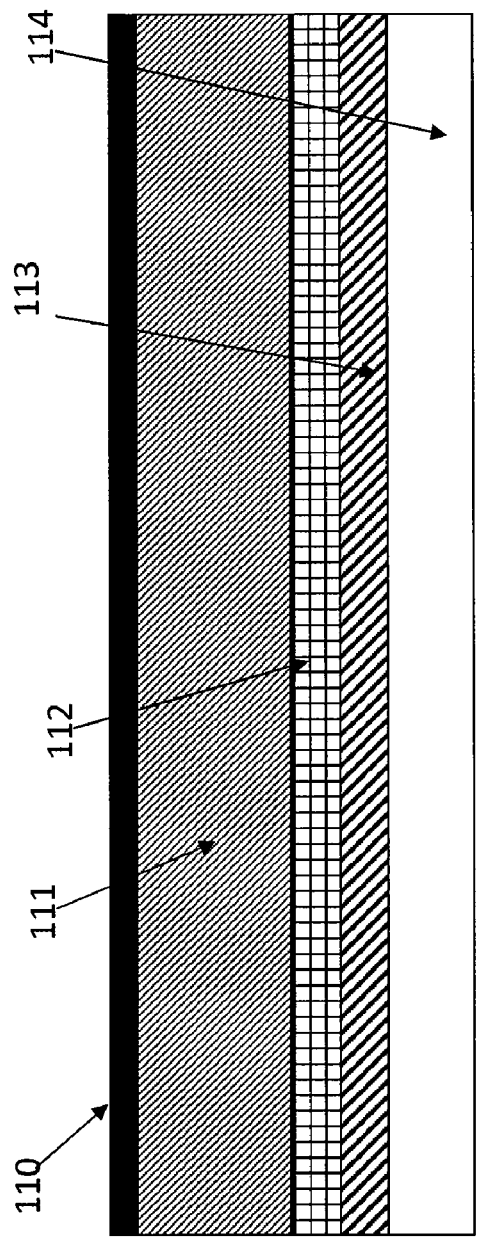
FIGS. 11A to 11Q are schematic cross sections of a partially fabricated integrated circuit, showing a dual damascene process scheme according to an embodiment of the present invention.
Figure 11B:
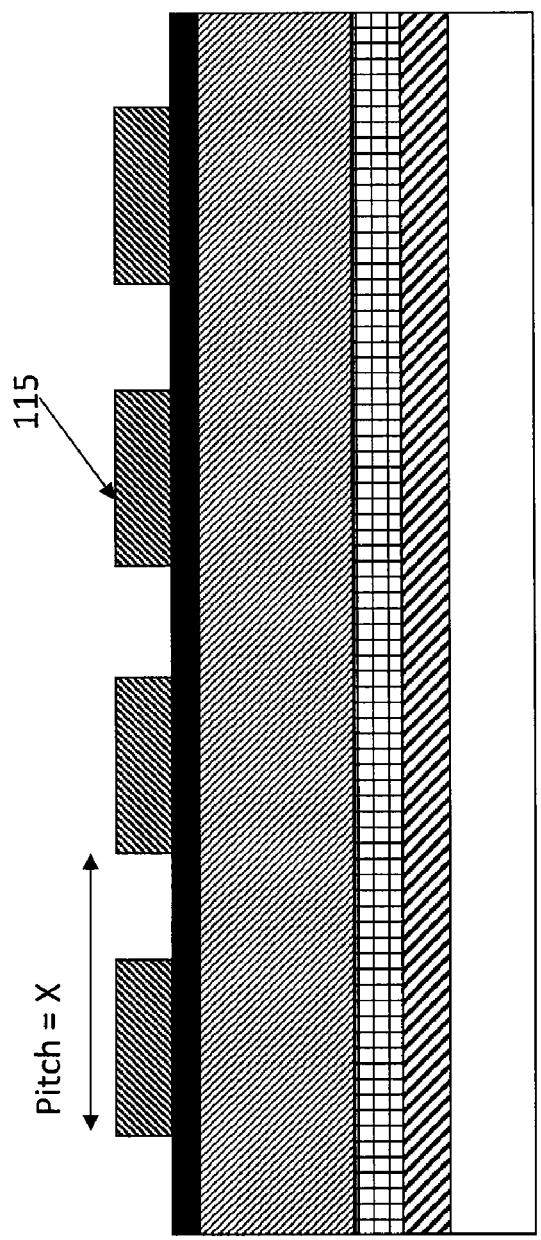
Figure 11C:
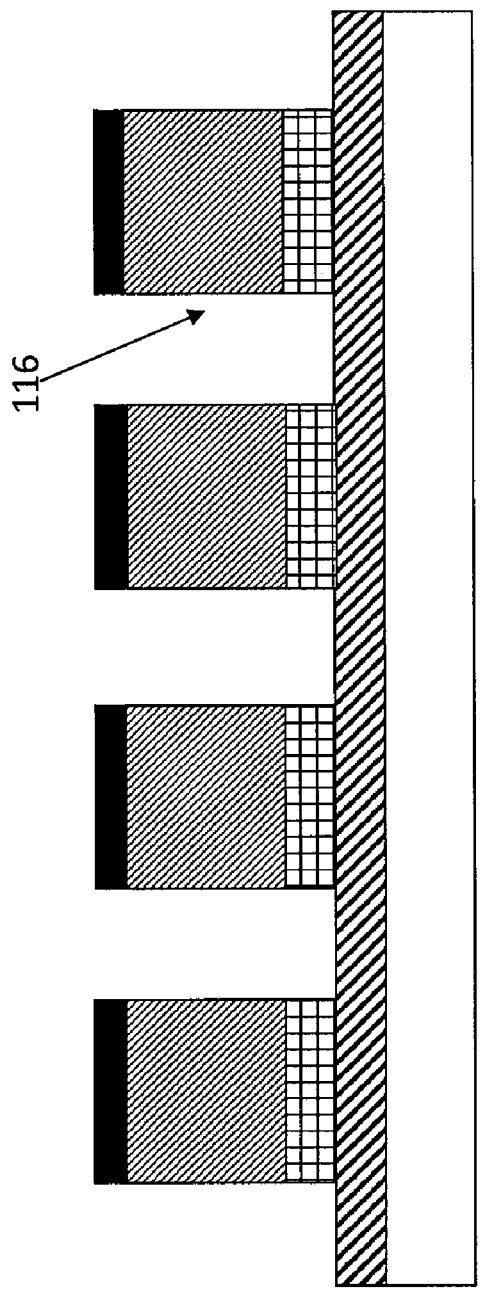
Figure 11D:
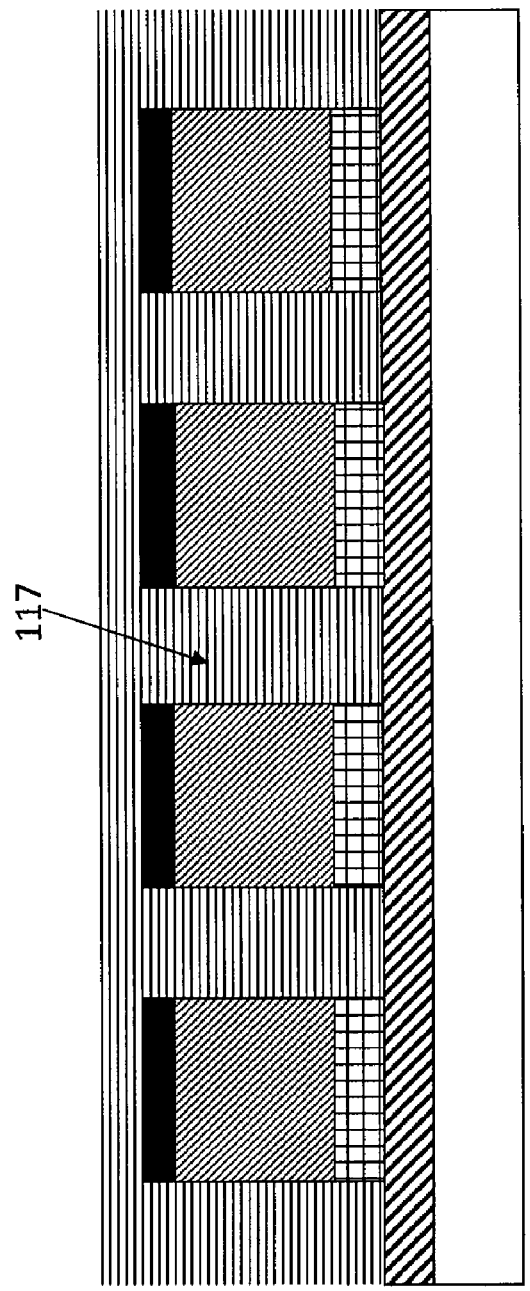
Figure 11G:
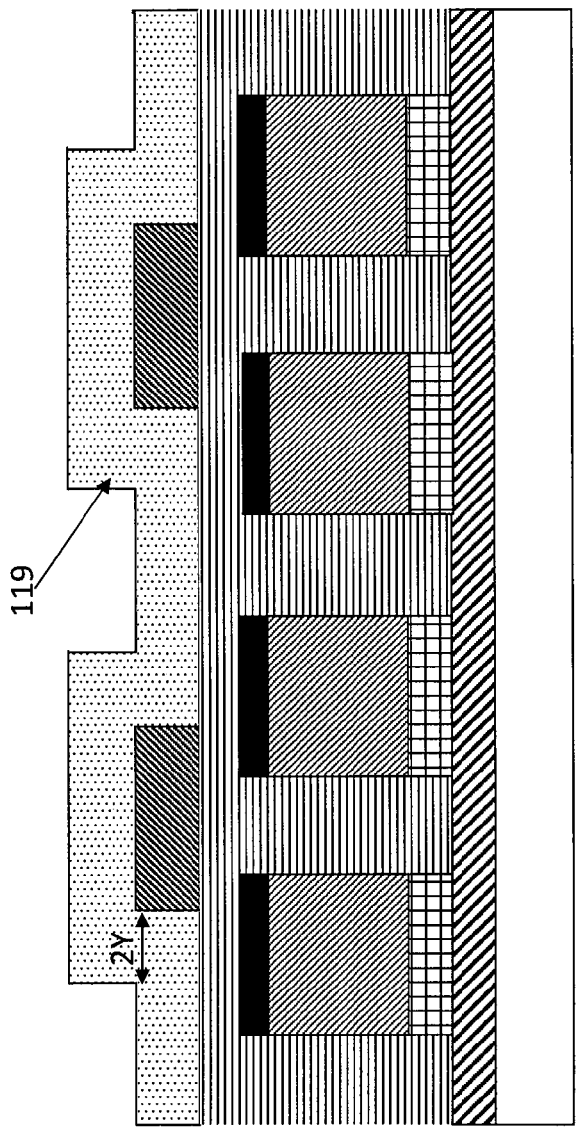
Figure 11H:
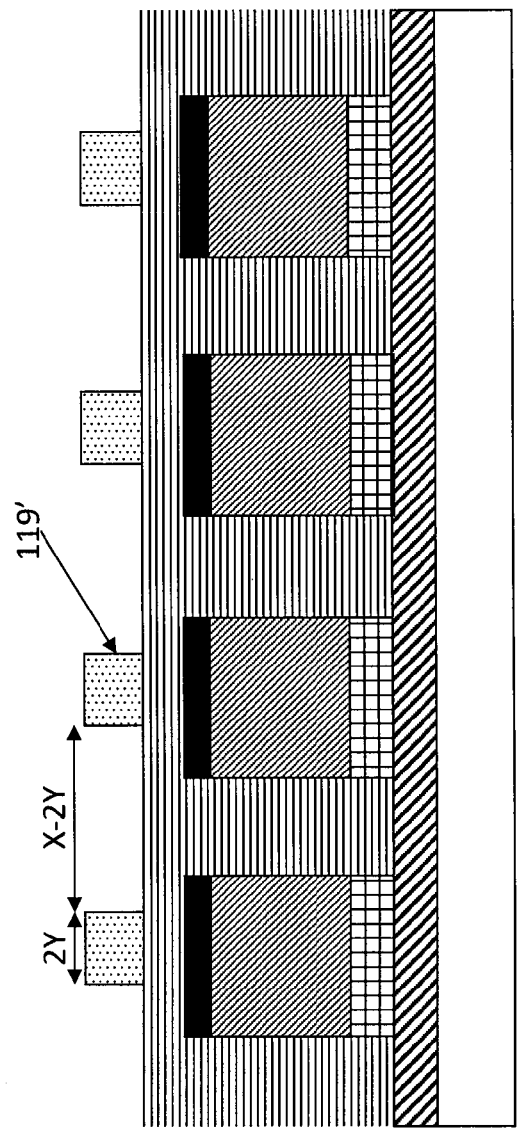
Figures 11K, 11L:
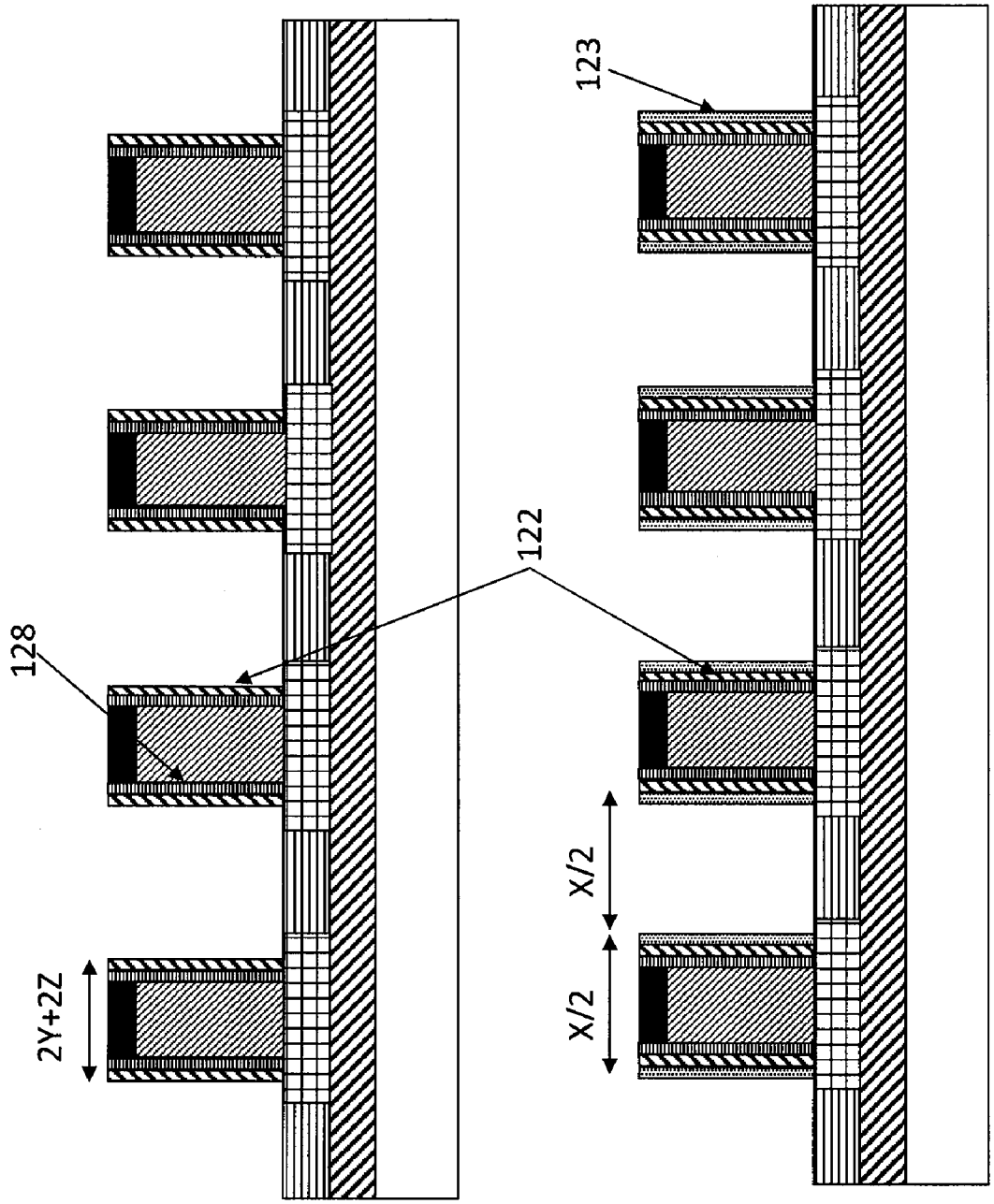
Figure 11M:
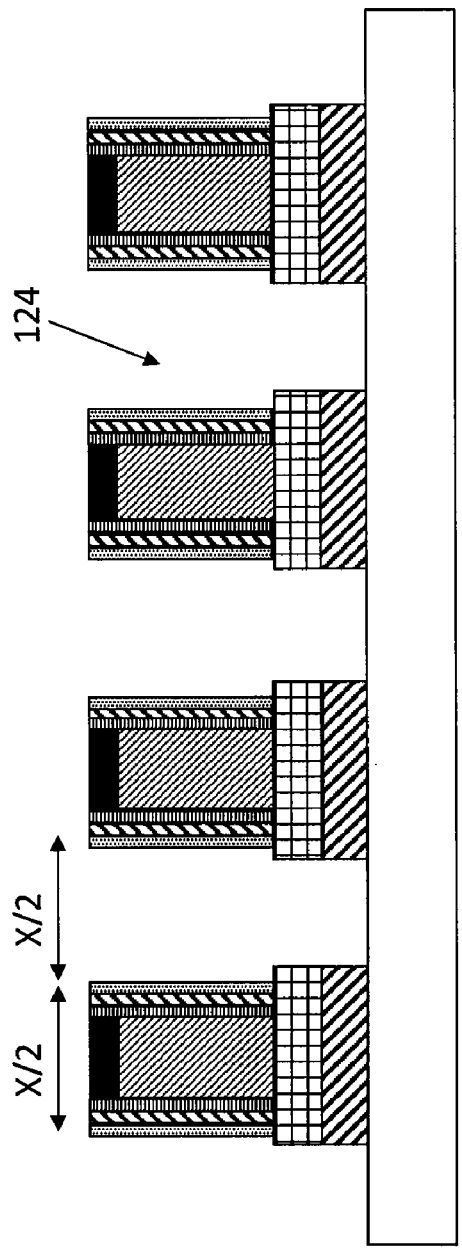
Figure 11N:
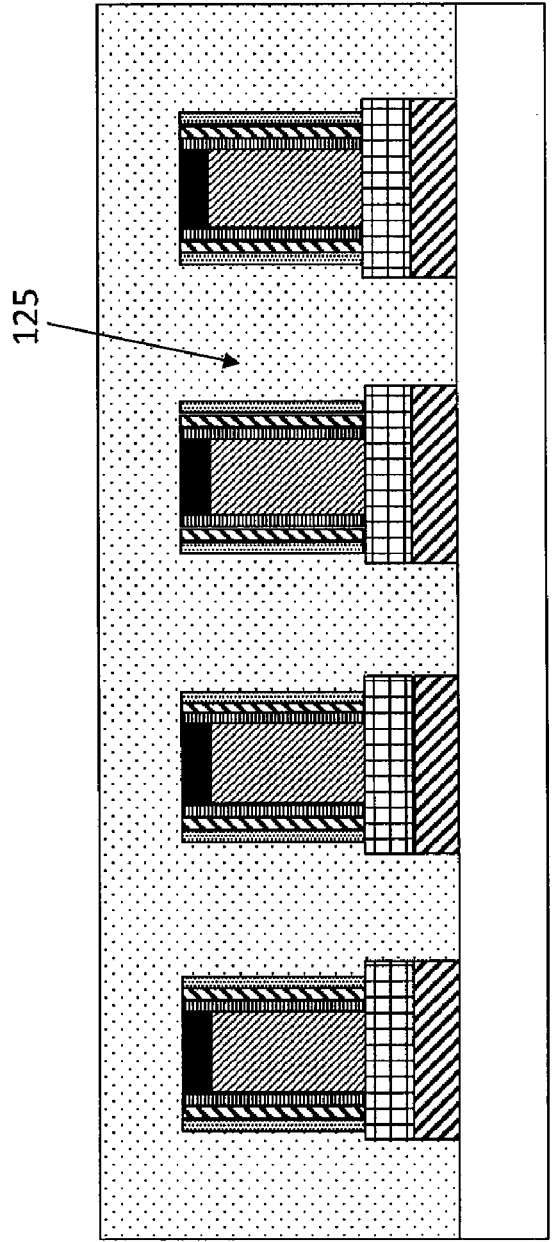
Figure 11Q:
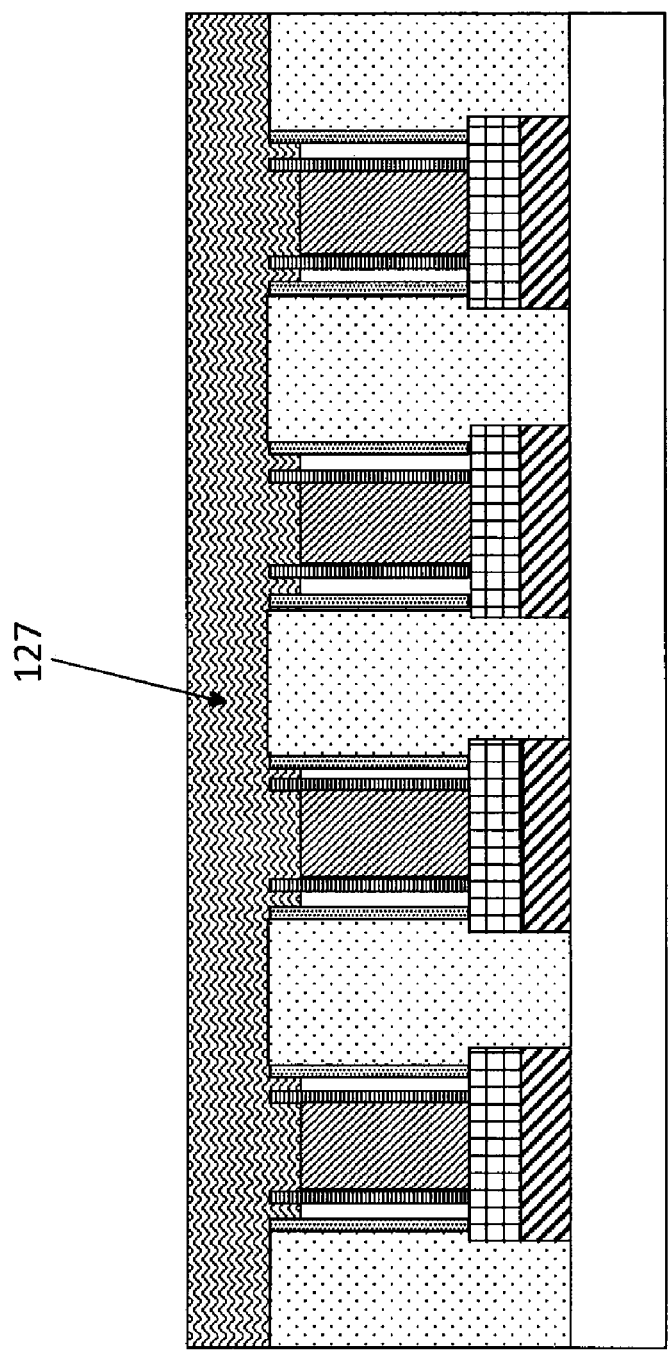

The third process flow is shown in FIGS. 11A to 11Q and uses four ALD layers to achieve pitch halving, pore sealing, and air gap. One of the four ALD layers is a protective liner for barrier metal deposition, and another of the four ALD layers is a pore-sealing layer for low-k layers.

As shown in FIG. 11A, as a bulk dielectric, a diffusion barrier layer 113 (e.g., SiCN), a dense low-k layer 112 (e.g., dense CDO), a porous low-k layer 111 (e.g., porous CDO), and a hard mask 110 (e.g., TiN) are formed on a substrate 114 (e.g., silicon). On top of the hard mask, a photoresist 115 is formed and subjected to patterning at a pitch of X (e.g., X=10 nm to 1000 nm, in some embodiments X=30 nm to 100 nm) as shown in FIG. 11B. Using the photoresist, the hard mask, the dense low-k layer, and the porous low-k layer are etched in a vertical direction, and the photoresist is stripped, followed by cleaning of surfaces, thereby forming a via 116 as shown in FIG. 11C. Next, SLAM processing is performed to fill the via 116 with a SLAM material 117 as shown in FIG. 11D. A photoresist 118 is formed and subjected to patterning wherein a pitch is set at 2X as shown in FIG. 11E. The photoresist 118 is trimmed by Y (e.g., Y=1 nm to 100 nm, in some embodiments Y=3 nm to 20 nm) from both sides so as to form a trimmed patterned photoresist 118' as shown in FIG. 11F. A spacer oxide layer 119 is then deposited at a thickness of, e.g., 2Y on the trimmed photoresist 118' as shown in FIG. 11G. The spacer oxide layer 119 is etched in a vertical direction by a thickness of 2Y so as to leave only a portion of the spacer oxide layer on sidewalls of the trimmed photoresist 118', and the trimmed photoresist is stripped, followed by cleaning of surfaces. As a result, an opening having a size of X−2Y and an etched spacer 119' having a width of 2Y are formed as shown in FIG. 11H. Next, the SLAM material and the hard mask are etched in a vertical direction using the etched spacer 119', leaving a pattern 120 as shown in FIG. 11I. The width of the pattern 120 is 2Y, and the distance between immediately adjacent patterns 120 is X−2Y. Using the pattern 120, the SLAM material and the porous low-k layer are etched in a vertical direction to form a trench 121 having an opening of X−2Y with a separation wall having a width of 2Y as shown in FIG. 11J.

Next, a pore-sealing layer 128 is deposited at a thickness of W (e.g., W=1 nm to 10 nm) to seal pores of sidewalls of the porous low-k layer. The pore-sealing layer 128 is then etched in a vertical direction, and a spacer oxide layer 122 is deposited as a sidewall spacer at a thickness of Z (e.g., 1 nm to 100 nm), followed by etching the same in a vertical direction as shown in FIG. 11K. In this embodiment, after the spacer oxide layer 122 is deposited, the width of the separation wall is 2Y+2Z. The spacer oxide layer is deposited preferably by PEALD substantially in the same manner as the spacer oxide layer 20 in FIG. 1K.

Next, as a protective layer, a liner layer (e.g., SiCN) 123 is deposited at a thickness of, e.g., X/4−Y−W−Z (e.g., 1 nm to 100 nm). The liner 123 is then etched in a vertical direction so as to form a sidewall liner layer 103 as shown in FIG. 11L. In this embodiment, after the liner layer 123 is deposited, the width of the separation wall is X/2, and the distance between immediately adjacent separation walls is also X/2. The SLAM material and the diffusion barrier layer are then etched to form a via 124 as shown in FIG. 11M. Next, copper barrier/seed deposition is conducted (not shown), and then the via and the trench are filled with copper 125 by, e.g., electroplating as shown in FIG. 11N. The copper layer 125 is subjected to chemical physical polishing (CMP) which is stopped on the hard mask as shown in FIG. 11O. The hard mask and the sidewall spacer 122 are then selectively removed (leaving the sidewall liner layer and the pore-sealing layer), thereby forming airgaps 126 as shown in FIG. 11P. The airgap structure is then encapsulated by deposition of, e.g., SiCN layer 127 as shown in FIG. 11Q. In this embodiment, Keff (airgap) can be calculated in a manner similar to those described earlier.

Figure 12:
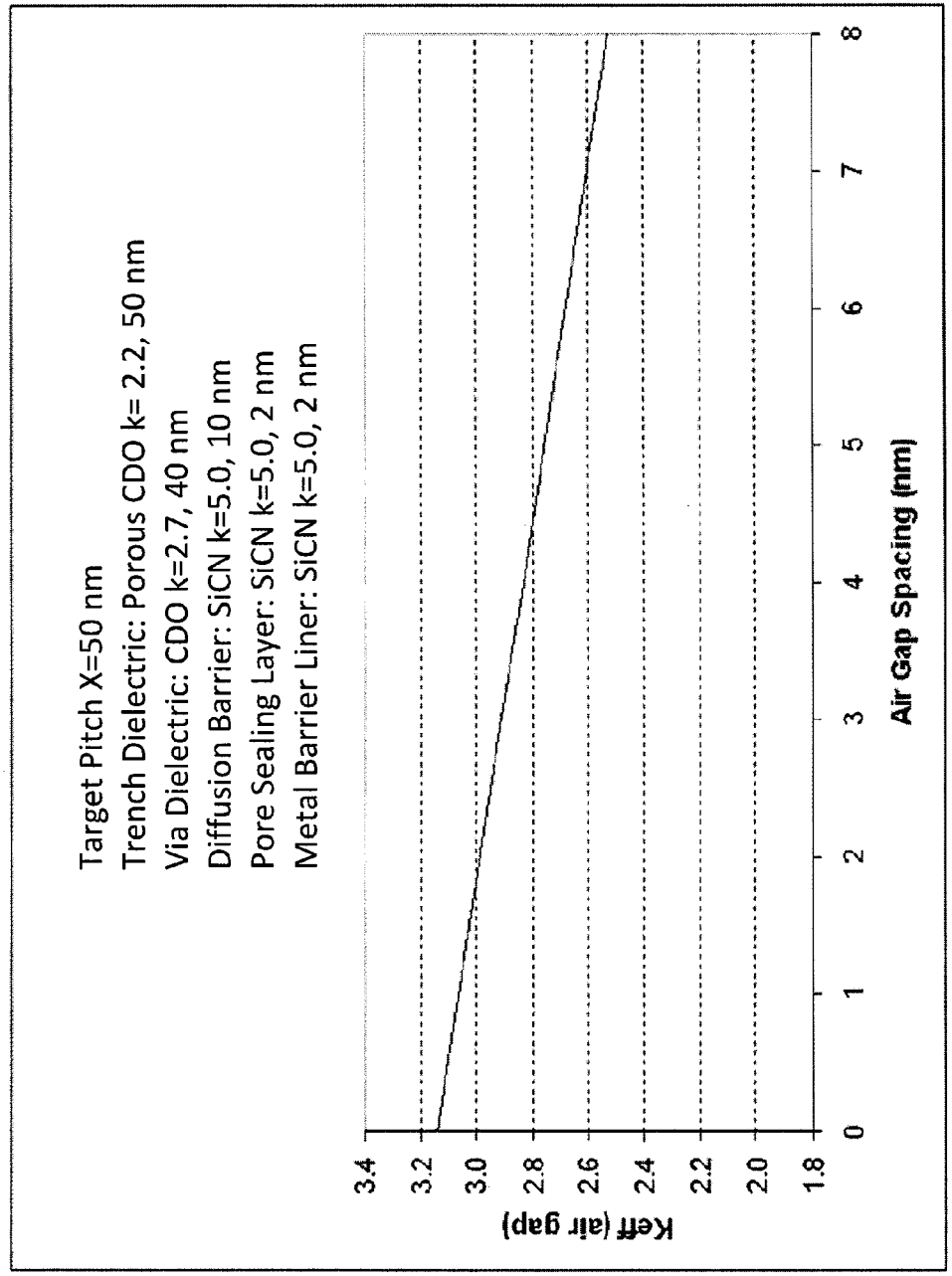
FIG. 12 is a graph showing the relationship between Keff and airgap spacing for the interconnect structures shown in FIGS. 11A to 11Q according to an embodiment of the present invention.

When the thickness of the porous ultra low-k layer (trench dielectric, e.g., K=2.2 for porous CDO) is 50 nm, the dense low-k layer (via dielectric, e.g., K=2.9 for dense CDO) is 40 nm, and the thickness of the diffusion barrier layer (e.g., K=5.0 for SiCN) is 10 nm (Keff is about 2.76). The thickness of the liner layer is 2 nm (e.g., K=5.0 for metal liner). The thickness of the pore-sealing layer is 2 nm (e.g., K=5.0). When the target pitch X is 50 nm, Keff (airgap) can be adjusted as shown in FIG. 12 by adjusting the thickness of the airgap (airgap spacing). By selecting the airgap spacing from about 1 nm to about 8 nm, Keff (airgap) can proportionally be adjusted from about 3.1 to about 2.5. In the above, preferably, not only the spacer 122, but also the spacer 119 and the line layer 123 are deposited by PEALD. The pore-sealing layer 128 can be deposited by PEALD, but can be deposited also by UV polymerization such as those disclosed in U.S. Provisional Application No. 61/290,631, which is owned by the same assignee as in the present application and the disclosure of which is herein incorporated by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming an interconnect structure with airgaps, comprising:

forming photoresist patterns at a pitch of 2X on a hard mask, each photoresist pattern having a width of X;

etching the hard mask between adjacent photoresist patterns, each etched portion having a width of (X−2Y);

etching the hard mask underneath each photoresist pattern, each etched portion having a width of (X−2Y), thereby forming hard mask patterns at a pitch of X, each hard mask pattern having a width of 2Y;

etching a layer underneath the hard mask patterns, thereby providing a structure having trenches formed on a substrate;

depositing a spacer oxide layer on sidewalls of each trench as sidewall spacers so that the sidewall spacers-provided trenches each have a width of X/2 and are distanced at an interval of X/2;

filling the trenches having the sidewall spacers with copper, thereby forming copper patterns at a pitch of X;

removing the sidewall spacers to form an airgap structure; and encapsulating the airgap structure, wherein airgaps are formed between the copper patterns, where the copper patterns each have a width of X/2 and are distanced at an interval of X/2, and the airgaps each have a width of (X/2−2Y)/2 or less, wherein X and Y are selected to achieve a targeted dielectric constant of the encapsulated airgap structure between the copper patterns.

2. The method according to claim 1, wherein the spacer oxide layer is deposited by plasma enhanced atomic layer deposition (PEALD).

3. The method according to claim 1, further comprising depositing a $SiC_xN_y$-based spacer layer, wherein x and y are independently 0 or 1, on the sidewall spacers by atomic layer deposition before filling the trench, wherein airgaps are formed between the $SiC_xN_y$-based spacer layer and the sidewalls of the trench.

4. The method according to claim 3, further comprising depositing a pore-sealing layer on the sidewalls before depositing the spacer oxide layer, wherein airgaps are formed between the pore-sealing layer and the $SiC_xN_y$-based spacer layer.

5. The method according to claim 3, wherein the $SiC_xN_y$-based spacer layer on the sidewall spacers is constituted by SiCN.

6. The method according to claim 4, wherein the structure having the trench on the substrate is a layered structure comprising a diffusion barrier layer, a low-k layer, and a hard mask formed in this layering order on the substrate, wherein the trench penetrates the hard mask and the low-k layer, but does not penetrate the diffusion barrier layer, whereby the pore-sealing layer is disposed on the sidewalls of the hard mask and the low-k layer, followed by extending the trench downward to penetrate the diffusion barrier layer before depositing the spacer oxide layer.

7. The method according to claim 1, wherein the spacer oxide layer is a silicon oxide layer.

8. The method according to claim 1, wherein the structure having the trench on the substrate is a layered structure comprising a diffusion barrier layer, a low-k layer, and the hard mask formed in this layering order on the substrate, wherein the trench penetrates the hard mask, the low-k layer, and the diffusion barrier layer.

9. The method according to claim 8, wherein the step of providing the structure comprises:

forming a photoresist pattern on the hard mask;

trimming the photoresist to reduce the dimensions;

depositing an oxide spacer on the trimmed photoresist and an area of the hard mask uncovered by the trimmed photoresist, by PEALD at a temperature of 400° C. or lower;

etching the oxide spacer by a thickness of the oxide spacer in a thickness direction, thereby leaving a sidewall portion of the oxide spacer deposited on sidewalls of the trimmed photoresist, followed by removing the trimmed photoresist;

etching an area of the hard mask exposed after the etching of the oxide spacer and the removal of the trimmed photoresist, followed by etching the sidewall portion of the oxide spacer to obtain a patterned hard mask and an exposed portion of the low-k layer; and etching the low-k layer and the diffusion barrier layer using the patterned hard mask.

10. The method according to claim 1, further comprising selecting a thickness of the spacer oxide layer to achieve a targeted dielectric constant of the encapsulated airgap structure between the copper filled in the trench and copper filled in an immediately adjacent trench, and the step of depositing the spacer oxide layer is controlled to obtain the spacer oxide layer at the selected thickness.

11. The method according to claim 10, wherein the thickness of the spacer oxide layer is controlled at 0.4 nm to 10 nm.

12. The method according to claim 10, wherein the targeted dielectric constant of the encapsulated airgap structure is less than 2.5.

13. A method for forming an interconnect structure with airgaps, comprising providing a structure having a trench formed on a substrate;

depositing a spacer oxide layer on sidewalls of the trench as sidewall spacers;

filling the trench having the sidewall spacers with copper;

removing the sidewall spacers to form an airgap structure; and encapsulating the airgap structure, wherein airgaps are formed between the filled copper and the sidewalls of the trench, wherein the structure having the trench on the substrate: is a layered structure comprising a diffusion barrier layer, a low-k layer, and the hard mask formed in this layering order on the substrate, wherein the trench penetrates the hard mask, the low-k layer, and the diffusion barrier layer, wherein the step of providing the structure comprises:

forming a photoresist pattern on the hard mask;

depositing an oxide spacer on the photoresist and an area of the hard mask uncovered by the photoresist, by PEALD at a temperature of 400° C. or lower;

etching the oxide spacer by a thickness of the oxide spacer in a thickness direction, thereby leaving a sidewall portion of the oxide spacer deposited on sidewalls of the photoresist;

etching an area of the hard mask exposed after the etching of the oxide spacer, followed by removing the sidewall portion of the oxide spacer and the photoresist to obtain a patterned hard mask and an exposed portion of the low-k layer;

forming a second photoresist pattern on the exposed portion of the low-k layer and a part of the patterned hard mask;

depositing a second oxide spacer on the second photoresist and an area of the patterned hard mask uncovered by the second photoresist, by PEALD at a temperature of 400° C. or lower;

etching the second oxide spacer by a thickness of the second spacer in a thickness direction, thereby leaving a sidewall portion of the second oxide spacer deposited on sidewalls of the second photoresist;

etching an area of the patterned hard mask exposed after the etching of the second oxide spacer, followed by removing the sidewall portion of the second oxide spacer and the second photoresist to obtain a second patterned hard mask and an exposed portion of the low-k layer; and etching the low-k layer and the diffusion barrier layer using the second patterned hard mask.

* * * * *